United States Patent
Liu et al.

(10) Patent No.: US 8,624,222 B2
(45) Date of Patent: Jan. 7, 2014

(54) HOMOGENEOUS MULTIPLE BAND GAP DEVICES

(71) Applicant: University of Utah Research Foundation, Salt Lake City, UT (US)

(72) Inventors: Feng Liu, Salt Lake City, UT (US); Ye Zhang, Salt Lake City, UT (US); Rujie Sun, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 13/656,565

(22) Filed: Oct. 19, 2012

(65) Prior Publication Data

US 2013/0099205 A1 Apr. 25, 2013

Related U.S. Application Data

(60) Provisional application No. 61/549,814, filed on Oct. 21, 2011, provisional application No. 61/615,130, filed on Mar. 23, 2012, provisional application No. 61/615,137, filed on Mar. 23, 2012.

(51) Int. Cl.
H01L 27/142 (2006.01)

(52) U.S. Cl.
USPC ............. 257/21; 257/E31.003; 257/E51.038; 136/249; 977/794; 977/954

(58) Field of Classification Search
USPC .......................................................... 257/21
See application file for complete search history.

(56) References Cited

U.S. PATENT DOCUMENTS

| 6,316,715 | B1 | 11/2001 | King et al. |
| 6,660,928 | B1 | 12/2003 | Patton et al. |

(Continued)

FOREIGN PATENT DOCUMENTS

| EP | 1 429 378 B1 | 2/2012 |
| WO | WO 2009/148679 A2 | 12/2009 |

(Continued)

OTHER PUBLICATIONS

Liang et al, "Formation of . . . Graphene Nanomeshes . . . Lithography" DOI: 10.1021/nl100750v | Nano Lett. 2010, 10, 2454-2460.*

(Continued)

*Primary Examiner* — Jerome Jackson, Jr.
(74) *Attorney, Agent, or Firm* — Morgan, Lewis & Bockius LLP

(57) ABSTRACT

An electrical device comprising (A) a substrate having a surface and (B) a nanohole superlattice superimposed on a portion of the surface is provided. The nanohole superlattice comprises a plurality of sheets having an array of holes defined therein. The array of holes is characterized by a band gap or band gap range. The plurality of sheets forms a first edge and a second edge. A first lead comprising a first electrically conductive material forms a first junction with the first edge. A second lead comprising a second electrically conductive material forms a second junction with the second edge. The first junction is a Schottky barrier with respect to a carrier. In some instances a metal protective coating covers all or a portion of a surface of the first lead. In some instances, the first lead comprises titanium, the second lead comprises palladium, and the metal protective coating comprises gold.

52 Claims, 18 Drawing Sheets

(56) References Cited

U.S. PATENT DOCUMENTS

| | | |
|---|---|---|
| 8,268,180 B2 | 9/2012 | Arnold et al. |
| 2010/0132771 A1* | 6/2010 | Lu .................................. 136/252 |
| 2012/0003438 A1 | 1/2012 | Appleton et al. |
| 2012/0068152 A1 | 3/2012 | Hwang et al. |
| 2012/0085991 A1 | 4/2012 | Cohen et al. |
| 2012/0141799 A1 | 6/2012 | Kub et al. |
| 2012/0181507 A1 | 7/2012 | Dimitrakopoulos et al. |
| 2012/0205518 A1 | 8/2012 | Voutilainen et al. |
| 2012/0228157 A1 | 9/2012 | Li et al. |

FOREIGN PATENT DOCUMENTS

| | | |
|---|---|---|
| WO | WO 2010/147860 A1 | 12/2010 |
| WO | WO 2012/035551 A1 | 3/2012 |
| WO | WO 2012/120264 A1 | 9/2012 |
| WO | WO 2012/125898 A1 | 9/2012 |

OTHER PUBLICATIONS

Avouris et al., "Carbon-based electronics," *nature nanotechnology*, vol. 2, Oct. 2007, pp. 605-615.

Bae et al., "Roll-to-roll production of 30-inch graphene films for transparent electrodes," *Nature Nanotechnology*, vol. 5, Aug. 2010, pp. 574-578.

Barone et al., (2006) "Electronic Structure and Stability of Semiconducting Graphene Nanoribbons" Nano Letters vol. 6, No. 12, pp. 2748-2754.

Behnam, et al., (2011) "Electronic Transport in Graphitic Nanoribbon Films," ACSNANO.org, vol. 5, No. 3 1617-1622.

Berger et al., "Electronic Confinement and Coherence in Patterned Epitaxial Graphene," *Science*, vol. 312, May 26, 2006, pp. 1191-1196.

Blankenburg et al., "Intraribbon Heterojunction Formation in Ultranarrow Graphene Nanoribbons," ACSNANO.org, vol. 6, No. 3, (2012) pp. 2020-2025.

Cai et al., "Atomically precise bottom-up fabrication of graphene nanoribbons," *Nature*, vol. 466, Jul. 22, 2010, pp. 470-473.

Chang et al., "Multilayered graphene efficiently formed by mechanical exfoliation for nonlinear saturable absorbers in fiber mode-locked lasers," *Applied Physics Letters*, 97, 211102 (2010) pp. 211102-1-211102-3.

Ci et al., "Controlled Nanocutting of Graphene," *Nano Res* (2008), 1: 116-122.

Coletti, et al., (2010) "Charge neutrality and band-gap tuning of epitaxial graphene on SiC by molecular doping" *Physical Review B* 81, 235401, 235401-1-235401-8.

Cotal, et al., (2009) "III-V multijunction solar cells for concentrating photovoltaics," *Energy Environ. Sci.*, 2, 174-192.

Datta et al., "Crystallographic Etching of Few-Layer Graphene," *Nano Letters*, 2008, vol. 8, No. 7, pp. 1912-1915.

Elias, et al., (2010) "Longitudinal Cutting of Pure and Doped Carbon Nanotubes to Form Graphitic Nanoribbons Using Metal Clusters as Nanoscalpels," *Nano Letters* 10, 366-372.

Ezawa, Motohiko, (2007) "Peculiar Band Gap Structure of Graphene Nanoribbons," *Physica Status Solidi* (c) 4, No. 2, 489, (8 pages).

Finkenstadt, et al., (2007) "From graphene to graphite: A general tight-binding approach for nanoribbon carrier transport," *Physical Review B* 76, 121405(R), 121405-1-121405-4.

Fonash, Stephen J., "Schottky-Barrier-Type Optoelectronic Structures," *Metal-Semiconductor Schottky Barrier Junctions and Their Applications*, Ed. by B.L. Sharma, Plenum Press, 1984, pp. 161-189.

Fujii et al., "Cutting of Oxidized Graphene into Nanosized Pieces," *J. Am Chem. Soc.* 2010, 132, pp. 10034-10041.

Gao et al., "Oxidation Unzipping of Stable Nanographenes into Joint Spin-Rich Fragments," *J. Am. Chem. Soc.* (2009), 131, 9663-9669.

Giovannetti, et al., (2008) "Doping Graphene with Metal Contacts," *PRL* 101, 026803-1-026803-4.

Guo, et al., (2011) "Graphene Doping: A Review," *Insciences J.*, 80-89; doi: 10.5640/insc.010280.

Guo, et al., (2011), "Graphene Based Materials: Enhancing Solar Energy Harvesting," *Adv. Energy Mater.* 1, 448-452.

Gupta et al., "Schottky Barrier Photodiodes," *Metal-Semiconductor Schottky Barrier Junctions and Their Applications*, Ed. by B.L. Sharma, Plenum Press, 1984, pp. 191-218.

Hakala, et al., (2008) "First-principles study of adsorption, diffusion, and charge stability of metal adatoms on alkali halide surfaces" *Physical Review B* 78, 045418-1-045418-8.

Han et al., "Energy Band-Gap Engineering of Graphene Nanoribbons," *Physical Review Letters (PRL)* 98, 206805 (2007) pp. 206805-1-206805-4.

Henry, C.H., (1980) "Limiting efficiencies of ideal single and multiple energy gap terrestrial solar cells," *J. Appl. Phys.* 51, pp. 4494-4500; doi: 10.1063/1.328272.

Jayasena et al., "A novel mechanical cleavage method for synthesizing few-layer graphenes," *Nanoscale Research Letters*, 2011, 6:95, pp. 1-7.

Jia, et al., (2009) "Controlled Formation of Sharp Zigzag and Armchair Edges in Graphitic Nanoribbons" *Science* 323, 1701-1705.

Jiao et al., "Narrow graphene nanoribbons from carbon nanotubes," *Nature*, vol. 458, Apr. 16, 2009, pp. 877-880.

Kato et al., "Site- and alignment-controlled growth of graphene nanoribbons from nickel nanobars," *Nature Nanotechnology*, vol. 7, Oct. 2012, pp. 651-656.

Kim et al., "Large-scale pattern growth of graphene films for stretchable transparent electrodes," *Nature*, vol. 457, Feb. 5, 2009, pp. 706-710.

King, et al., (2000), "Next-Generation, High-Efficiency III-V Multijunction Solar Cells," *28th IEEE Photovoltaic Specialists Conference*, Anchorage, Alaska, Sep. 15-22, 2000 (4 pages).

Kosynkin et al., "Longitudinal unzipping of carbon nanotubes to form graphene nanoribbons," *Nature*, vol. 458, Apr. 16, 2009, (7 pages).

Li, et al., "Chemically Derived, Ultrasmooth Graphene Nanoribbon Semiconductors," *Science*, 319, 1229 (2008), pp. 1229-1232.

Li, et al., (2010) "Graphene-On-Silicon Schottky Junction Solar Cells" *Adv. Mater.* 22, 2743-2748.

Li, et al., "Large-Area Synthesis of High-Quality and Uniform Graphene Films on Copper Foils," *Science*, vol. 324, Jun. 5, 2009, pp. 1312-1314.

Lin, et al., (2008) "Electrical observation of subband formation in graphene nanoribbons," *Physical Review B* 78, 161409(R), 161409-1-161409-4.

Liu et al., "Band-gap scaling of graphene nanohole superlattices," *Physical Review B* 80, 233405 (2009), pp. 233405-1-233405-4.

Liu et al., "Stripe-kink microstructures formed in mechanical peeling of highly orientated pyrolytic graphite," *Applied Physics Letters*, 96, 201909 (2010), pp. 201909-1-201909-3.

Ma, et al., "Strain-Induced Orientation-Selective Cutting of Graphene into Graphene Nanoribbons on Oxidation," *Angew. Chem. Int. Ed.* 51, pp. 1161-1164 (2012).

McAllister et al., "Single Sheet Functionalized Graphene by Oxidation and Thermal Expansion of Graphite," *Chem. Mater*, 2007, 19, 4396-4404.

Patent Informatics Team, "An Analysis of Worldwide Patent Filings Relating to Graphene," Intellectual Property Office, Concept House, Cardiff Rd, Newport, South Wales, NP10 8QQ, UK, (2011), pp. 2-11.

Reina et al., "Large Area, Few-Layer Graphene Films on Arbitrary Substrates by Chemical Vapor Deposition," *Nano Letters*, 2009, vol. 9, No. 1, pp. 30-35.

Sinitskii et al., "Patterning graphene nanoribbons using copper oxide nanowires," *Applied Physics Letters*, 100, 103106 (2012), pp. 103106-1-103106-3.

Stauber, et al., (2008), "Optical conductivity of graphene in the visible region of the spectrum," *Physical Review B* 78, 085432, 085432-1-085432-8.

Sutter et al., "Epitaxial graphene on ruthenium," *Nature Materials*, vol. 7, May 2008, pp. 406-411.

Tapasztó et al., "Tailoring the atomic structure of graphene nanoribbons by scanning tunnelling microscope lithography," *Nature nanotechnology*, vol. 3, Jul. 2008, pp. 397-401.

(56) References Cited

OTHER PUBLICATIONS

Terrones, et al., (2010) "Graphene and graphite nanoribbons: Morphology, properties, synthesis, defects and applications," *Nano Today* 5, 351-372.

Tyagi, M.S., "Physics of Schottky Barrier Junctions," *Metal-Semiconductor Schottky Barrier Junctions and Their Applications*, Ed. by B.L. Sharma, Plenum Press, 1984, 1-60.

Wan, et al., (2011) "Graphene—A Promising Material for Organic Photovoltaic Cells," *Adv. Mater.* 23, 5342-5358.

Wu et al., "Efficient Synthesis of Graphene Nanoribbons Sonochemically Cut from Graphene Sheets," *Nano Res* (2010) 3: 16-22.

Xie et al., "Graphene Nanoribbons from Unzipped Carbon Nanotubes: Atomic Structures, Raman Spectroscopy, and Electrical Properties," *J. Am. Chem. Soc.* 2011, 133, pp. 10394-10397.

Yang et al., "Two-Dimensional Graphene Nanoribbons," *J. Am Chem. Soc.*, 2008, 130, 4216-4217.

Yastrebova, N., (Apr. 2007) "High-efficiency multi-junction solar cells: Current status and future potential" *Centre for Research in Photonics*, University of Ottawa (22 pages).

Zhang et al., "Fabrication and electric-field-dependent transport measurements of mesoscopic graphite devices," *Appl.Phys. Ltrs*, 86, 073104 (2005), 073104-1-073104-3.

\* cited by examiner

| | | |
|---|---|---|
| | n++ | InGaAs |
| Third cell | n+ | AlInP |
| | n | AlGaInP |
| | p | AlGaInP |
| | p | AlGaAs |
| Second tunnel junction | p++ | AlGaAs |
| | n++ | InGaP |
| Second cell | n+ | AlGaAs |
| | n | InGaAsP |
| | p | InGaAsP |
| | p | InGaP |
| First tunnel junction | p++ | AlGaAs |
| | n++ | InGaAs |
| First cell | n+ | InGaP |
| | n | InGaAs |
| | p | InGaAs |
| | p | InGaP |
| Substrate | p+ | InGaAs |
| | p+ | GaAs |
| | p | GaAs |

FIG. 1

(Prior Art)

(a)

(b)

HOMOGENEOUS MULTIPLE BAND GAP DEVICES

1. CROSS REFERENCE TO RELATED APPLICATIONS

This application claims priority to U.S. patent application No. 61/615,130 entitled "Homogeneous Band Gap Devices Having A Lead With a Metal Protective Coating," filed Mar. 23, 2012, which is hereby incorporated herein by reference. This application also claims priority to U.S. patent application No. 61/615,137 entitled "Homogeneous Multiple Band Gap Devices," filed Mar. 23, 2012, which is hereby incorporated herein by reference. This application also claims priority to U.S. patent application No. 61/549,814 entitled "Graphene Nanohole Superlattice-based Photovoltaic Cells," filed Oct. 21, 2011, which is hereby incorporated herein by reference.

2. FIELD OF THE INVENTION

This invention relates to band gap devices for converting photon energy into a voltage or current, or for converting a current into photon energy, over a broad wavelength spectrum, and more particularly to multiple band gap devices comprising nanohole superlattices.

3. BACKGROUND OF THE INVENTION

Photoelectric device efficiency depends on many factors, both extrinsic and intrinsic. Of the two classes, intrinsic factors set a limit on the maximum efficiency that a photoelectric device can achieve. Dominant intrinsic factors include losses due to (i) lack of absorption of photons, (ii) exciton relaxation and (iii) radiative recombination. The first loss results from the failure of a semiconductor to absorb photons with energy less than the energy band gap of the semiconductor. The second loss takes place when photons with energy greater than the energy band gap of the semiconductor generates electrons and holes which immediately lose to heat almost all energy in excess of the energy band gap of the semiconductor. And the third loss is due to the recombination of electron-hole pairs generating light.

Reducing these intrinsic losses is a goal in photoelectric device development, particularly for devices used over a broad spectrum of wavelengths. For instance, solar radiation ranges from 100 nm to 14 μm, with the visible light ranging from 400 nm to 700 nm. Assuming all extrinsic losses are eliminated, the maximum efficiency is about 31 percent for an ideal solar cell made from a single semiconducting material with an optimal band gap of about 1.35 eV (See, Journal of Applied Physics 51, 4494 (1980)). That is, 69 percent of solar energy is not cultivated due to the intrinsic losses.

One strategy for improving device efficiency is to use multijunction photoelectric devices having materials with multiple band gaps. Some existing multijunction photovoltaic devices are built from group III-V semiconductors (See, Energy and Environmental Science, 2, 174-192 (2009)). A typical structure of a multijunction photovoltaic device comprises a number of n-p (or p-n) junctions made from different semiconducting materials stacked on top of each other. Each junction has an energy band gap higher than the junction below it; and an interface is disposed in between the stacked junctions. FIG. 1 shows a generalized three junction structure of a series-connected, monolithically-grown, GaInP/GaInAs/Ge stack (See, U.S. Pat. No. 6,660,928 to M. O. Patton).

Several issues need to be addressed in order to fabricate a multiple band gap device, such as a three junction photovoltaic device depicted in FIG. 1. First, semiconducting materials for different layers typically need to have a matched lattice constant in order to epitaxially grow on a substrate and to form p-n or n-p junctions. Second, to facilitate improved efficiency, the interfaces between two n-p (or p-n) junction layers typically need to have a low resistance to enable the generated current to flow from one junction to the next. Accordingly, in a monolithic structure, low resistive tunnel junctions have been used to minimize the blockage of current flow. Third, current density generated in each layer typically needs to be roughly the same so that the lowest photogenerated current density does not limit the current flowing through the multijunction device.

Such requirements impose technical challenges in the fabrication of semiconducting materials and multijunction devices. It is difficult to construct three different semiconducting materials having desired band gaps, and at the same time, meeting other design goals such as a matched lattice constant. For example, the three junctions in the GaInP/GaAs/Ge system are limited to the respective band gaps of 1.8, 1.4, and 0.67 eV, respectively (See, Energy and Environmental Science 2, 174-192 (2009)). This leads to a non-ideal combination of band gaps, and consequently lower device efficiency.

Efforts have been directed to modifying the composition of semiconducting materials by adjusting band gaps and balancing the current. Examples can be found in U.S. Pat. No. 6,340,788 to R. R. King et al., which discloses several three junction cells including (i) $Ga_{0.52}In_{0.48}$ P, GaAs, and $Si_{0.17}Ge_{0.83}$ devices with respective band gaps of 1.89, 1.42, and 0.92 eV, (ii) $Ga_{0.55}In_{0.45}P$, $GaP_{0.07}As_{0.93}$ and Si devices with respective band gaps of 1.94, 1.51, and 1.12 eV, (iii) $Ga_{0.52}In_{0.48}P$, GaAs and Si devices with respective band gaps of 1.89, 1.42, and 1.12 eV, and (iv) $Ga_{0.52}In_{0.48}P$, $Ga_xIn_{1-x}P_yAs_{1-y}$, and Si devices with respective band gaps of 1.89, 1.50 and 1.12 eV.

Meanwhile, efforts have been directed to employing more p-n (or n-p) layers to improve the efficiency. For example, U.S. Pat. No. 6,340,788 to et al., discloses a number of four-junction solar cells while U.S. Pat. No. 6,316,715 to King et al. discloses solar cells having three, four or five-junctions.

Although modification of the composition of semiconducting materials may improve device efficiency, maximum efficiencies have not yet been achieved to date because of practical obstacles in building such devices. Such obstacles include facilitating epitaxial growth of desired compositions due to miscibility gap of multiple layers on top of each other while satisfying interlayer lattice matching constraints and the need to balance the amount of current generated in each junction in the multijunction stack. That is, composition tuning, lattice constant matching, and current balancing complicate the multijunction fabrication process and increase the cost of production of such devices.

Given the above background, there is a need in the art for improved devices that are easier to fabricate and/or have improved efficiency or other improved characteristics.

4. SUMMARY OF THE INVENTION

The present disclosure provides improved devices that are easier to fabricate and/or have improved efficiency or other improved characteristics.

Devices arrayed on a substrate. In one aspect of the instant disclosure provides an electrical device comprising a substrate having a surface. A first nanohole superlattice is superimposed on a first portion of the surface. The first nanohole superlattice comprises a first plurality of sheets having a first array of holes defined therein. The first array of holes is characterized by a first band gap or a first band gap range. The first plurality of sheets forms a first edge and a second edge. A first lead comprising a first electrically conductive material forms a first junction with the first edge. A second lead comprising a second electrically conductive material forms a second junction with the second edge. Optionally, the electrical device further comprises a first metal protective coating covering all or a portion of a surface of the first lead. The first junction is a first Schottky barrier with respect to a carrier.

In some embodiments, the electrical device further comprises a second nanohole superlattice superimposed on a second portion of the surface. The second nanohole superlattice comprises a second plurality of sheets having a second array of holes defined therein. The second array of holes in the second plurality of sheets is characterized by a second band gap or a second band gap range. The second plurality of sheets forms a third edge and a fourth edge. A third lead comprising a third electrically conductive material forms a third junction with the third edge. A fourth lead comprising a fourth electrically conductive material forms a fourth junction with the fourth edge. The third junction is a second Schottky barrier with respect to the carrier.

In some embodiments, the electrical device further comprises a third nanohole superlattice superimposed on a third portion of the surface. The third nanohole superlattice comprises a third plurality of sheets having a third array of holes defined therein. The third array of holes in the third plurality of sheets is characterized by a third band gap or a third band gap range. The third plurality of sheets forms a fifth edge and a sixth edge. A fifth lead comprising a fifth electrically conductive material forms a fifth junction with the third edge. A sixth lead comprising a sixth electrically conductive material forms a sixth junction with the sixth edge. The fifth junction is a third Schottky barrier with respect to the carrier.

In some embodiments the device further comprises a first optically transparent insulator overlaying the first nanohole superlattice and a second nanohole superlattice superimposed on the first optically transparent insulator. The second nanohole superlattice comprises a second plurality of sheets having a second array of holes defined therein. The second array of holes produce a second band gap or a second band gap range in the second plurality of sheets and the second plurality of sheets forms a third edge and a fourth edge. In such embodiments the first lead forms a third junction with the third edge, the second lead forms a fourth junction with the fourth edge, and the third junction is a second Schottky barrier with respect to the carrier. In some embodiments, the electrical device further comprises a second optically transparent insulator overlaying the second nanohole superlattice and a third nanohole superlattice.

In some embodiments, the electrical device further comprises an optical splitter in optical communication with the first nanohole superlattice and the second nanohole superlattice. The optical splitter splits an incident light into a first wavelength band and a second wavelength band. The first wavelength band is characterized by at least one wavelength that is in the first wavelength band but not in the second wavelength band. The optical splitter directs the first light wavelength band to the first nanohole superlattice and the second wavelength band to the second nanohole superlattice.

In some embodiments the electrical device further comprises an optical splitter in optical communication with the first nanohole superlattice and the second nanohole superlattice. The optical splitter splits an incident light into a first wavelength band, a second wavelength band, and a third wavelength band. The first wavelength band is characterized by at least one wavelength that is in the first wavelength band but not in the second wavelength band or the third wavelength band. The second wavelength band is characterized by at least one wavelength that is in the second wavelength band but not in the first wavelength band or the third wavelength band. The third wavelength band is characterized by at least one wavelength that is in the third wavelength band but not in the first wavelength band or the second wavelength band. The optical splitter directs the first light wavelength band to the first nanohole superlattice, the second wavelength band to the second nanohole superlattice, and the third wavelength band to the third nanohole superlattice.

Stacked devices. In one aspect, the instant disclosure provides an electrical device comprising a substrate having a surface. A first nanohole superlattice is superimposed on a first portion of the surface. The first nanohole superlattice comprises a first plurality of sheets having a first array of holes defined therein. The first array of holes produces a first band gap or a first band gap range in the first plurality of sheets. The first plurality of sheets forms a first edge and a second edge. A first lead comprising a first electrically conductive material forms a first junction with the first edge. A second lead comprising a second electrically conductive material forms a second junction with the second edge. The first junction is a first Schottky barrier with respect to a carrier.

In some embodiments the device further comprises a first optically transparent insulator overlaying the first nanohole superlattice. In such embodiments, a second nanohole superlattice is superimposed on the first optically transparent insulator. The second nanohole superlattice comprises a second plurality of sheets having a second array of holes defined therein. The second array of holes produces a second band gap or a second band gap range in the second plurality of sheets. The second plurality of sheets forms a third edge and a fourth edge. The first lead forms a third junction with the third edge. The second lead forms a fourth junction with the fourth edge. The third junction is a second Schottky barrier with respect to the carrier.

In some embodiments, a second optically transparent insulator overlays the second nanohole superlattice. In such embodiments, a third nanohole superlattice is superimposed on the second optically transparent insulator. The third nanohole superlattice comprises a third plurality of sheets having a third array of holes defined therein. The third array of holes produces a third band gap or a third band gap range in the third plurality of sheets. The third plurality of sheets forms a fifth edge and a sixth edge. The first lead forms a fifth junction with the third edge. The second lead forms a sixth junction with the fourth edge. The third junction is a third Schottky barrier with respect to the carrier.

Additional embodiments. In some embodiments, the first array of holes produce a first band gap range in the first plurality of sheets and the second array of holes produce a second band gap range in the second plurality of sheets. The first band gap range is characterized by at least one band gap sub-range that is within the first band gap range but not the second band gap range. In some embodiments, the first array of holes produces a first band gap range in the first plurality of sheets. The second array of holes produces a second band gap range in the second plurality of sheets. The third array of holes produces a third band gap range in the third plurality of sheets. The first band gap range is characterized by at least one band gap sub-range that is within the first band gap range but not the second band gap range or the third band gap range. The second band gap range is characterized by at least one band gap sub-range that is within the second band gap range but not the first band gap range or the third band gap range. The third band gap range is characterized by at least one band gap sub-range that is within the third band gap range but not the first band gap range or the second band gap range.

In some embodiments, a first hole in the first array of holes is characterized by a characteristic length that is different than a characteristic length of a second hole in the second array of holes. In some embodiments, a first hole in the first array of holes is characterized by a characteristic length that is the same as a characteristic length of a second hole in the second array of holes. In some embodiments, the first array of holes produce a first band gap range in the first plurality of sheets, the second array of holes produce a second band gap range in the second plurality of sheets, and the first band gap range is the same as the second band gap range. In some embodiments, the first array of holes produce a first band gap range in the first plurality of sheets, the second array of holes produce a second band gap range in the second plurality of sheets, the third array of holes produce a third band gap range in the third plurality of sheets, and the first band gap range is the same as the second band gap range and the third band gap range.

In some embodiments, a first sheet in the first plurality of sheets is characterized by a first dopant and a second sheet in the second plurality of sheets is characterized by a second dopant. In some embodiments, a first sheet in the first plurality of sheets is characterized by a first dopant, a second sheet in the second plurality of sheets is characterized by a second dopant, and a third sheet in the third plurality of sheets is characterized by a third dopant. In some embodiments the first dopant and the second dopant are the same. In some embodiments, the first dopant and the second dopant are different. In some embodiments, the first dopant, the second dopant and the third dopant are the same. In some embodiments, the first dopant, the second dopant, and the third dopant are each different.

In some embodiments, the second junction is a third Schottky barrier with respect to the carrier and the third Schottky barrier is less than the first Schottky barrier. In some embodiments the second junction is ohmic with respect to the carrier.

In some embodiments, the electrical device further comprises an antireflection layer overlaying all or a portion of the second nanohole superlattice.

In some embodiments, the first array of holes produce the first band gap range in the first plurality of sheets and wherein the first band gap range is between 0.1 eV and 2.2 eV, between 0.1 eV and 0.8 eV, between 0.5 eV and 2.2 eV or between 0.6 eV and 1.1 eV.

In some embodiments, a hole in the first array of holes has a characteristic dimension that is in between 1 µm and 10 mm, between 50 µm and 500 µm or between 100 µm and 300 µm. In some embodiments, a hole in the first array of holes has a characteristic dimension that is less than 5000 nm, less than 1000 nm, less than 500 nm, less than 100 nm, or less than 50 nm. In some embodiments, the characteristic dimension is a characteristic length of the hole, a radius of the hole, a diameter of the hole, or a width of the hole. In some embodiments, the hole is characterized by a cross-section that is circular, ovoid, triangular, rectangular, pentangular, or hexagonal. In some embodiments, the hole is characterized by a cross-section that is circular, ovoid, triangular, rectangular, pentangular, or hexagonal. In some embodiments, the hole is characterized by a cross-section that includes any combination of linear portions, arcuate portions, or curved portions.

In some embodiments, the first array of holes has a nanohole density that is between 1 nanohole/$\mu m^2$ and $10^6$ nanoholes/$\mu m^2$ in the first plurality of sheets, that is between 100 nanohole/$\mu m^2$ and $10^5$ nanoholes/$\mu m^2$ in the first plurality of sheets, that is between 500 nanohole/$\mu m^2$ and $10^5$ nanoholes/$\mu m^2$ in the first plurality of sheets, that is between 10 nanoholes/$\mu m^2$ and $10^5$ nanoholes/$\mu m^2$ in the first plurality of sheets, or that is between 100 nanoholes/$\mu m^2$ and $10^4$ nanoholes/$\mu m^2$ in the first plurality of sheets.

In some embodiments, a distance between the first junction and the second junction is between 1 µm and 100 µm. In some embodiments, the first nanohole superlattice is characterized by a uniform thickness that is different than a uniform thickness of the second nanohole superlattice. In some embodiments, the first nanohole superlattice is characterized by a uniform thickness that is different than a uniform thickness of the second nanohole superlattice and a uniform thickness of the third nanohole superlattice, the second nanohole superlattice is characterized by a uniform thickness that is different than a thickness of the first nanohole superlattice and a thickness of the third nanohole superlattice, and the third nanohole superlattice is characterized by a uniform thickness that is different than a thickness of the first nanohole superlattice and a thickness of the second nanohole superlattice.

In some embodiments, the first nanohole superlattice is characterized by a uniform thickness that exceeds a uniform thickness of the second nanohole superlattice by more than ten percent of the uniform thickness of the first nanohole superlattice. In some embodiments, the first nanohole superlattice is characterized by a uniform thickness that exceeds a uniform thickness of the second nanohole superlattice by more than twenty percent of the uniform thickness of the first nanohole superlattice. In some embodiments, the first nanohole superlattice is characterized by a uniform thickness that exceeds a uniform thickness of the second nanohole superlattice by more than forth percent of the uniform thickness of the first nanohole superlattice.

In some embodiments, the first nanohole superlattice is characterized by a first uniform thickness, the second nanohole superlattice is characterized by a second uniform thickness, and the first uniform thickness is the same as the second uniform thickness.

In some embodiments, a thickness of the first nanohole superlattice is different than a thickness of the second nanohole superlattice and a thickness of the third nanohole superlattice, a thickness of the second nanohole superlattice is different than a thickness of the first nanohole superlattice and a thickness of the third nanohole superlattice, and a thickness of the third nanohole superlattice is different than a thickness of the first nanohole superlattice and a thickness of the second nanohole superlattice.

In some embodiments, a first sheet in the first nanohole superlattice comprises a first semiconducting material, a second sheet in the second nanohole superlattice comprises a second semiconducting material, and the first semiconducting material is the same as the second semiconducting material.

In some embodiments, a first sheet in the first nanohole superlattice comprises a first semiconducting material, a second sheet in the second nanohole superlattice comprises a second semiconducting material, and the first semiconducting material is different than the second semiconducting material.

In some embodiments, a first sheet in the first nanohole superlattice is p doped. In some embodiments, a first sheet in the first nanohole superlattice is n doped. In some embodiments, a first sheet in the first plurality of sheets is a graphene nanohole superlattice sheet. In some embodiments, each sheet in the first plurality of sheets is a graphene nanohole superlattice sheet. In some embodiments, each sheet in the first plurality of sheets and each sheet in the second plurality of sheets is a graphene nanohole superlattice sheet.

In some embodiments, each sheet in the first plurality of sheets, each sheet in the second plurality of sheets, and each sheet in the third plurality of sheets is a graphene nanohole superlattice sheet.

In some embodiments, the first plurality of sheets consists of between 1 and 300 semiconducting graphene nanohole superlattice sheets. In some embodiments, the first plurality of sheets consists of between 100 and 300 semiconducting graphene nanohole superlattice sheets. In some embodiments, the first plurality of sheets and the second plurality of sheets have the same number of sheets. In some embodiments, the first plurality of sheets and the second plurality of sheets have a different number of sheets. In some embodiments, the first optically transparent insulator is made of a glass, and has an electrical resistance between $10^{10}$ and $10^{14}$ $\Omega$m. In some embodiments, the substrate comprises Si, SiC, $SiO_2$ or SiC/Si. In some embodiments, the first lead comprises titanium, niobium, zinc, chromium, silver or aluminum, and the second lead comprises gold, cobalt, palladium, copper or platinum.

In some embodiments, neither the first lead nor the second lead is coated with a protection layer. In some embodiments, at least one of the first lead and the second lead is covered with a coating. In some embodiments, the coating comprises an electrically conducting material. In some embodiments where both leads are coated, the coating on the first lead is the same as the coating on the second lead with respect to the applied materials or thicknesses in some embodiments, whereas the coating on the first lead is different than the coating on the second lead in other embodiments.

In some embodiments, the first lead comprises titanium, niobium, zinc, chromium, silver or aluminum, and the second lead comprises gold, cobalt, palladium, copper or platinum. In some embodiments, the first lead and the second lead are in electrical communication with an external load, and the electrical device is a photovoltaic device that generates electricity in response to an incident light. In some embodiments, the incident light is solar radiation. In some embodiments, the photovoltaic device produces a power density of at least 50 $W/m^2$ in response to the incident light.

In some embodiments, the first lead and the second lead are in electrical communication with an external circuit, and the electrical device is a photodetector that generates a current or a voltage in response to an incident light. In some embodiments, the incident light is solar radiation. In some embodiments, the incident light comprises a wavelength between 10 nm to 100 μm.

In some embodiments, the first lead and the second lead are in electrical communication with an external current, and the electrical device is a light emitting diode that emits a light in response to the external current. In some embodiments, the light is white light. In some embodiments, disclosed herein, the carrier is electrons.

In some embodiments, the first lead comprises titanium, the second lead comprises palladium, and the first metal protective coating comprises gold. In some embodiments, the electrical device further comprises a second metal protective coating covering all or a portion of an exposed surface of the second lead.

Second aspect. A second aspect of the present disclosure provides a multiple band gap device comprising a substrate having a surface and a plurality of stacks. Each respective stack in the plurality of stacks is defined by a first end, a second end, and a length. The plurality of stacks is lengthwise arranged on the substrate with each stack in the plurality of stacks occupying a different portion of the substrate. Each respective stack in the plurality of stacks comprises a corresponding plurality of nanoribbons. A first nanoribbon in the corresponding plurality of nanoribbons is characterized by a first band gap or a first band gap range, the first nanoribbon overlaying on the substrate. A first optically transparent insulator overlays the first nanoribbon. A second nanoribbon in the respective plurality of nanoribbons is characterized by a second band gap. The second nanoribbon overlays the first insulator. The first band gap is smaller than the second band gap. A first lead electrically contacts the first end of each stack in the plurality of stacks. A second lead electrically contacts the second end of each stack in the plurality of stacks. Optionally, a first metal protective coating covers all or a portion of a surface of the first lead. The multiple band gap device is operated by electrical control of the first and second leads.

In some embodiments, the first band gap of a first nanoribbon of a first stack in the plurality of stacks has a different band gap than a first nanoribbon of a second stack in the plurality of stacks. In some embodiments, the first band gap of a first nanoribbon of a first stack in the plurality of stacks has the same band gap as a first nanoribbon of a second stack in the plurality of stacks. In some embodiments, the first band gap of the first nanoribbon in the plurality of stacks is defined by a first width, a first thickness, a first edge state, a first doping or the combination thereof, and the second band gap of the second nanoribbon in the plurality of nanoribbons in the plurality of stacks is defined by a second width, a second thickness, a second edge state, a second doping or the combination thereof. In some embodiments, the first width of the first nanoribbon of a stack in the plurality of stacks is larger than the second width of the second nanoribbon of the stack in the plurality of stacks. In some embodiments, the first width of a first nanoribbon of a first stack in the plurality of stacks has a different width than a first nanoribbon of a second stack in the plurality of stacks. In some embodiments, the first width of a first nanoribbon of a first stack in the plurality of stacks has the same width as a first nanoribbon of a second stack in the plurality of stacks. In some embodiments, the first thickness of a first nanoribbon of a first stack in the plurality of stacks has a different thickness than a first nanoribbon of a second stack in the plurality of stacks. In some embodiments, the first thickness of a first nanoribbon of a first stack in the plurality of stacks has the same thickness as a first nanoribbon of a second stack in the plurality of stacks.

In some embodiments, the first edge state of a first nanoribbon of a first stack in the plurality of stacks has a different edge state than a first nanoribbon of a second stack in the plurality of stacks. In some embodiments, the first edge state of a first nanoribbon of a first stack in the plurality of stacks has the same edge state as a first nanoribbon of a second stack in the plurality of stacks. In some embodiments, the first doping of a first nanoribbon of a first stack in the plurality of stacks has a different dopant, a different dopant concentration or a different dopant distribution than a first nanoribbon of a second stack in the plurality of stacks. In some embodiments, the first doping of a first nanoribbon of a first stack in the plurality of stacks has the same dopant, the same dopant concentration or the same dopant distribution as a first nanoribbon of a second stack in the plurality of stacks. In some embodiments, a number of nanoribbons in the plurality of nanoribbons in a first stack in the plurality of stacks is different than a number of nanoribbons in the plurality of nanoribbons in a second stack in the plurality of stacks. In some embodiments, a number of nanoribbons in the plurality of nanoribbons in a first stack in the plurality of stacks is the same as a number of nanoribbons in the plurality of nanoribbons in a second stack in the plurality of stacks. In some embodiments, a length of a first stack in the plurality of stacks is different than a length of a second stack in the plurality of stacks. In some embodiments, a length of a first stack in the plurality of stacks is the same as a length of a second stack in the plurality of stacks. In some embodiments, a length of a stack in the plurality of stacks is between 1 µm and 100 m. In some embodiments, a nanoribbon of a stack in the plurality of stacks has a band gap that is between 0.1 eV and 2.2 eV. In some embodiments, the first nanoribbon of a stack in the plurality of stacks has a band gap that is between 0.1 eV and 1.2 eV and the second nanoribbon of the stack has a band gap that is between 0.8 eV and 1.9 eV. In some embodiments, the first nanoribbon of a stack in the plurality of stacks has a band gap that is between 0.5 eV and 1.5 eV, and the second nanoribbon of the stack has a band gap that is between 1.2 eV and 2.2 eV. In some embodiments, the first nanoribbon of a stack in the plurality of stacks has a band gap that is between 0.8 eV and 1.8 eV, and the second nanoribbon of the stack has a band gap that is between 1.5 eV and 2.2 eV. In some embodiments, a nanoribbon of a stack in the plurality of stacks has a width that is between 1 nm and 60 nm.

In some embodiments, the first nanoribbon of a stack in the plurality of stacks has a width that is between 20 nm and 50 nm, and the second nanoribbon of the stack has a width that is between 1 nm to 30 nm. In some embodiments, the first nanoribbon of a stack in the plurality of stacks has a width that is between 30 nm and 40 nm, and the second nanoribbon of the stack has a width that is between 10 nm to 20 nm. In some embodiments, the first nanoribbon of a stack in the plurality of stacks has a width that is between 5 nm and 20 nm, and the second nanoribbon of the stack has a width that is between 1 nm to 10 nm.

In some embodiments, the plurality of stacks are arranged parallel lengthwise. In some embodiments, a first stack in the plurality of stacks is not parallel to a second stack in the plurality of stacks. In some embodiments, the first nanoribbon of a stack in the plurality of stacks has a thickness different from the second nanoribbon of the stack in the plurality of stacks. In some embodiments, the first nanoribbon of a stack in the plurality of stacks has the same thickness as the second nanoribbon of the stack in the plurality of stacks. In some embodiments, the first nanoribbon of a stack in the plurality of stacks is made of a first semiconducting material and the second nanoribbon of the stack in the plurality of stacks is made of a second semiconducting material, wherein the first semiconducting material is different from the second semiconducting material.

In some embodiments, the first nanoribbon of a stack in the plurality of stacks is made of a first semiconducting material and the second nanoribbon of the stack in the plurality of stacks is made of a second semiconducting material, wherein the first semiconducting material is different from the second semiconducting material. In some embodiments, the plurality of nanoribbons in the plurality of stacks is doped with N-, P-, F- or Bi-atoms or molecules.

In some embodiments, the first nanoribbon of a stack in the plurality of stacks is doped with a first dopant and the second nanoribbon of the stack in the plurality of stacks is doped with a second dopant, wherein the first dopant is different from the second dopant. In some embodiments, the first nanoribbon of a stack in the plurality of stacks is doped with a first dopant and the second nanoribbon of the stack in the plurality of stacks is doped with a second dopant, wherein the first dopant is the same as the second dopant. In some embodiments, the first nanoribbon of a stack in the plurality of stacks is characterized by a first dopant concentration or a first dopant gradient and the second nanoribbon of the stack in the plurality of stacks is characterized by a second dopant concentration or a second dopant gradient, wherein the first dopant concentration is different from the second dopant concentration or the first dopant gradient is different from the second dopant gradient.

In some embodiments, the first nanoribbon of a stack in the plurality of stacks is characterized by a first dopant concentration or a first dopant gradient and the second nanoribbon of the stack in the plurality of stacks is characterized by a second dopant concentration or a second dopant gradient, wherein the first dopant concentration is the same as the second dopant concentration or the first dopant gradient is the same as the second dopant gradient. In some embodiments, a first nanoribbon of a stack in the plurality of stacks comprises a first plurality of graphene nanoribbon sheets.

In some embodiments, the first plurality of graphene nanoribbon sheets consists of between 1 and 300 graphene nanoribbon sheets. In some embodiments, the first plurality of graphene nanoribbon sheets consists of between 100 and 300 graphene nanoribbon sheets. In some embodiments, the first nanoribbon and the second nanoribbon of a stack in the plurality of stacks each consists of the same number of graphene nanoribbon sheets. In some embodiments, the first nanoribbon of a stack in the plurality of stacks has a different number of graphene nanoribbon sheets than the second nanoribbon of the stack.

In some embodiments, a stack in the plurality of stacks further comprises: (iv) a second optically transparent insulator overlaying the second nanoribbon, and (v) a third nanoribbon characterized by a third band gap, the third nanoribbon overlaying the second insulator, wherein the third band gap is greater than the second band gap. In some embodiments, a nanoribbon of the stack has a band gap that is between 0.1 eV and 2.2 eV. In some embodiments, the first nanoribbon of the stack has a band gap that is between 0.1 eV and 1.1 eV, the second nanoribbon of the stack has a band gap that is between 0.7 eV and 1.5 eV, and the third nanoribbon of the stack has a band gap that is between 1.5 eV and 2.1 eV. In some embodiments, the first nanoribbon of the stack has a band gap that is between 0.4 eV and 1.3 eV, the second nanoribbon of the stack has a band gap that is between 0.9 eV and 1.7 eV, and the third nanoribbon of the stack has a band gap that is between 1.5 eV and 2.2 eV. In some embodiments, the first nanoribbon of the stack has a band gap that is between 0.6 eV and 1.5 eV, the second nanoribbon of the stack has a band gap that is between 1.2 eV and 2.1 eV, and the third nanoribbon of the stack has a band gap that is between 1.6 eV and 2.2 eV. In some embodiments, a nanoribbon of the stack has a width that is between 1 nm and 60 nm. In some embodiments, the first nanoribbon of the stack has a width that is between 25 nm and 50 nm, the second nanoribbon of the stack has a width that is between 15 nm to 40 nm, and the third nanoribbon of the stack has a width that is between 1 nm to 20 nm. In some embodiments, the first nanoribbon of the stack has a width that is between 35 nm and 45 nm, the second nanoribbon of the stack has a width that is between 20 nm to 30 nm, and the third nanoribbon of the stack has a width that is between 5 nm to 15 nm.

In some embodiments, the device further comprises an antireflection layer overlaying all or a portion of each stack in the plurality of stacks. In some embodiments, the antireflection layer comprises $SiO_2$ and $TiO_2$.

In some embodiments, the first optically transparent insulator has a band gap larger than the second band gap of the second nanoribbon in the plurality of nanoribbons of a stack in the plurality of stacks. In some embodiments, the first optically transparent insulator is made of a glass, and has an electrical resistance between $10^{10}$ and $10^{14}$ Ωm. In some embodiments, the substrate comprises Si, SiC, $SiO_2$, or SiC/Si. In some embodiments, a first junction between the first lead and the first end of a first stack in the plurality of stacks or a second junction between the second lead and a second end of the first stack in the plurality of stacks is a Schottky barrier. In some embodiments, the first junction comprises: a first sub junction between (i) the first lead and (ii) a first end of the first nanoribbon of the first stack, and a second sub junction between (i) the first lead and (ii) a first end of the second nanoribbon of the first stack; and the second junction comprises: a third sub junction between (i) the second lead and (ii) a second end of the first nanoribbon, and a fourth sub junction between (i) the second lead and (ii) a second end of the second nanoribbon.

In some embodiments, a first junction between the first lead and the first end of a first stack in the plurality of stacks is a Schottky barrier, and a second junction between the second lead and the second end of the first stack in the plurality of stacks does not form a Schottky barrier.

In some embodiments, each nanoribbon in the plurality of nanoribbons of a stack in the plurality of stacks comprises a plurality of graphene nanoribbon sheets, the first lead comprises titanium, niobium, zinc, chromium, silver, or aluminum, and the second lead comprises gold, cobalt, palladium, copper, and platinum. In some embodiments, the first lead and the second lead are in electrical communication with an external load, and the multiple band gap device is a photovoltaic device that generates electricity in response to an incident light. In some embodiments, the first lead and the second lead are in electrical communication with an external circuit, and the multiple band gap device is a photodetector that generates a current or a voltage in response to an incident light.

In some embodiments, the first lead and the second lead are in electrical communication with the external current, and the multiple band gap device is a multiple band gap light emitting diode that emits light in response to the external current.

In some embodiments, the plurality of nanoribbons of a first stack in the plurality of stacks are configured to collectively emit a visually white light.

In some embodiments, the carrier is holes or electrons. In some embodiments, the first lead comprises titanium; the second lead comprises palladium; and the first metal protective coating comprises gold. In some embodiments, a second metal coating covers all or a portion of a surface of the second lead.

Third aspect. A third aspect of the present disclosure provides a multiple band gap device comprising a substrate having a surface and a plurality of clusters. Each respective cluster in the plurality of clusters occupies a different portion of the substrate. A cluster in the plurality of clusters comprises a plurality of stacks, each stack defined by a first end, a second end, and a length, the plurality of stacks lengthwise arranged on the substrate with each stack in the plurality of stacks occupying a different portion of the substrate, wherein each respective stack in the plurality of stacks comprises: (a) a first nanoribbon that is overlaid on the substrate and is characterized by a first band gap, (b) a first optically transparent insulator overlaying the first nanoribbon, and (c) a second nanoribbon that is characterized by a second band gap, the second nanoribbon overlaying the first insulator, wherein the first band gap is smaller than the second band gap. A first lead electrically contacts each first end of each stack in the plurality of stacks. A second lead electrically contacts each second end of each stack in the plurality of stacks. The multiple band gap device is operated by electrical control of the first and second leads. A first metal protective coating covers all or a portion of a surface of the first lead.

In some embodiments, each cluster in the plurality of clusters has a width that is between 1 μm to 10 mm and a length that is between 1 μm to 10 mm. In some embodiments, each cluster in the plurality of clusters has a width that is between 10 μm to 1 mm and a length that is between 10 μm to 1 mm. In some embodiments, each cluster in the plurality of clusters has a width that is between 50 μm to 500 μm and a length that is between 50 μm to 500 μm. In some embodiments, a first cluster in the plurality of clusters has a different width or a different length than a second cluster in the plurality of clusters. In some embodiments, a first cluster in the plurality of clusters has the same width or the same length as a second cluster in the plurality of clusters. In some embodiments, the multiple band gap device is characterized by a stack density that is between $10^6$ to $10^{12}$ stacks/$cm^2$. In some embodiments, a first cluster in the plurality of clusters is in series electrical communication with a second cluster in the plurality of clusters. In some embodiments, a first cluster in the plurality of clusters is in parallel electrical communication with a second cluster in the plurality of clusters. In some embodiments, a first cluster in the plurality of clusters is in series electrical communication with a second cluster in the plurality of clusters and in parallel electrical communication with a third cluster in the plurality of clusters.

In some embodiments, the multiple band gap device is a photovoltaic device that generates electricity in response to an incident light. In some embodiments, the multiple band gap device is a photodetector that generates a current or a voltage in response to an incident light. In some embodiments, the multiple band gap device is a light emitting diode that emits light in response to an external current. In some embodiments, the photovoltaic device produces a power density of at least 50 W/$m^2$. In some embodiments, the photodetector responds to the incident light having a wavelength band between 10 nm to 100 μm. In some embodiments, the light emitting diode emits a white light. In some embodiments, the first lead comprises titanium, the second lead comprises palladium, and the first metal protective coating comprises gold. In some embodiments, a second metal protective coating covering all or a portion of a surface of the second lead.

Fourth aspect. A fourth aspect provides a multiple band gap device comprising a substrate having a surface and a plurality of nanoribbons, each nanoribbon defined by a first end, a second end and a length. The plurality of nanoribbons are lengthwise arranged on the substrate with each nanoribbon occupying a different portion of the substrate. The plurality of nanoribbons comprise (i) a first nanoribbon characterized by a first band gap and (ii) a second nanoribbon characterized by a second band gap. The first band gap is smaller than the second band gap. The device further comprises an optical splitter in optical communication with the plurality of nanoribbons. The optical splitter splits an incident light into a first wavelength band and a second wavelength band. The first wavelength band is characterized by at least one wavelength that is greater than the wavelengths in the second wavelength band. The optical splitter directs the first light wavelength band to the first nanoribbon and the second wavelength band to the second nanoribbon. A first lead electrically contacts the first end of each nanoribbon in the plurality of nanoribbons. A second lead electrically contacts the second end of each nanoribbon in the plurality of nanoribbons. A first metal protective coating covers all or a portion of a surface of the first lead. The multiple band gap device is operated by electrical control of the first lead and the second lead.

In some embodiments, the optical splitter is configured above the plurality of nanoribbons. In some embodiments, the optical splitter is placed away from the plurality of nanoribbons. In some embodiments, the optical splitter is a prism. In some embodiments, a nanoribbon in the plurality of nanoribbons has a band gap that is between 0.1 eV and 2.2 eV. In some embodiments, the first band gap is between 0.1 eV and 1.2 eV and the second band gap is between 0.8 eV and 1.9 eV. In some embodiments, the first band gap is between 0.5 eV and 1.5 eV and the second band gap that is between 1.2 eV and 2.2 eV. In some embodiments, the first band gap is between 0.8 eV and 1.8 eV and the second band gap that is between 1.5 eV and 2.2 eV. In some embodiments, the first nanoribbon has a width that is between 1 and 60 nm. In some embodiments, the first nanoribbon has a length that is between 1 μm and 100 μm.

In some embodiments, the first nanoribbon is characterized by a first width, a first thickness, a first edge state, a first doping or any combination thereof, and the second band gap is characterized by a second width, a second thickness, a second edge state, a second doping or any combination thereof. In some embodiments, the first width is between 20 nm and 50 nm, and the second width is between 1 nm and 30 nm. In some embodiments, the first width is between 30 nm and 40 nm and the second width is between 10 nm and 20 nm. In some embodiments, the first length is different than the second length. In some embodiments, the first length is the same as the second length.

In some embodiments, a nanoribbon in the plurality of nanoribbons comprises between 1 and 300 graphene nanoribbon sheets. In some embodiments, a nanoribbon in the plurality of nanoribbons comprises between 100 and 300 graphene nanoribbon sheets. In some embodiments, the first nanoribbon comprises the same number of graphene nanoribbon sheets as the second nanoribbon. In some embodiments, the first nanoribbon comprises a different number of graphene nanoribbon sheets as the second nanoribbon. In some embodiments, a thickness of the first nanoribbon is different than a thickness of the second nanoribbon. In some embodiments, a thickness of the first nanoribbon is the same as a thickness of the second nanoribbon. In some embodiments, the plurality of nanoribbons are arranged parallel lengthwise. In some embodiments, the first nanoribbon is not parallel to the second nanoribbon. In some embodiments, the first nanoribbon is made of a first semiconducting material and the second nanoribbon is made of a second semiconducting material, where the first semiconducting material is different than the second semiconducting material. In some embodiments, the first nanoribbon is made of a first semiconducting material and the second nanoribbon is made of a second semiconducting material, wherein the first semiconducting material is the same as the second semiconducting material. In some embodiments, the first nanoribbon is doped with a first dopant and the second nanoribbon is doped with a second dopant, wherein the first dopant is different from the second dopant. In some embodiments, the first nanoribbon is doped with a first dopant and the second nanoribbon is doped with a second dopant, wherein the first dopant is the same as the second dopant. In some embodiments, the first nanoribbon is characterized by a first dopant concentration or a first dopant gradient and the second nanoribbon is characterized by a second dopant concentration or a second dopant gradient, wherein the first dopant concentration is different from the second dopant concentration or the first dopant gradient is different from the second dopant gradient. In some embodiments, the first nanoribbon is characterized by a first dopant concentration or a first dopant gradient and the second nanoribbon is characterized by a second dopant concentration or a second dopant gradient, wherein the first dopant concentration is the same as the second dopant concentration or the first dopant gradient is the same as the second dopant gradient.

In some embodiments, the plurality of nanoribbons further comprises (iii) a third nanoribbon characterized by a third band gap, wherein the third band gap is larger than the second gap, and wherein the optical splitter splits the incident light into the first wavelength band the second wavelength band, and a third wavelength band, the third wavelength band characterized by at least one wavelength that is smaller than the wavelengths in the second wavelength band, and wherein the optical splitter directs the third wavelength band to the third nanoribbon.

In some embodiments, the first nanoribbon has a band gap that is between 0.1 eV and 1.1 eV, the second nanoribbon has a band gap that is between 0.7 eV and 1.5 eV, and the third nanoribbon has a band gap that is between 1.5 eV and 2.1 eV. In some embodiments, the first nanoribbon has a band gap that is between 0.4 eV and 1.3 eV, the second nanoribbon has a band gap that is between 0.9 eV and 1.7 eV, and the third nanoribbon has a band gap that is between 1.5 eV and 2.2 eV. In some embodiments, the first nanoribbon has a band gap that is between 0.6 eV and 1.5 eV, the second nanoribbon has a band gap that is between 1.2 eV and 2.1 eV, and the third nanoribbon has a band gap that is between 1.6 eV and 2.2 eV. In some embodiments, the first nanoribbon has a width that is between 25 nm and 50 nm, the second nanoribbon has a width that is between 15 nm to 40 nm, and the third nanoribbon has a width that is between 1 nm to 20 nm. In some embodiments, the first nanoribbon has a width that is between 30 nm and 45 nm, the second nanoribbon has a width that is between 20 nm to 30 nm, and the third nanoribbon has a width that is between 5 nm to 15 nm. In some embodiments, the device further comprises an antireflection layer overlaying all or a portion of each nanoribbon in the plurality of nanoribbons. In some embodiments, the substrate comprises Si, SiC, $SiO_2$, or SiC/Si.

In some embodiments, a junction between the first lead and the first end of each nanoribbon in the plurality of nanoribbons or a junction between the second lead and the second end of each nanoribbon in the plurality of nanoribbons is a Schottky barrier. In some embodiments, a junction between the first lead and the first end of each nanoribbon in the plurality of nanoribbons is a Schottky barrier with respect to a carrier, and a junction between the second lead and the second end of each nanoribbon in the plurality of nanoribbons does not form a Schottky barrier with respect to the carrier. In some embodiments, each nanoribbon in the plurality of nanoribbons comprises a plurality of graphene nanoribbon sheets, the first lead comprises titanium, niobium, zinc, chromium, silver, or aluminum, and the second lead comprises gold, cobalt, palladium, copper, and platinum. In some embodiments, the first lead and the second lead are in electrical communication with an external load, and the multiple band gap device is a photovoltaic device that generates electricity in response to an incident light. In some embodiments, the first lead and the second lead are in electrical communication with an external circuit, and the multiple band gap device is a photodetector that generates a current or a voltage in response to an incident light. In some embodiments, the first lead comprises titanium, the second lead comprises palladium, and the first metal protective coating comprises gold. In some embodiments, a second metal protective coating covers all or a portion of a surface of the second lead.

Fifth aspect. A fifth aspect of the present disclosure provides a multiple band gap device comprising a substrate having a surface and a plurality of nanoribbons. Each nanoribbon is defined by a first end, a second end and a length. The plurality of nanoribbons are lengthwise arranged on the substrate with each nanoribbon in the plurality of nanoribbons occupying a different portion of the substrate. The plurality of nanoribbons comprise (i) a first nanoribbon characterized by a first band gap, and (ii) a second nanoribbon characterized by a second band gap, where the first band gap is smaller than the second band gap. The multiple band gap device further comprises a first lead electrically contacting the first end of each nanoribbon in the plurality of nanoribbons as well as a second lead electrically contacting the second end of each nanoribbon in the plurality of nanoribbons. The multiple band gap device is operated by electrical control of the first lead and the second lead. The multiple band gap device further comprises a first metal protective coating covering all or a portion of a surface of the first lead.

In some embodiments, the first lead and the second lead are in electrical communication with an external current and the multiple band gap device is a multiple band gap light emitting diode that emits light in response to the external current. In some embodiments, the plurality of nanoribbons are configured to collectively emit a visually white light. In some embodiments, the first lead comprises titanium, the second lead comprises palladium, and the first metal protective coating comprises gold. In some embodiments, a second metal protective coating covers all or a portion of a surface of the second lead.

Sixth aspect. A sixth aspect provides a multiple band gap device comprising a substrate having a surface and a plurality of clusters. The plurality of clusters are arranged with each cluster occupying a different portion of the substrate. Ono or more respective clusters in the plurality of clusters comprises (i) a plurality of nanoribbons, where each nanoribbon in the plurality of nanoribbons is characterized by a band gap, the nanoribbons in the plurality of nanoribbons lengthwise arranged with respect to each other, each nanoribbon in the plurality of nanoribbons defined by a first end, a second end and a length, (ii) a first lead electrically contacting the first end of each nanoribbon in the plurality of nanoribbons, (iii) a second lead electrically contacting the second end of each nanoribbon in the plurality of nanoribbons, and (iv) a first metal protective coating covering all or a portion of a surface of the first lead. The multiple band gap device further comprises an optical splitter in optical communication with the plurality of clusters. the optical splitter (i) splits an incident light' into a first wavelength band and a second wavelength band, the first wavelength band characterized by at least one wavelength that is greater than the wavelengths in the second wavelength band, and (ii) directs the first light wavelength band to a first cluster in the plurality of clusters and the second wavelength band to a second cluster in the plurality of clusters. The multiple band gap device is operated by electrical control of the first and second leads of the first cluster and the first and second leads of the second cluster.

In some embodiments, each nanoribbon in the plurality of nanoribbons in the first cluster has a first band gap value, each nanoribbon in the plurality of nanoribbons in the second cluster has a second band gap value, and the first band gap value is greater than the second band gap value. In some embodiments, the band gap of each nanoribbon in the plurality of nanoribbons in the first cluster is the same, and the width of each nanoribbon in the plurality of nanoribbons in the first cluster is the same. In some embodiments, the band gap of each nanoribbon in the plurality of nanoribbons in the first cluster is within a first band gap range, the band gap of each nanoribbon in the plurality of nanoribbons in the second cluster is within a second band gap range, and a first band gap value in the first band gap range is greater than a second band gap value in the second band gap range. In some embodiments, each cluster in the plurality of clusters has a width that is between 1 µm to 10 mm and a length that is between 1 µm and 10 mm. In some embodiments, each cluster in the plurality of clusters has a width that is between 10 µm and 1 mm and a length that is between 10 µm and 1 mm. In some embodiments, each cluster in the plurality of clusters has a width that is between 50 µm to 500 µm and a length that is between 50 µm to 500 µm. In some embodiments, the first cluster has a different width or a different length than the second cluster. In some embodiments, the first cluster has the same width or the same length as the second cluster. In some embodiments, each cluster in the plurality of clusters comprises between $10^6$ to $10^{12}$ nanoribbons/cm$^2$. In some embodiments, the first cluster is in series electrical communication with the second cluster. In some embodiments, the first cluster is in parallel electrical communication with the second cluster. In some embodiments, the first cluster is in series electrical communication with the second cluster and in parallel electrical communication with a third cluster in the plurality of clusters. In some embodiments, the multiple band gap device is a photovoltaic device that generates electricity in response to an incident light. In some embodiments, the multiple band gap device is a photodetector that generates a current or a voltage in response to an incident light. In some embodiments, the photovoltaic device produces a power density of at least 50 W/m$^2$. In some embodiments, the first lead comprises titanium, the second lead comprises palladium, and the first metal protective coating comprises gold. In some embodiments, a second metal protective coating covers all or a portion of a surface of the second lead.

5. BRIEF DESCRIPTION OF THE DRAWINGS

FIG. 1 illustrates a multijunction solar cell in accordance with the prior art.

Figure 3:
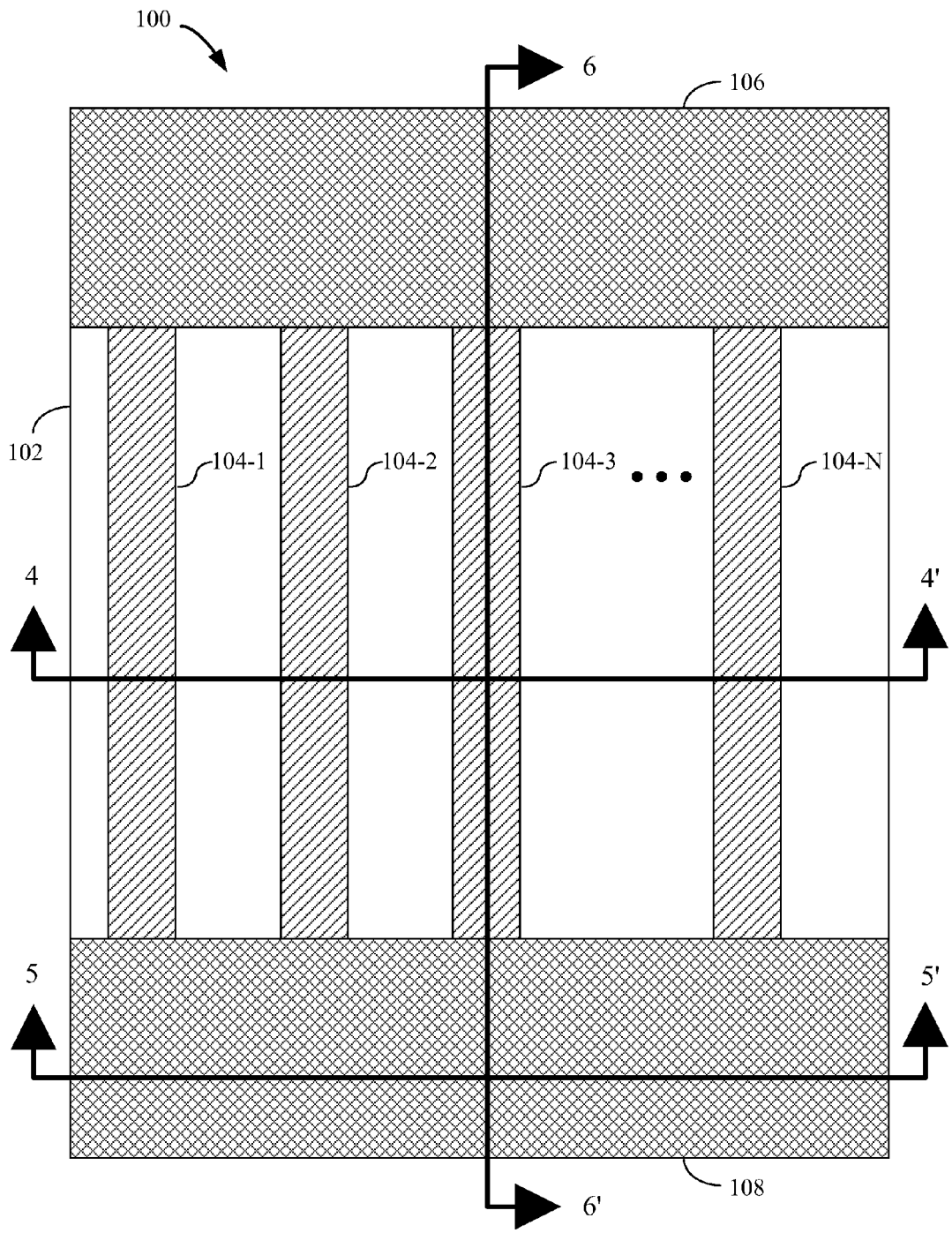

FIG. 3 provides a schematic top view of an exemplary multiple band gap device having vertically stacked architecture in accordance with an aspect of the present disclosure.

Figure 4:
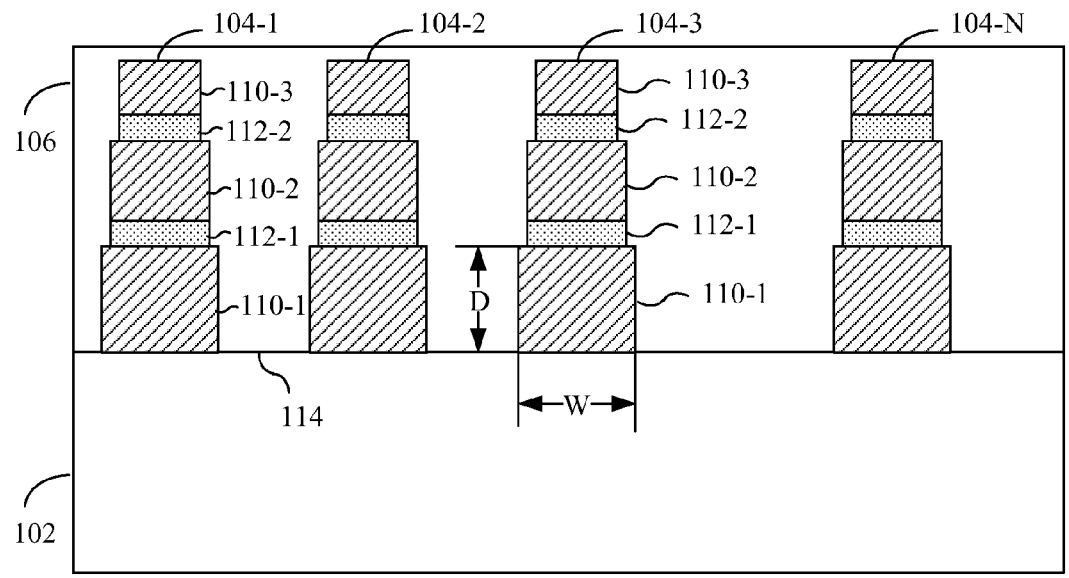

FIG. 4 is a cross-sectional view taken about line 4-4' of FIG. 3 depicting the structure away from the ends of nanoribbons in accordance with an aspect of the present disclosure.

Figure 5:
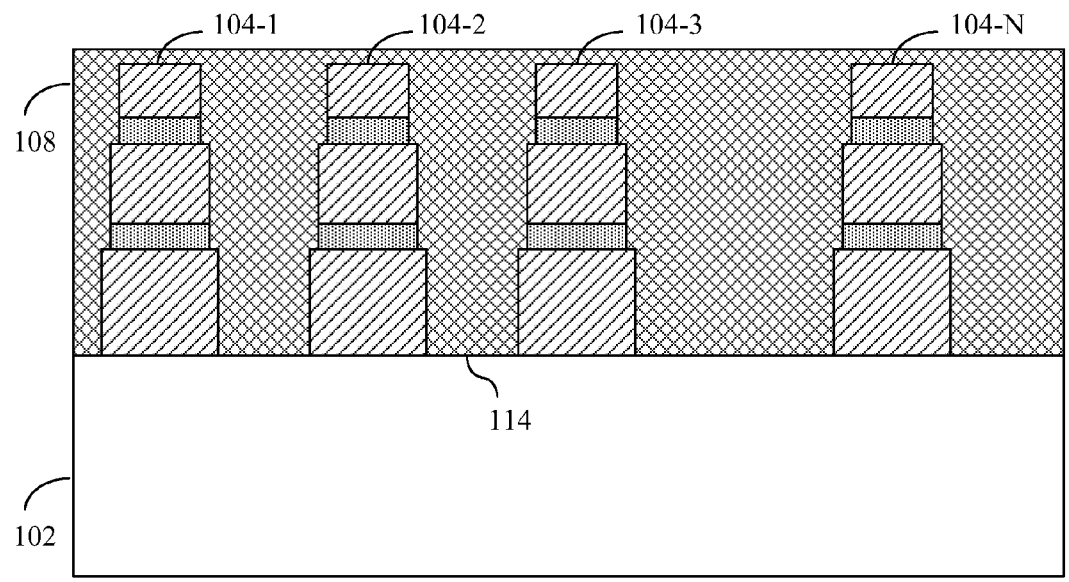

FIG. 5 is a cross-sectional view taken about line 5-5' of FIG. 3 depicting the structure at one end of nanoribbons in accordance with an aspect of the present disclosure.

Figure 6:
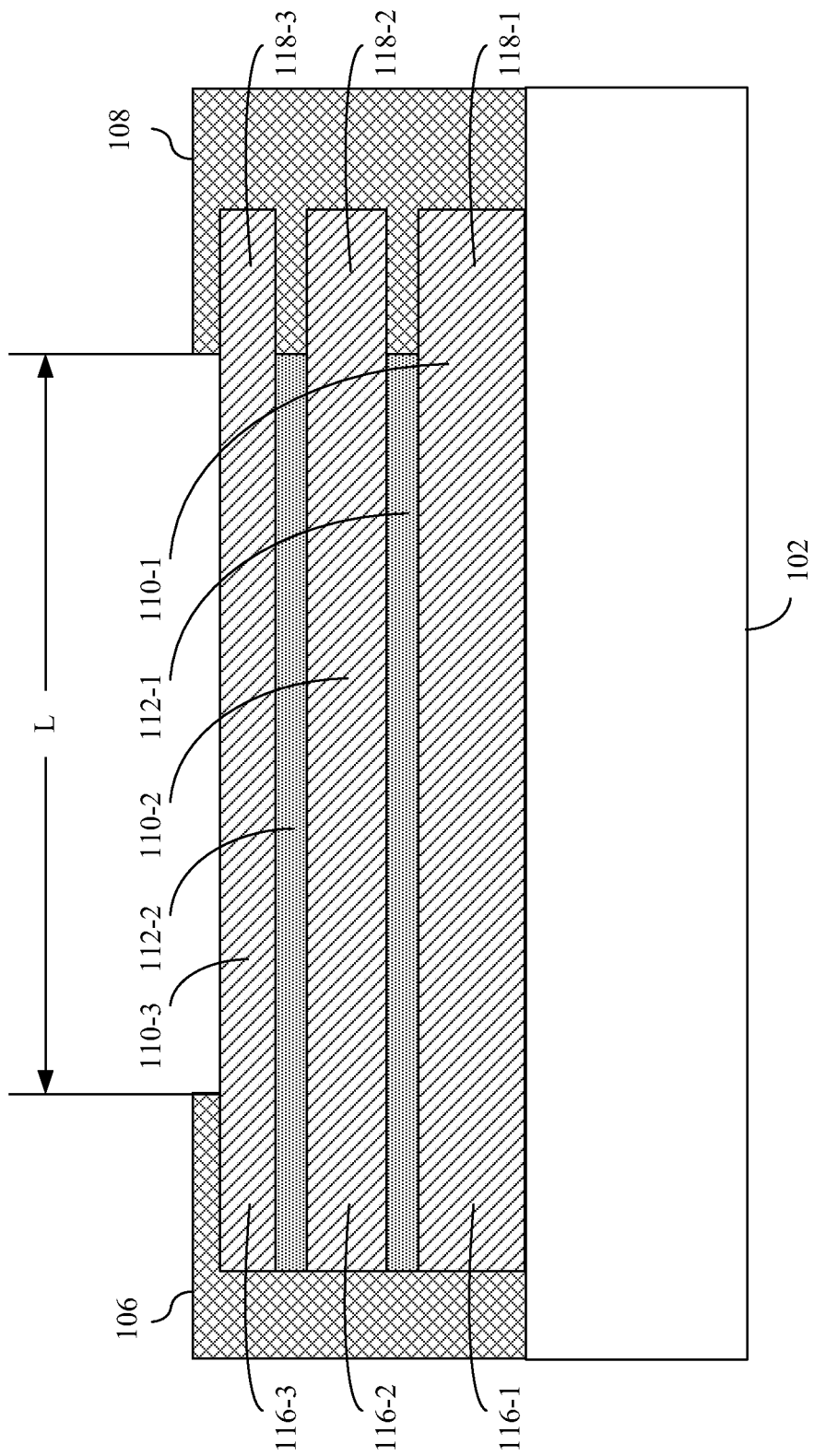

FIG. 6 is a cross-sectional view taken about line 6-6' of FIG. 3 depicting the structure along the lengthwise direction of nanoribbons in accordance with the present disclosure.

Figure 7:
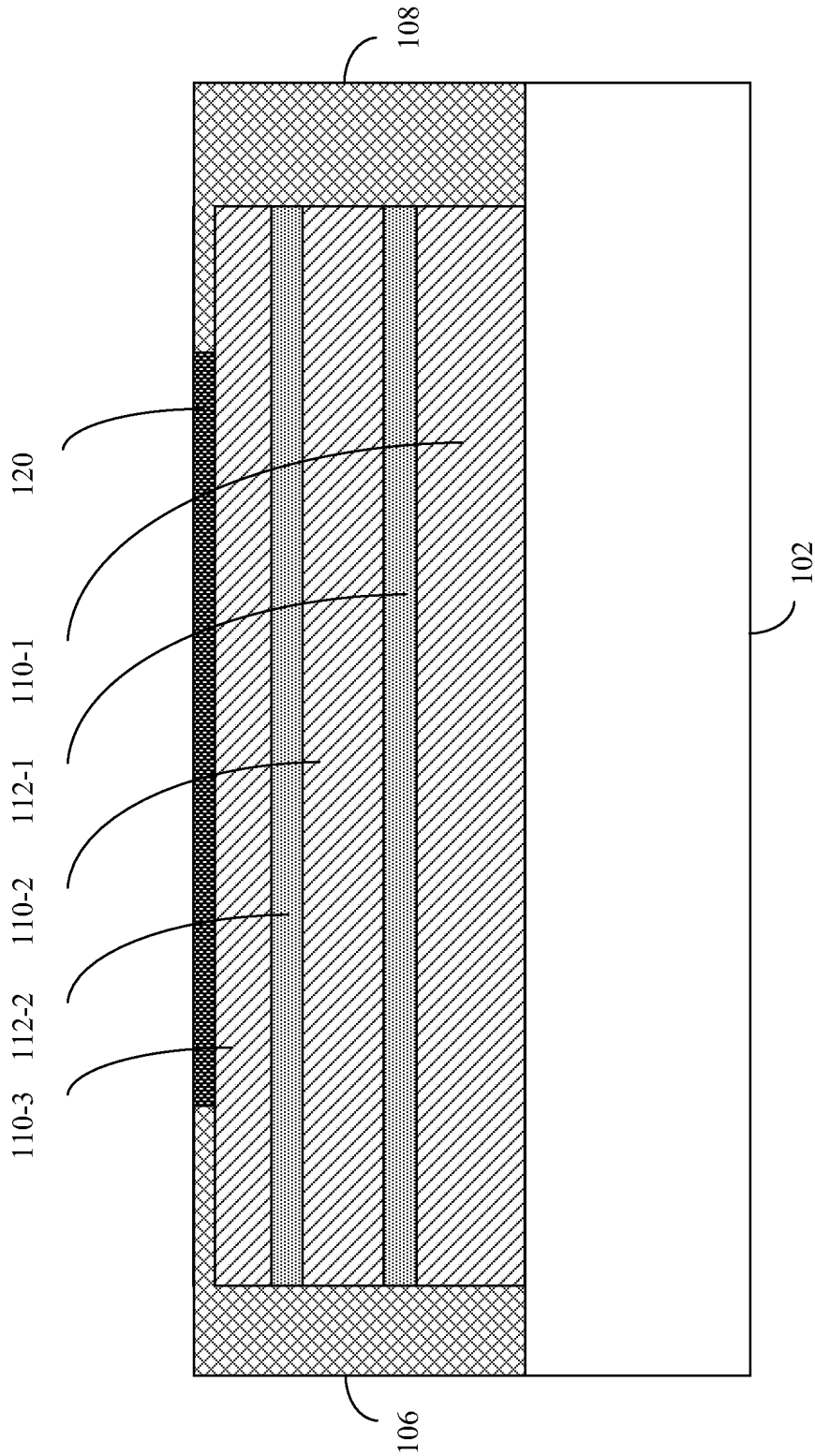

FIG. 7 illustrates an optional antireflection layer overlaying the vertically stacked nanoribbons in accordance with an aspect of the present disclosure.

Figure 8:
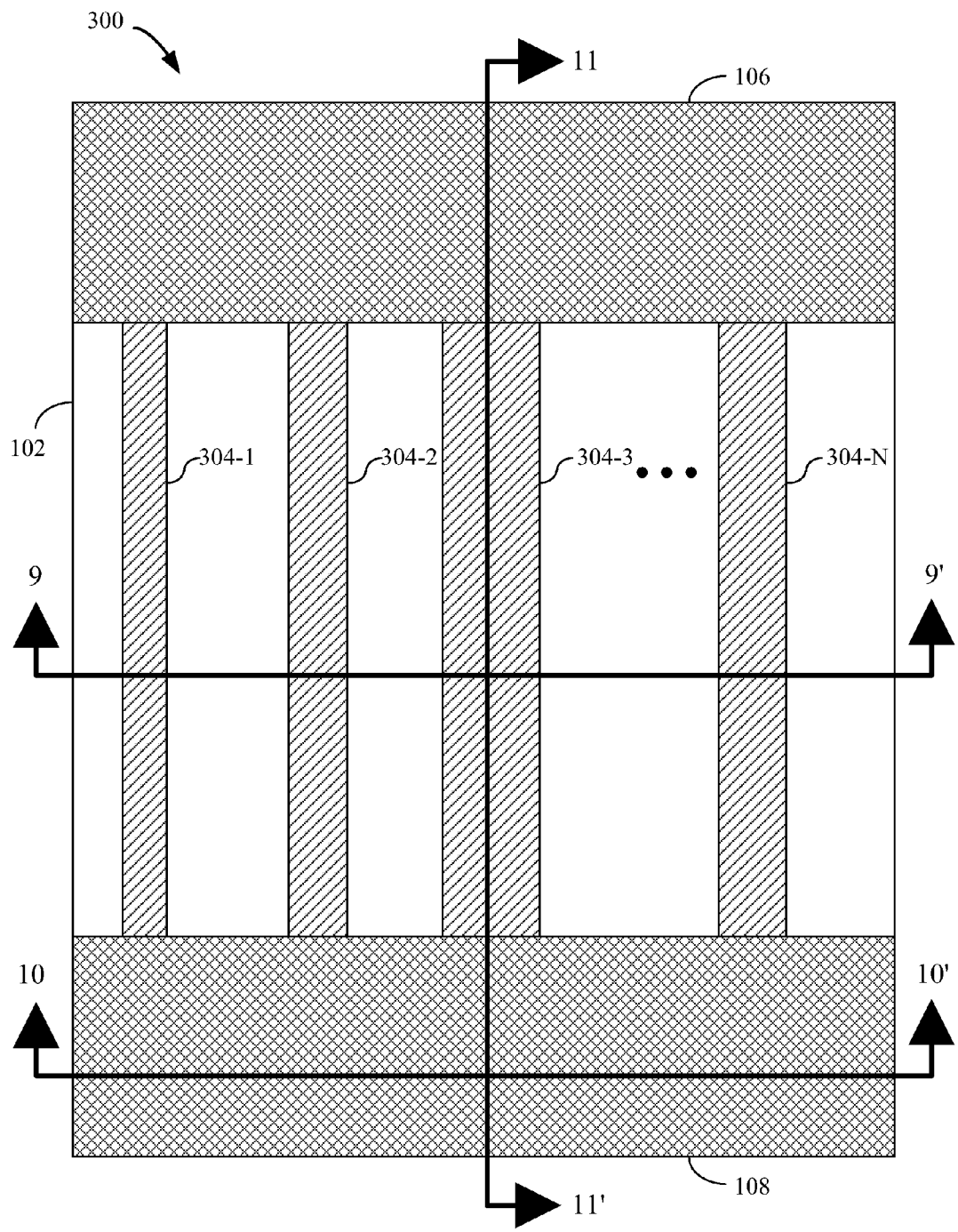

FIG. 8 provides a schematic top view of an exemplary multiple band gap device having laterally spaced architecture in accordance with an aspect of the present disclosure.

Figure 9:
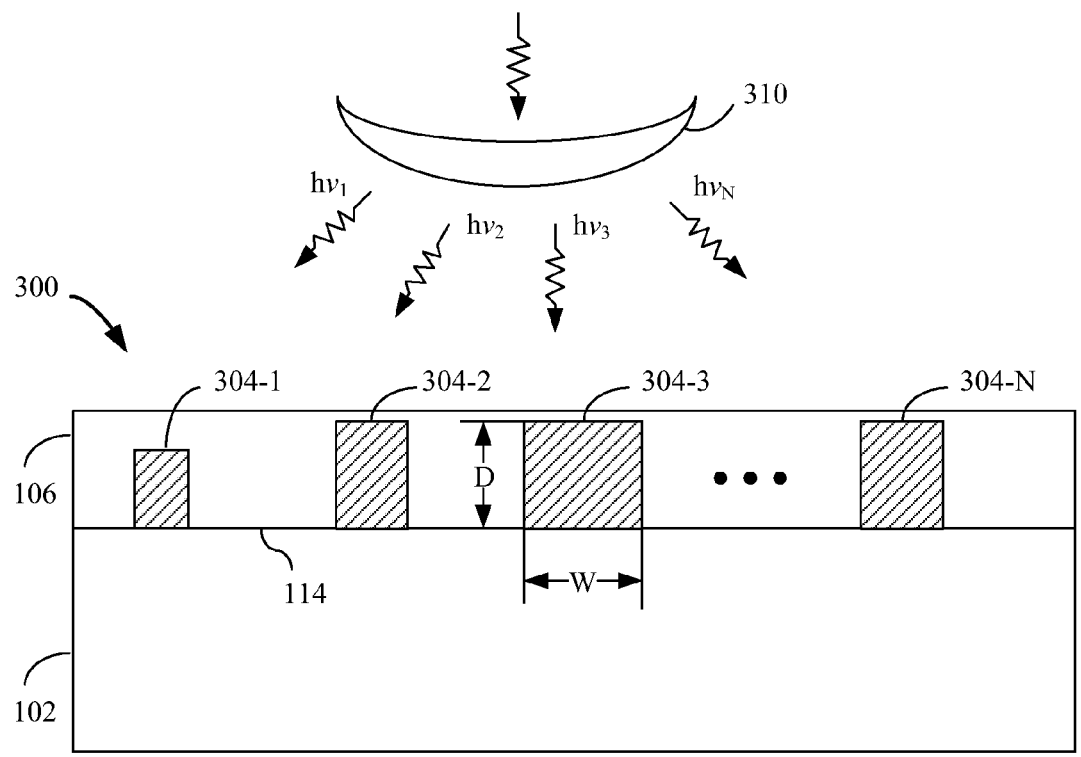

FIG. 9 is a cross-sectional view taken about line 9-9' of FIG. 8 depicting the structure away from the ends of the nanoribbons in accordance with an aspect of the present disclosure.

Figure 10:
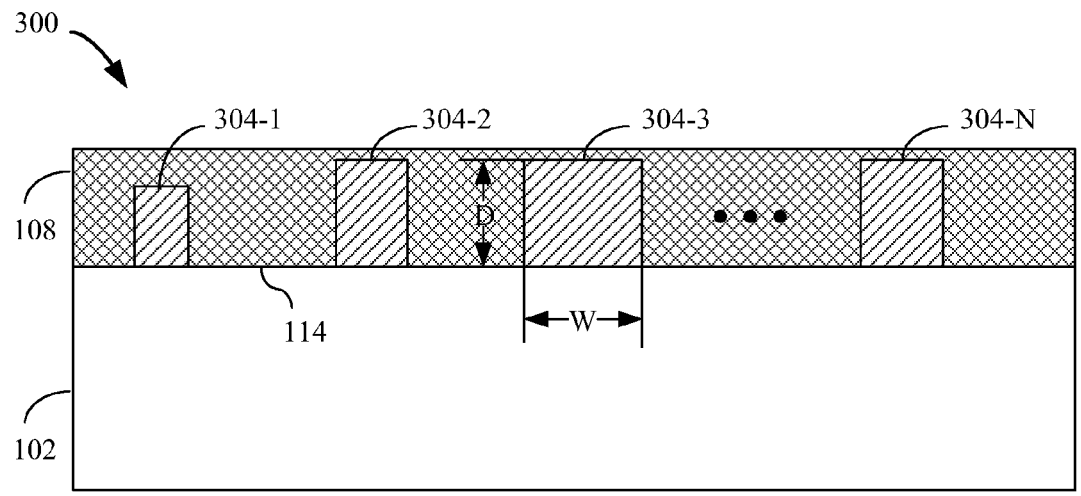

FIG. 10 is a cross-sectional view taken about line 10-10' of FIG. 8 depicting the structure at one end of the nanoribbons in accordance with an aspect of the present disclosure.

Figure 11:
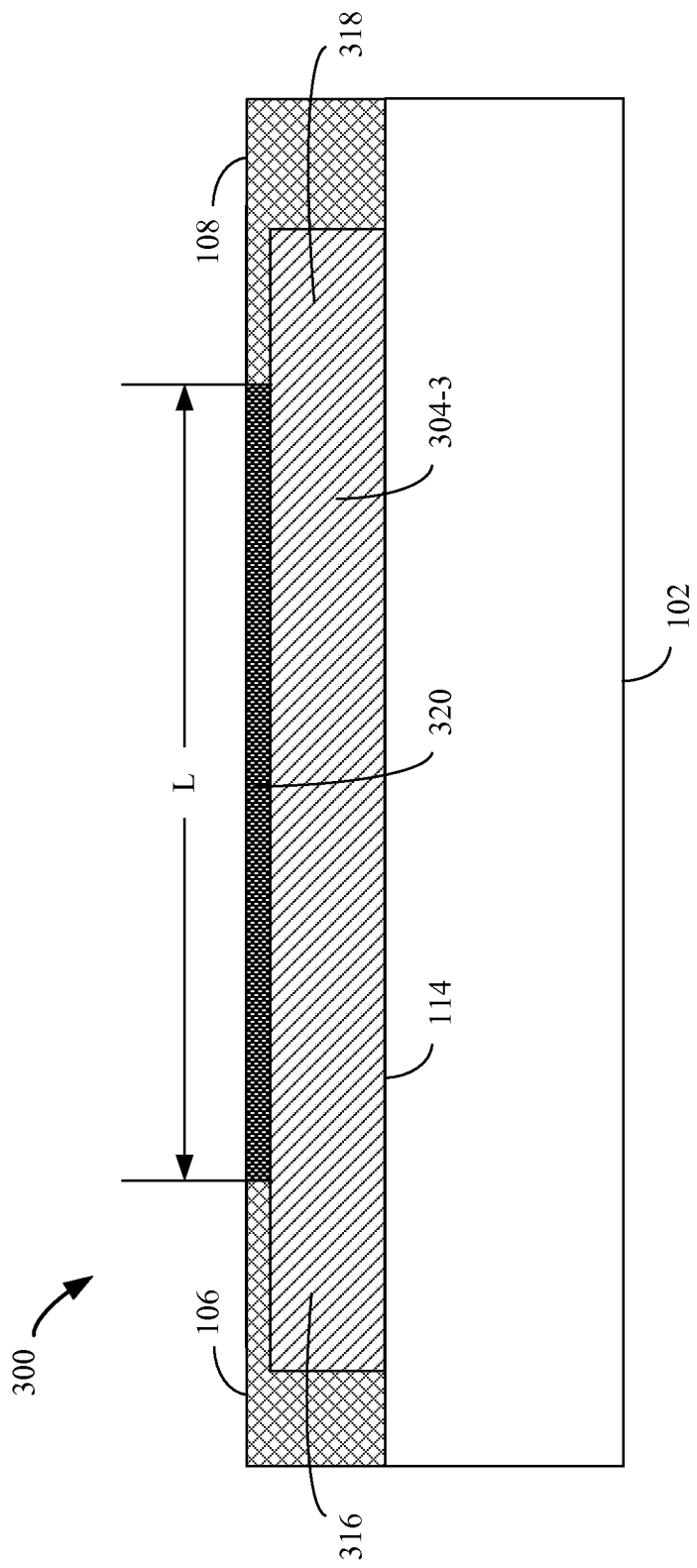

FIG. 11 is a cross-sectional view taken about line 11-11' of FIG. 8 depicting the structure along the lengthwise direction of the nanoribbons in accordance with an aspect of the present disclosure.

Figure 12:
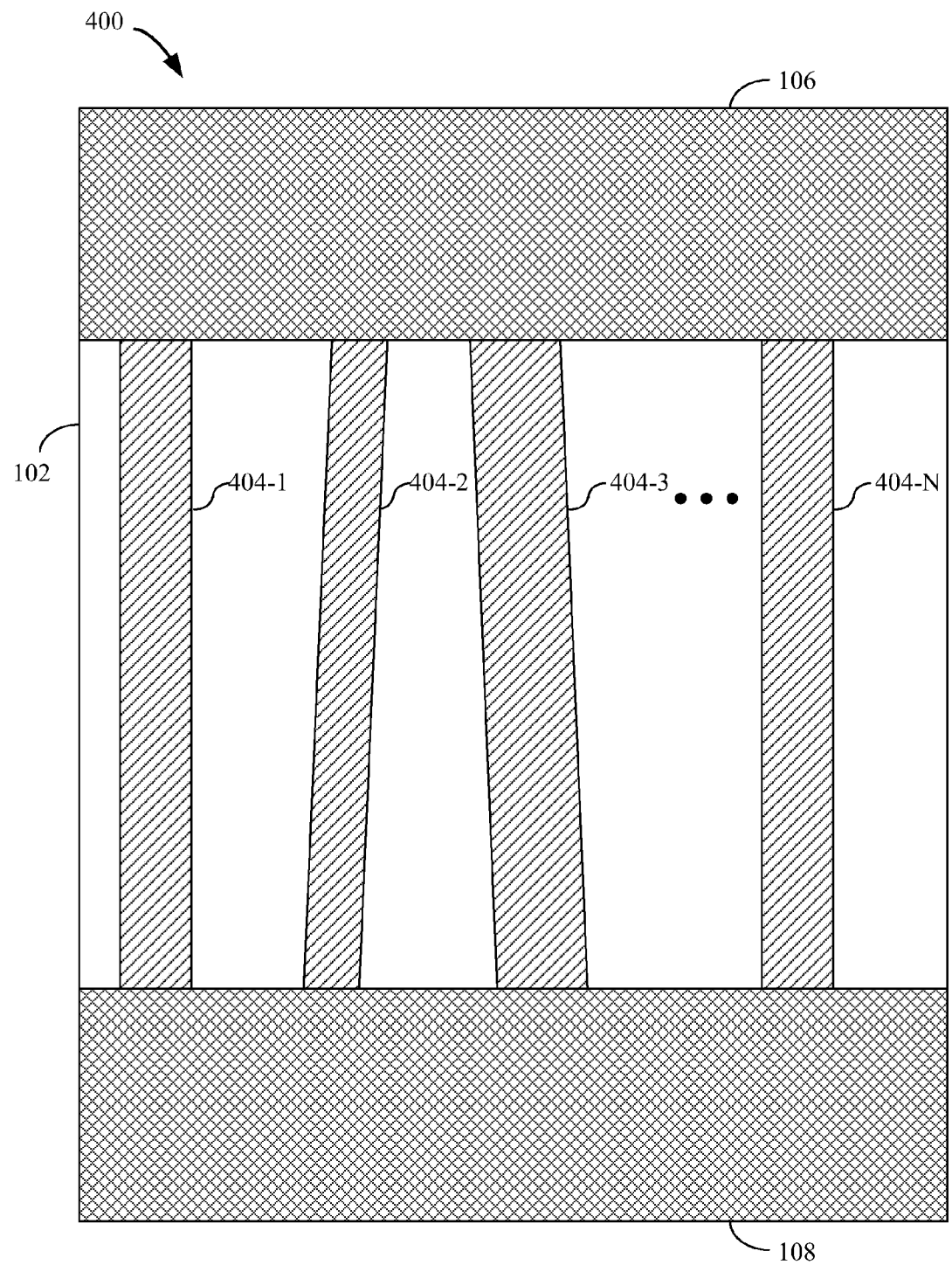

FIG. 12 illustrates an additional exemplary multiple band gap device in accordance with an aspect of the present disclosure.

Figure 13:
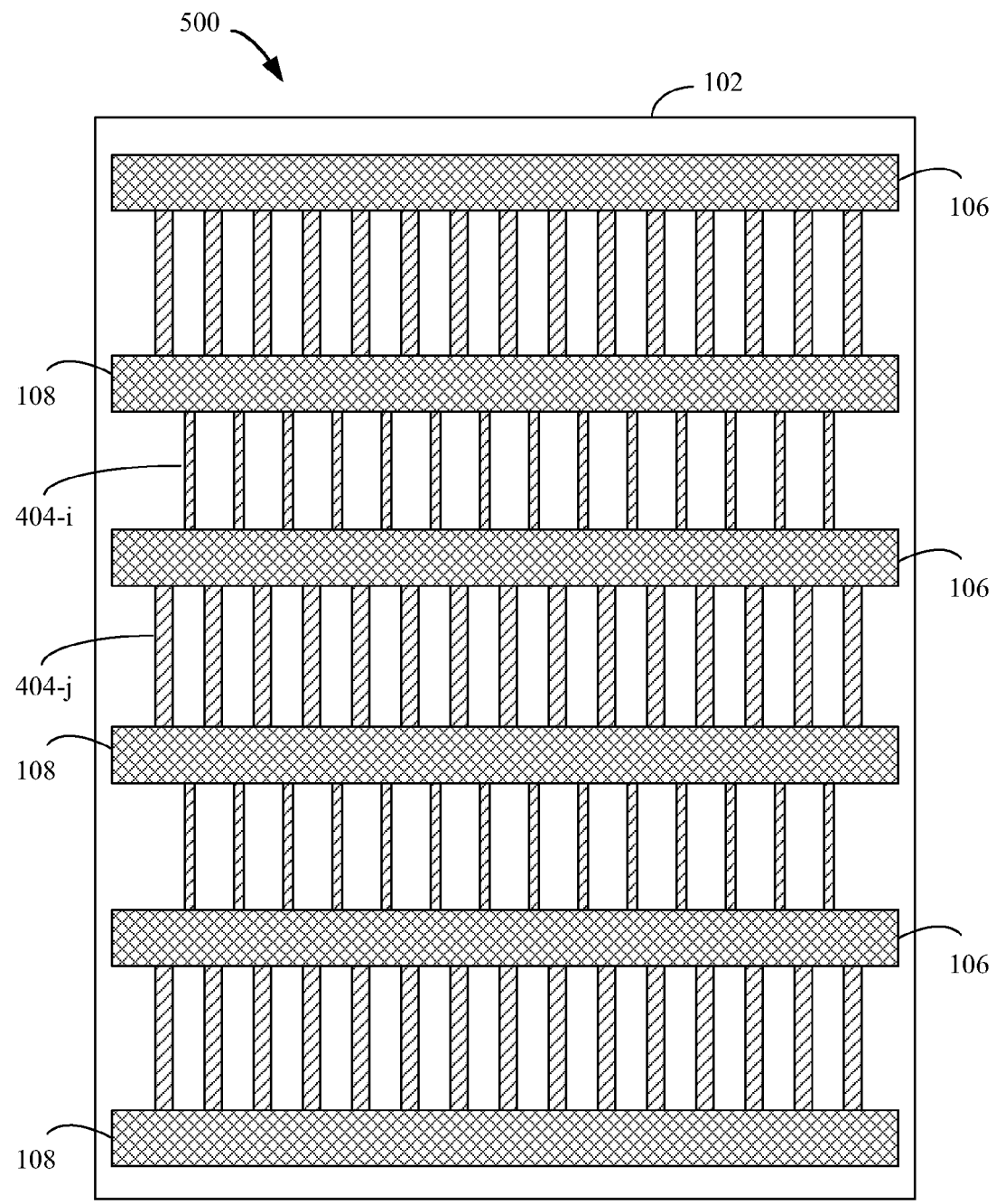

FIG. 13 illustrates an additional exemplary multiple band gap device in accordance with an aspect of the present disclosure.

Figure 14:
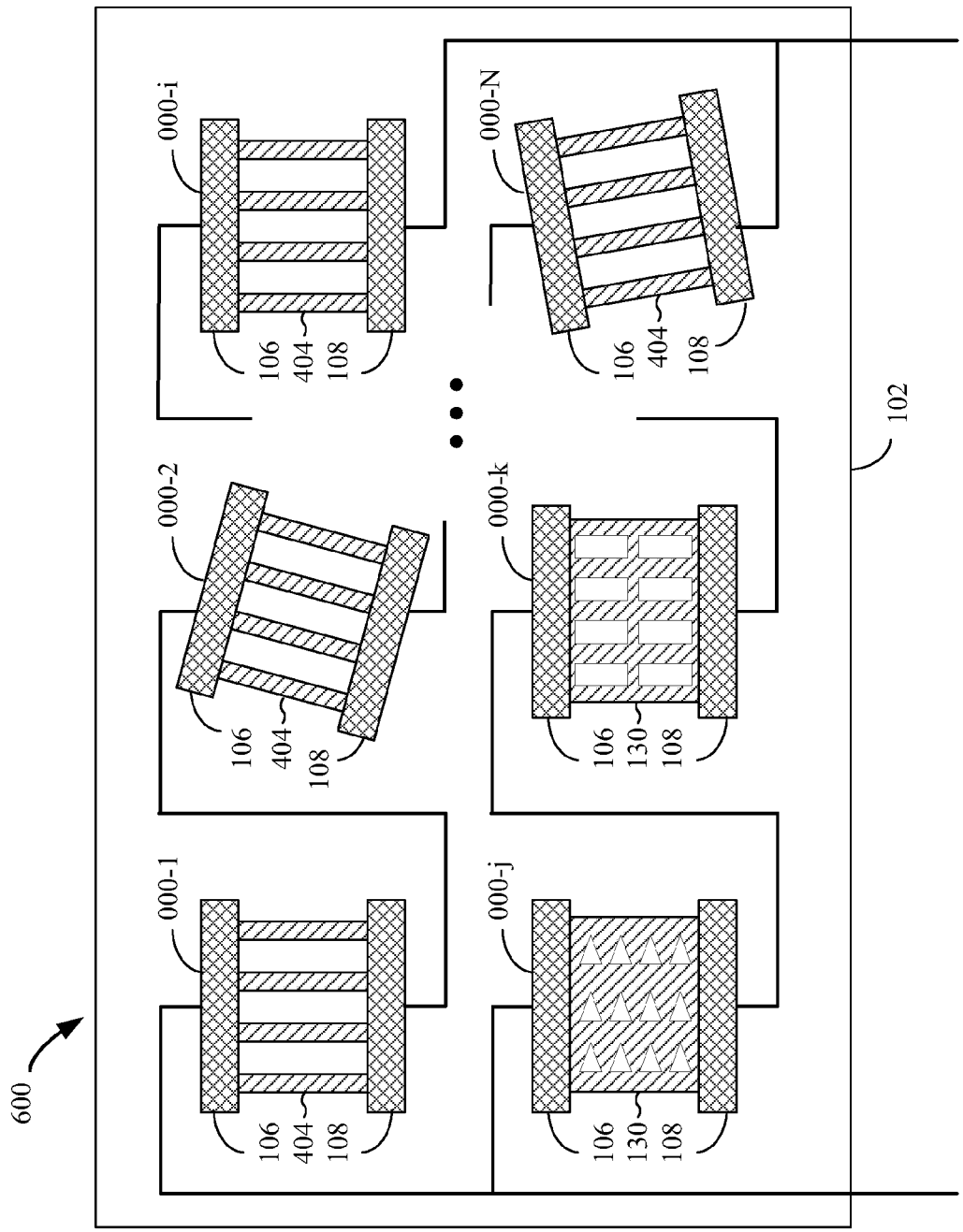

FIG. 14 illustrates an additional exemplary multiple band gap device in accordance with an aspect of the present disclosure.

Figure 15:
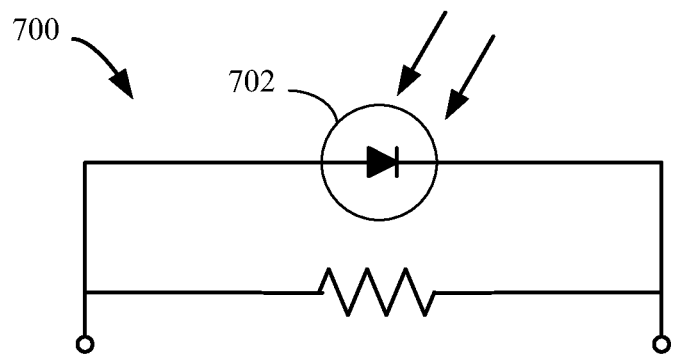

FIG. 15 depicts a schematic electrical diagram of a multiple band gap photovoltaic device in accordance with an aspect of the present disclosure.

Figure 16:
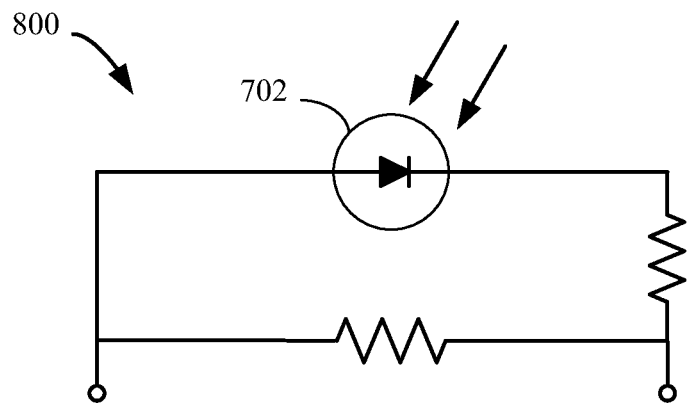

FIG. 16 depicts a schematic electrical diagram of a multiple band gap photodetector in accordance with an aspect of the present disclosure.

Figure 17:
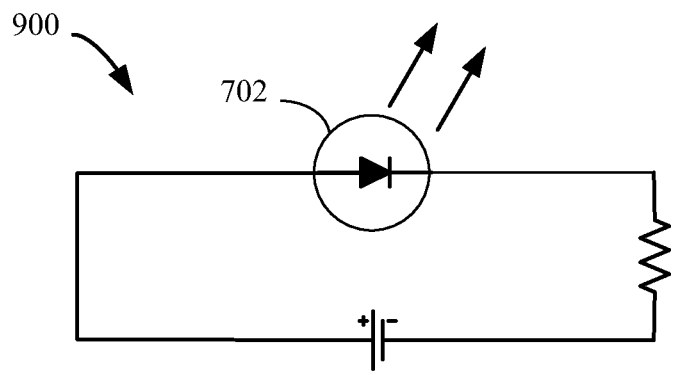

FIG. 17 depicts a schematic electrical diagram of a multiple band gap light emitting diode in accordance with an aspect of the present disclosure.

Figure 18:
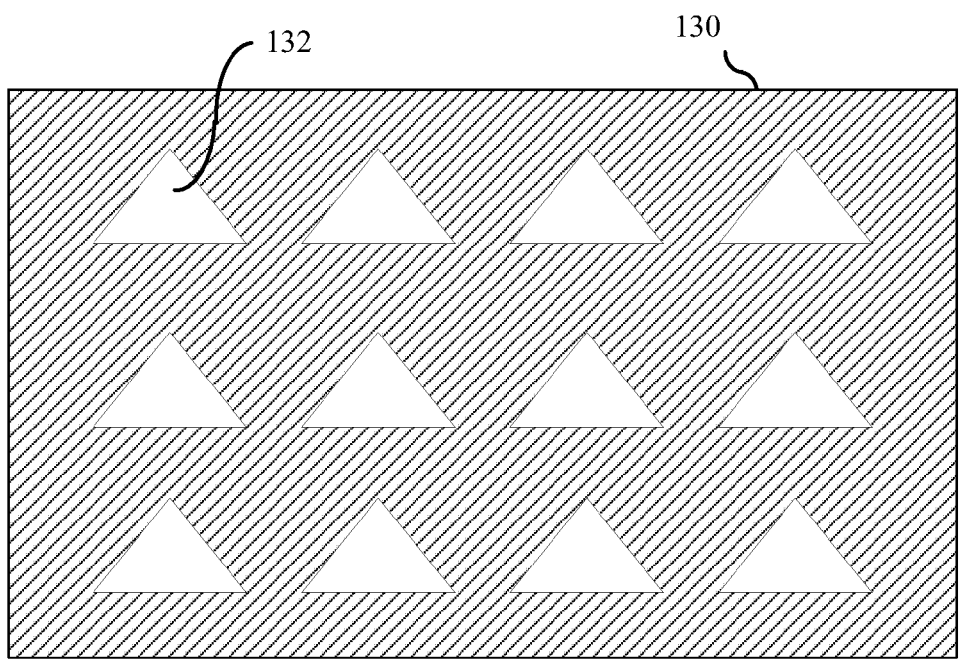
Figure 18:
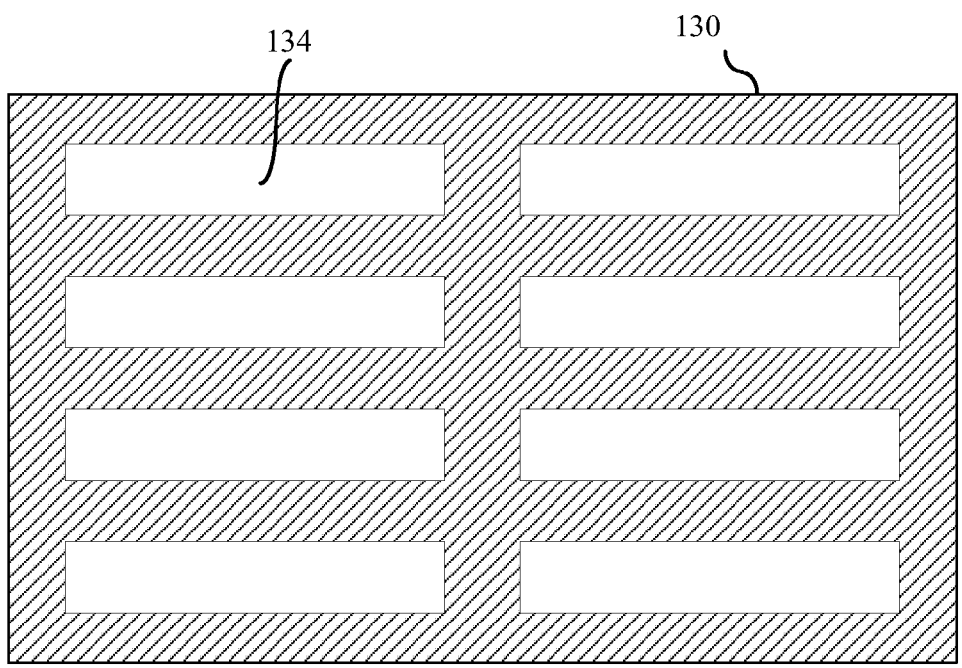

FIG. 18 depicts a schematic top view of a semiconducting nanohole superlattice in accordance with an aspect of the present disclosure.

Figure 19:
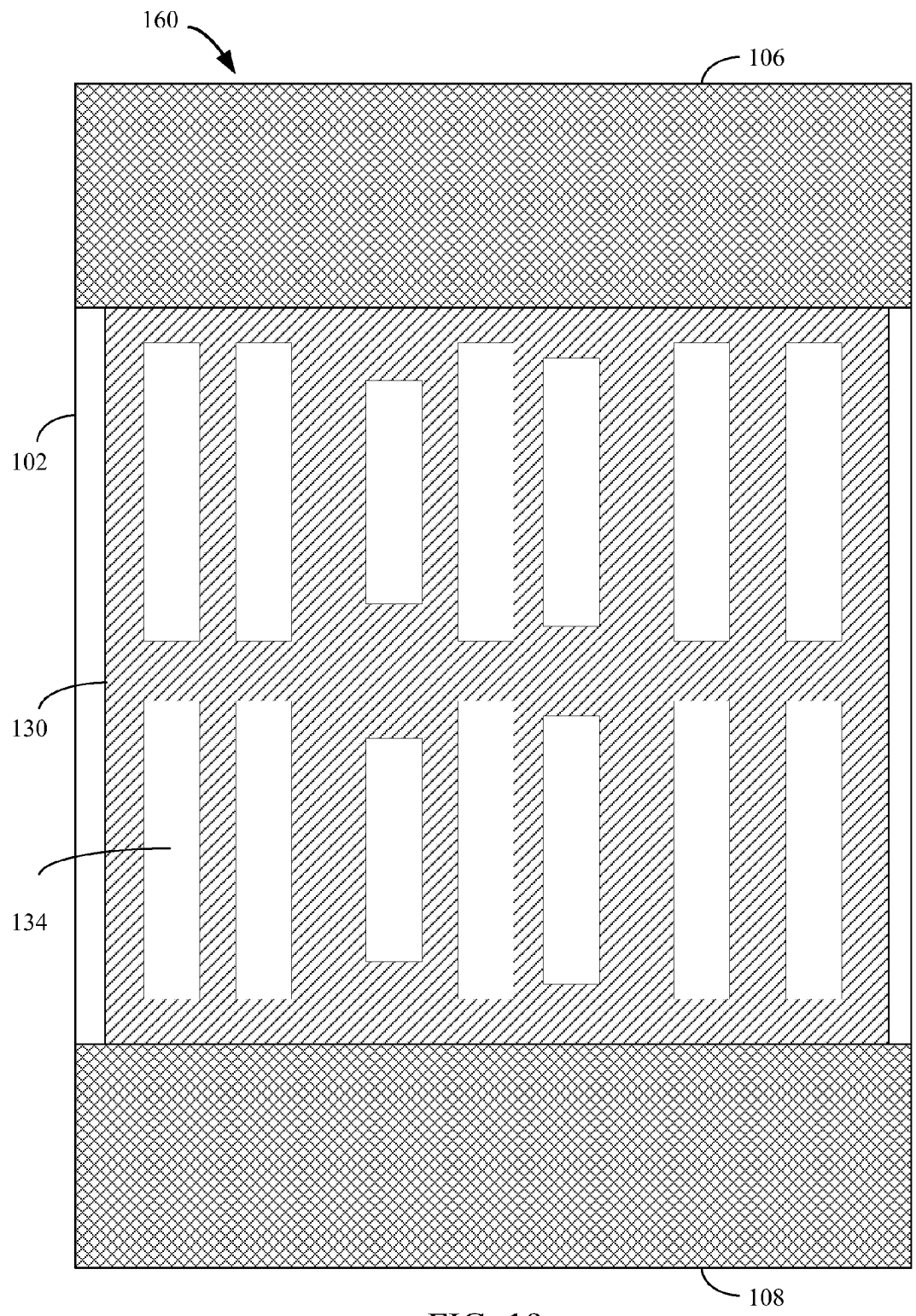

FIG. 19 depicts a schematic top view of a multiple band gap device comprising a nanohole superlattice in accordance with an aspect of the present disclosure.

Figure 20:
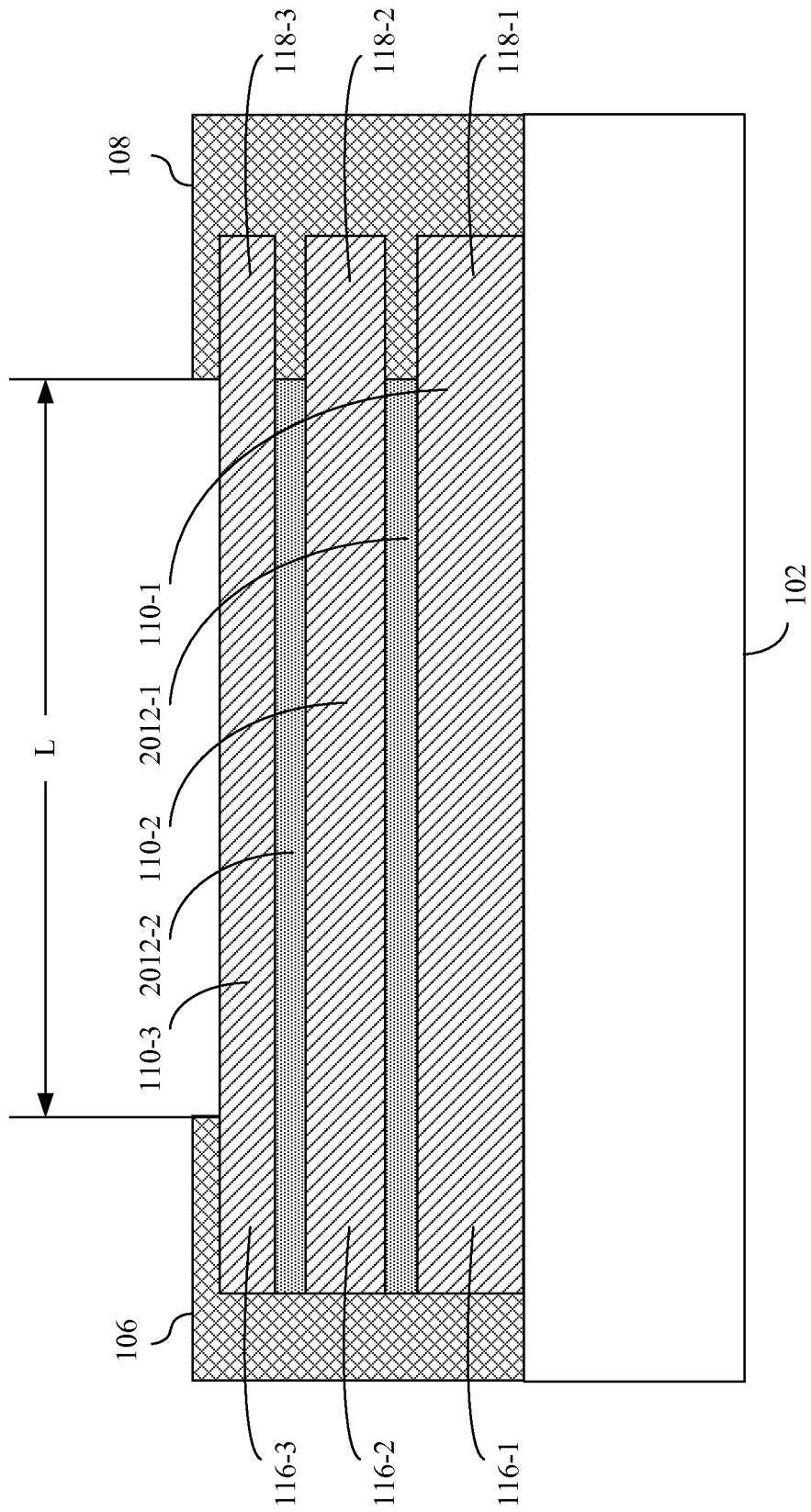

FIG. 20 is a cross-sectional view of a nanohole superlattice device in accordance with the present disclosure.

Figure 21:
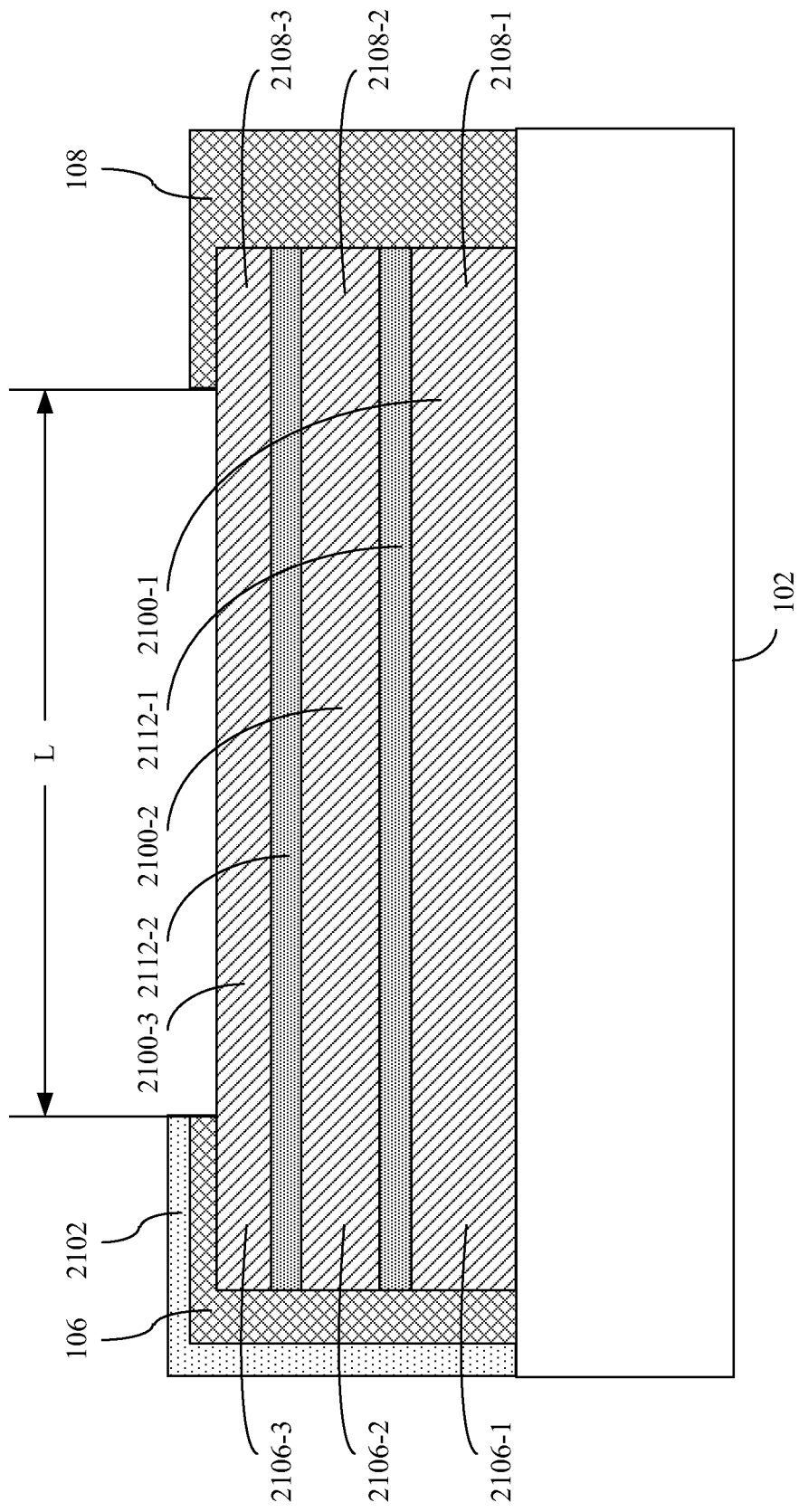

FIG. 21 is a cross-sectional view depicting a coating covering a lead at one end of nanoribbons or nanohole superlattices in accordance with an aspect of the present disclosure.

Figure 22:
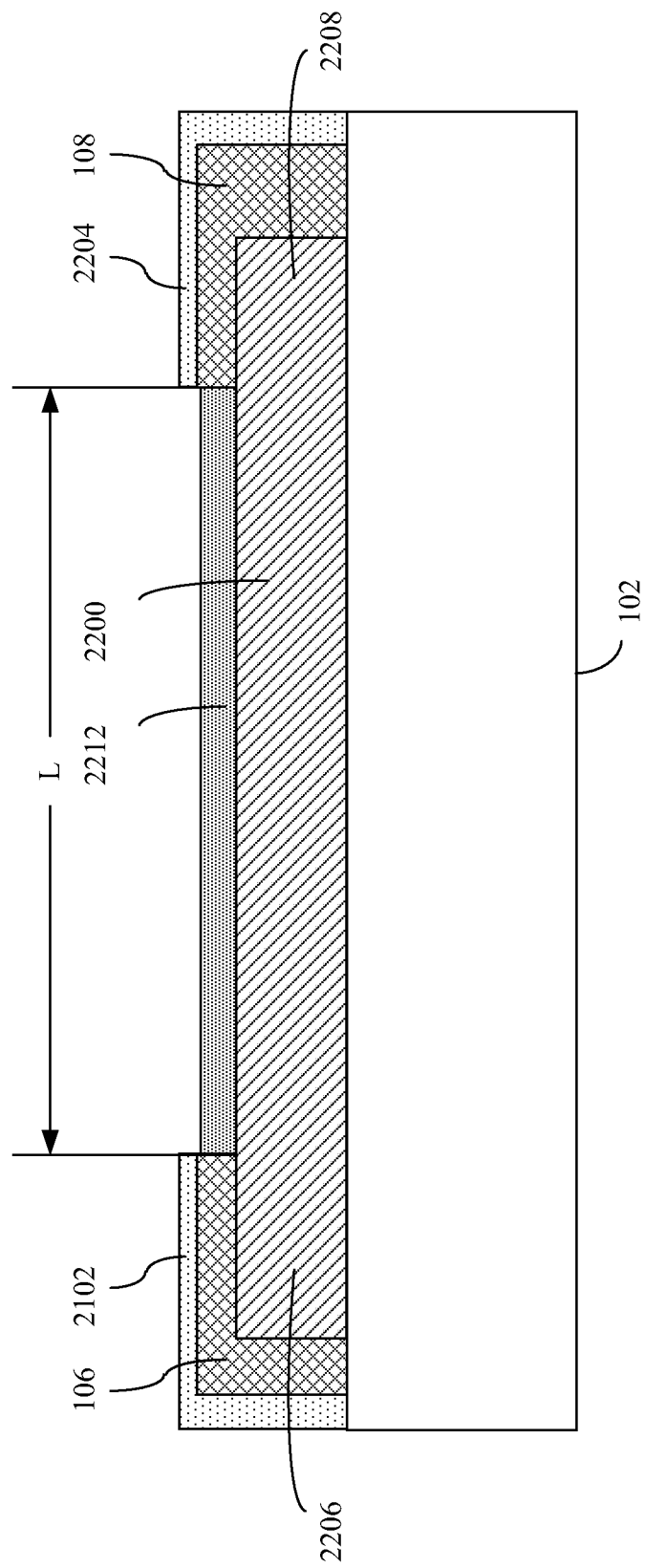

FIG. 22 is a cross-sectional view depicting coatings covering leads at both ends of nanoribbons or nanohole superlattices in accordance with an aspect of the present disclosure.

Like reference numerals refer to corresponding parts throughout the several views of the drawings. Dimensions are not drawn to scale.

6. DETAILED DESCRIPTION

Disclosed herein are multiple band gap devices comprising a plurality of semiconducting nanoribbons disposed on a substrate or comprising a plurality of stacks disposed on a substrate with each stack having a plurality of semiconducting nanoribbons. Each nanoribbon in the plurality of semiconducting nanoribbons is characterized by a band gap, and is in electrical communication with two conductive leads.

Also disclosed herein are multiple band gap devices comprising one or more semiconducting nanohole superlattices comprising one or more stacks disposed on a substrate with each stack having one or more semiconducting nanohole superlattices. Each nanohole superlattice is characterized by a band gap range, and is in electrical communication with two conductive leads.

The instant multiple band gap devices can be used for various applications, for example, as photovoltaic solar cells for converting light into power, as photodetectors for converting an incident light into detectable signals, and as light emitting diodes (LEDs) for lighting when connected to an external current.

6.1. Characteristics of Semiconducting Nanoribbons

Semiconducting nanoribbons can be fabricated from a number of layered crystalline materials by microfabrication techniques such as photolithographic patterning or by E-beam and/or interference lithography nanopatterning. Suitable materials include graphite (C), boron nitride (BN), molybdenum disulfide ($MoS_2$), tungsten disulfide ($WS_2$), zinc oxide (ZnO), and titanium dioxide ($TiO_2$). These materials have a similar layered structure. Within each layer, atoms are bound by strong covalent bonds, whereas the layers are held together by weak van der Waals forces.

One suitable form of nanoribbon is graphitic (graphene or graphite) nanoribbons. Graphene nanoribbons are one layer carbon strips. Graphite nanoribbons are made of stacked graphene layers. A review of graphene and graphite nanoribbons is found in Nano Today 5, 351, which is hereby incorporated by reference herein in its entirety. Additional description of graphene and graphite nanoribbons is disclosed in U.S. Pat. No. 7,858,876 to Lagally et al., which is hereby incorporated by reference herein in its entirety. By way of illustration, graphitic nanoribbons are described herein to demonstrate the characteristics of semiconducting nanoribbons and how the present disclosure takes the advantage of these characteristics to develop multiple band gap devices.

As a nanostructure, graphitic nanoribbons exhibit useful physicochemical and electrical properties different from those observed in bulk (See, Nano Today 5, 351 and Physical Review B 76, 121405(R) (2007)). One of the useful characteristics for the development of the present multiple band gap devices is that the band gaps of semiconducting graphitic nanoribbons can be tuned and controlled by varying nanoribbon width, thickness, edge state, doping and other factors. Such characteristics provide material with adjustable band gaps coupled with methods to tune the band gaps. Through optimization of nanoribbon width, thickness, edge state, doping and/or other factors, it is possible to fabricate nanoribbons that have specific band gaps and produce multiple band gap devices that achieve improved efficiency at reduced costs.

Another useful characteristic for some of the instant multiple band gap devices arises from the nature of the charge carriers (electrons or holes) in nanoribbons, which have a high carrier mobility due to the nature of being a two-dimensional material with weaker scattering than most other materials. The multiple band gap devices disclosed herein are configured to have the current flow along the length of the nanoribbons, that is, from one end to the other end of the nanoribbons. As a result, no current balancing is required, and the efficiency of the devices is not limited by the lowest current. In addition, it is unnecessary for interfaces between nanoribbon layers to have low resistance. This simplifies fabrication because it removes any requirement for tunneling junctions or other structures.

Still another useful characteristic of the graphitic nanoribbons disclosed herein is that their work functions are not strongly dependent upon their widths.

6.2. Characteristics of Semiconducting Nanohole Superlattices

As used herein the term "semiconducting nanohole superlattice" refers to a layered crystalline material having an array of nanoholes defined therein. The nanohole superlattice may comprise one sheet of the layered crystalline material or multiple vertically stacked sheets of the layered crystalline material.

FIGS. 18(a) and (b) depict a semiconducting nanohole superlattice 130 with triangular nanoholes 132 and with rectangular nanoholes 134 respectively. Other shapes of nanoholes or combination of different shapes of nanoholes can be patterned within a layered crystalline material to make a semiconducting nanohole superlattice. Layered crystalline materials include, but not limited to, graphite (C), boron nitride (BN), molybdenum disulfide (MoS2), tungsten disulfide ($WS_2$), zinc oxide (ZnO), and titanium dioxide ($TiO_2$).

The array of nanoholes can be produced using any suitable fabrication known in the art. For example, a nanohole superlattice structure may be patterned with one or more nanohole arrays using conventional photolithography techniques.

Effectively, a nanohole superlattice is considered a two-dimensional network of crossing nanoribbons, in which the size, shape, density of the nanoholes define the shape and dimensions of the nanoribbons. Thus nanohole superlattices have similar characteristics to nanoribbons. For example, while not being bound by any particular theory, the tight-binding model indicates that band gaps of graphene nanohole superlattices increase linearly with the product of nanohole size and density. This is because the width of a nanoribbon in the two-dimensional network of crossing nanoribbons can be decreased by either increasing the sizes of nanoholes or increasing the number of nanoholes in one fixed unit. Other similar characteristics include larger mean free paths for charge carriers in nanohole superlattices and dependence or weak dependence of the work functions of nanohole superlattices on the size, shape, density of the nanoholes. These characteristics make it possible to design a device with nanohole superlattices in a similar way as nanoribbons.

In addition to having similar characteristics, a nanohole superlattice in general has several advantages compared to an individual nanoribbon. For example, a signal nanoribbon is typically fragile and hard to transfer from one substrate to another. A nanohole superlattice, however, is mechanically stronger and more stable due to the crossing network structure, thus easier to transfer to another substrate if needed. In addition, a nanohole superlattice usually provides more surfaces for absorbing or omitting light, and hence potentially higher efficiency for a device comprising such a nanohole superlattice. Furthermore, a nanohole superlattice tolerates defects better than an individual nanoribbon.

6.3. Basic Structures

Using semiconducting nanoribbons or nanohole superlattices as a photon-absorbing or light-emitting material, the present disclosure provides a multiple band gap device that can efficiently convert photon energy to electricity, or vice versa, across all or a portion of a wide wavelength spectrum. In the case of semiconducting nanoribbons, the basic architecture of the multiple band gap device in accordance with the present disclosure includes a plurality of semiconducting nanoribbons that have multiple band gaps. The plurality of semiconducting nanoribbons are configured so that a nanoribbon with a first band gap absorbs a photon or emits a light within a first spectrum range and a nanoribbon with a second band gap absorbs a photon or emits a light within a second spectrum range. For example, the plurality of semiconducting nanoribbons may be arranged vertically by stacking one on top of another or arranged laterally by placing one next to another side by side.

In the case of semiconducting nanohole superlattices, the basic architecture of the multiple band gap device in accordance with the present disclosure includes one or more semiconducting nanohole superlattices. Each semiconducting nanohole superlattice is characterized by a band gap range, which can span a few meV or a few eV by control of nanohole patterns. For example, the band gap range of a nanohole superlattice may be controlled to be in the range of between 0.1 eV to 2 eV for absorbing solar radiation, or may be restrained at or near a desired single band gap value for detecting a light signal at a specific wavelength. Within the one or more nanohole superlattices, a nanohole superlattice may have different band gap range or value from other nanohole superlattices. Similar to nanoribbons, the one or more nanohole superlattices may be arranged vertically by stacking one on top of another or arranged laterally by placing one next to another side by side.

In addition to a plurality of semiconducting nanoribbons or one or more nanohole superlattices, the basic architecture of the multiple band gap devices in accordance with the present disclosure includes a first lead and a second lead, which are typically made of electrically conductive materials such as metals. In the case of nanoribbons, the first lead electrically contacts one end of each nanoribbon in the plurality of nanoribbons, and the second lead electrically contacts the other end of each nanoribbon in the plurality of nanoribbons. In the case of nanohole superlattices, the first lead electrically contacts one edge of each nanohole superlattice in one or more nanohole superlattices and the second lead electrically contacts the opposite edge of each nanohole superlattice in one or more nanohole superlattices. Depending on the application, the first lead or the second lead may form a Schottky barrier or ohmic contact at the interface between the lead and one end of the nanoribbons or between the lead and one edge of the nanohole superlattices.

6.3.1. Basic Element

Figure 2:
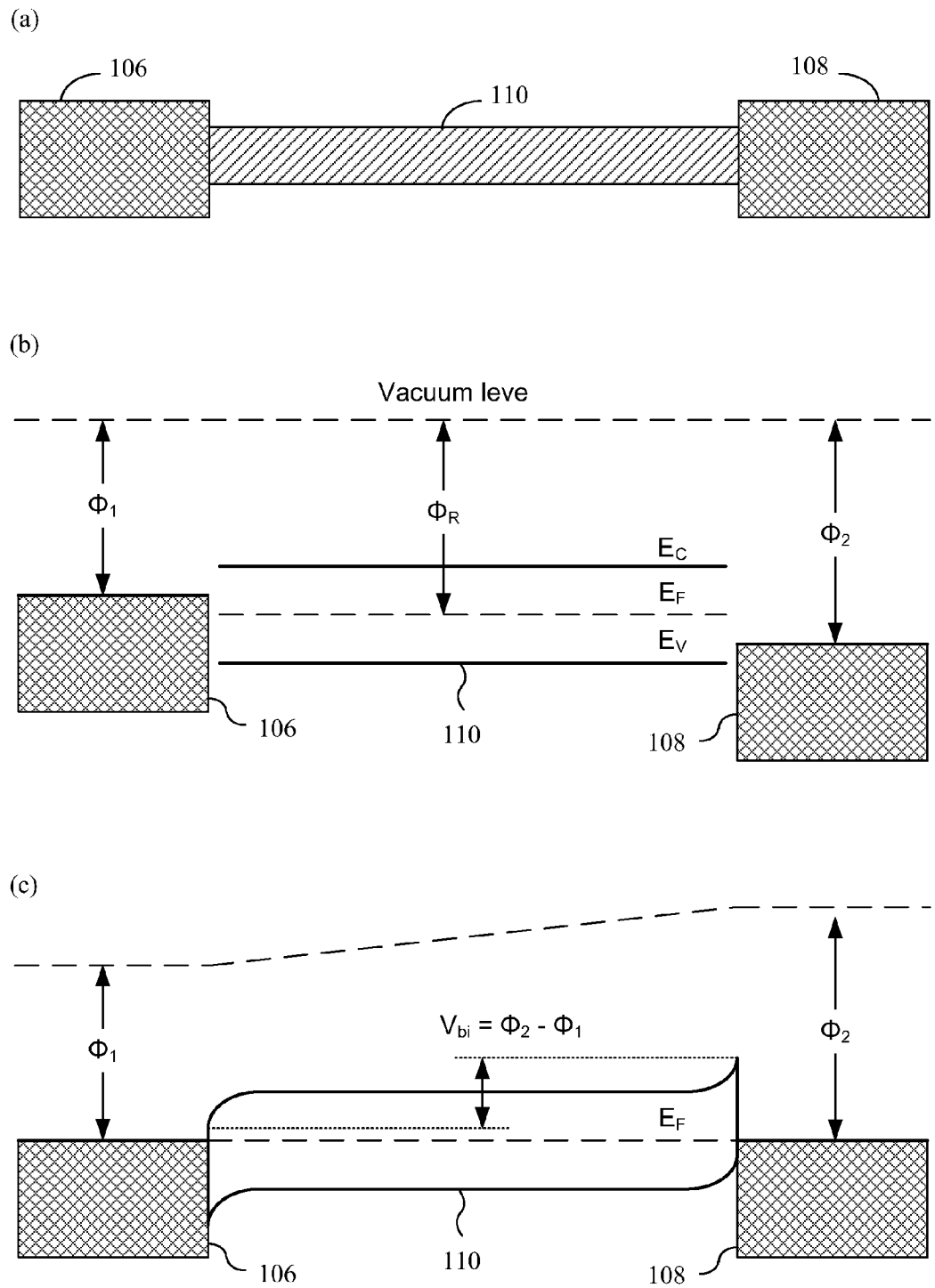
FIG. 2 depicts an element in a multiple band gap device and a schematic energy band diagram of the element in accordance with an aspect of the present disclosure.

Shown in FIG. 2(a) is a nanoribbon or nanohole superlattice 110 in contact with electrically conductive leads 106 and 108 at each end. The energy band diagrams of each material are depicted in FIG. 2(b) and FIG. 2(c), where FIG. 2(b) illustrates the energy band diagrams before the materials are connected to each other and FIG. 2(c) illustrates the energy diagrams after contacts are made and equilibrium is achieved. For demonstration, the first lead 106 has a work function $\Phi_1$ smaller than that of the nanoribbon or nanohole superlattice 110 $\Phi_R$ and the second lead 108 has a work function $\Phi_2$ larger than that of the nanoribbon or nanohole superlattice 110. As shown in FIG. 2(a), the Fermi levels of the materials are misaligned by their work function differences before intimate contacts are made. When the three materials are brought into contact as depicted in FIG. 2(b), however, their Fermi levels must line up creating Schottky barriers at the contacts. As a result, an electric field is generated in the nanoribbon or nanohole superlattice 110, with a built-in potential $V_{bi}$ that equals to the work function difference between the two leads.

For the ideal case of a short intrinsic nanoribbon or nanohole superlattice, $V_{bi}$ may decrease linearly over the whole nanoribbon or nanohole superlattice, from the second contact formed with the second lead 108 to the first contact formed with the first lead 106, like the vacuum level shown schematically in FIG. 2(c). For a very long and doped nanoribbon or nanohole superlattice, the doping level may be pinned, or the Fermi energy of the nanoribbon or nanohole superlattice will remain constant in the middle portion of the nanoribbon or nanohole superlattice. Then, in this case, the conduction and valence bands will be flat in the middle portion of the nanoribbon or nanohole superlattice, but bend downward near the contact formed with the lead 106 and upward near the contact formed with the lead 108, respectively, as illustrated in FIG. 2(c). The built-in field can separate electron-hole pairs generated by incident photons, creating a current in the nanoribbon or nanohole superlattice for a photovoltaic device or a photodetector. The built-in field can also inject carriers (electrons from one end and hole from the other end) to the nanoribbon or nanohole superlattice for emitting light.

It is not necessary to have one lead with a work function smaller than that of the nanoribbon or nanohole superlattice and the other with a work function larger than that of the nanoribbon or nanohole superlattice. In some embodiments, the first lead may (i) have a work function different from that of the nanoribbon or nanohole superlattice and (ii) form a Schottky barrier for electrons at the contact with the nanoribbon while the second lead either forms a smaller Schottky barrier for electrons or does not form a Schottky barrier for electrons at all. Alternatively, in some embodiments, the first lead may be selected to have a work function different from that of the nanoribbon or nanohole superlattice and to form a Schottky barrier for holes at the contact with the nanoribbon or nanohole superlattice while the second lead either forms a smaller Schottky barrier for holes or does not form a Schottky barrier for holes at all. More detailed information on Schottky barrier can be found in Metal-Semiconductor Schottky Barrier Junctions and Their Applications, edited by B. L. Sharma, 1984 Plenum Press, New York, which is hereby incorporated herein by reference.

In some embodiments, the nanoribbons or nanohole superlattices of the instant disclosure are made of pure or doped graphitic films. In some embodiments they are made of other materials, for instance, BN, $MoS_2$, $WS_2$, ZnO, $TiO_2$, or some combination thereof. Suitable materials for making the electrically conductive leads include, but are not limited to, Ti, Nb, Zn, Cr, Ag, Al, Co, Pd, Cu, Pt, and Au or some combination thereof, or some alloy thereof, with Ti and Pd preferable for graphitic nanoribbons or nanohole superlattices in some embodiments.

It is advantageous to have a built-in potential $V_{bi}$ in between the two ends of the nanoribbon or nanohole superlattice. Upon excitation of an incident light, free electrons will be generated within the nanoribbon or nanohole superlattice and flow from one end to the other end of the nanoribbon or nanohole superlattice. When stacking a plurality of nanoribbons or nanohole superlattices, one on top of another, to make a multiple band gap device in accordance to the present disclosure, generated free electrons will still flow from one end to the other end.

6.3.2. Formation of Multiple Band Gaps

Advantageously, multiple band gap devices of the present disclosure utilize the same or similar semiconducting material to construct a plurality of nanoribbons or one or more nanohole superlattices that have multiple band gaps. An advantage of using essentially the same material is that lattice constant matching is eliminated, which simplifies the fabrication process and thus reduces the manufacturing costs. Multiple band gaps for the plurality of nanoribbons is achieved in some embodiments by controlling or modifying nanoribbon width, thickness, edge state, doping or other parameters. In some embodiments, suitable nanoholes are implemented to tune the band gaps of nanoribbons. Similarly, multiple band gaps for the one or more nanohole superlattices can be achieved by controlling or modifying nanoholes patterned therein, thickness, edge state, doping or other parameters. Through optimization, the plurality of nanoribbons or the one or more nanohole superlattices are tuned to the predicted ideal multiple band gaps, resulting in a multiple band gap device that has an improved efficiency.

Effect of nanoribbon width. The band gaps of semiconducting graphitic nanoribbons change with the nanoribbon width. While not intended to be limited to any particular theory, it particular theory, it is believed that the band gap of a semiconducting graphene nanoribbon is inversely proportional to the nanoribbon width. Thus, for a single-layer bare-edge graphene nanoribbon, the calculated widths have been reported to be in the range of 1-2 nm for band gaps of 1.1~1.4 eV and 2~3 nm for 0.7 eV (See, Nano Letters 6(12), 2748-2754 (2006)). However, pure bare-edge graphene nanoribbons are seldom realized. More typically, there exists natural or induced "defects" that change the structure and the properties of nanoribbons. With regard to the band gap of a semiconducting graphene nanoribbon, these "defects" include crystallographic orientation, edge termination, and doping. For instance, doping has been observed to considerably increase the band gap of graphene (See, Inscience Journal 1(2), 80-89 (2011)).

Through doping, and/or variation of other factors, it is possible to produce nanoribbons that have a band gap between 0.1 eV and 2.2 eV at a nanoribbon width between 1 nm and 60 nm. Nanoribbons for the instant multiple band gap devices encompass this band gap range and nanoribbon width range.

Effect of nanoribbon thickness. Nanoribbon thickness affects the electronic structure of the semiconducting nanoribbons (See, Nano Today 5, 351-372 (2010) and Nature Materials 6(3):183-191, (2007)). In general, the band gap decreases with the increase of the number of layers.

Coupling with other factors, such as doping or variation of nanoribbon width, the instant multiple band gap devices comprise nanoribbons that contain a monolayer nanopatterned graphene, multilayer graphene sheets, or graphite with several hundreds of graphene sheets. Corresponding nanoribbon thickness is typically in between a nanometer to several micrometers.

Effect of edge state. Edge state can also affect the properties of nanoribbons. Graphene nanoribbons with zigzag edges have electronic characteristics different from a graphene nanoribbon with armchair edges. Zigzag edges provide the edge localized state with non-bonding molecular orbitals near the Fermi energy. Calculations based on tight binding predict that zigzag graphene nanoribbons are always metallic while armchair graphene nanoribbons can be either metallic or semiconducting, depending on their width. Calculations and experiments show that energy band gaps of semiconducting armchair nanoribbons increase with the decrease of nanoribbon width. Some recent reports indicate that zigzag nanoribbons are also semiconducting due to an unusual antiferromagnetic coupling between the magnetic moments at opposite edges. This behavior can be traced back to the spatial distribution properties of edge-state wave functions, and the mostly local character of the exchange interaction that originates the spin polarization. In addition, edge termination and/or anchoring with different atoms or molecules on edges also modify the properties of nanoribbons (See, Nano Today 5, 351-372 (2010)). For example, the edges of graphene nanoribbons can be terminated or anchored by carboxyl (COOH), carbonyl (COH), hydrogenated (CH) and amines ($NH_2$). Such edge terminations by attaching alien atoms or molecules can be considered as an effective doping.

Depending on the application and desired band gaps, the instant multiple band gap devices can comprise armchair nanoribbons, zigzag nanoribbons, or a combination of both. The edges of the nanoribbons can also be terminated with different atoms or molecules, at different concentrations, or different penetrations. The edge terminations can also coupled with variations of other factors to optimize the band gaps.

Effect of doping. Doping allows for the modification of the band structure and the expansion of the possible band gaps that graphene or graphite can adopt (See, Inscience Journal 1(2), 80-89 (2011) and Nano Today 5, 351-372 (2010)). Graphene doping can be roughly classified into three categories: (i) hetero atom doping, (ii) chemical modification, and (iii) electrostatic field tuning. In hetero atom doping, boron (B), nitrogen (N) and bismuth (Bi) doping has been reported. For instance, N-doping in graphene nanoribbons has been achieved by chemical vapor deposition, through electrothermal reaction with $NH_3$ or through $NH_3$ annealing after $N^+$-ion irradiation (See, Science 324 (5928), 768-771 (2009) and Journal of the American Chemical Society 131(43), 15939-1594 (2009)). In addition, fluorine (F) doping has been reported (See, Nano Letters 10(8), 3001, (2010)). In chemical modification, nitrogen dioxide ($NO_2$) and ammonia ($NH_3$) have been used and generation of opposite charge carriers has been confirmed. In electrostatic field tuning, modification of the properties of graphene is achieved by controlling the reversible charges of carrier concentration and the Fermi level without increasing the level of disorders and defects in graphene. Furthermore, the doping concentration and gradient can be controlled by tuning the specific conditions of doping processes.

Since there exists a variety of dopants and doping can be accomplished at different concentrations or with different gradients, it is believed that the band gap in between 0.1 eV to 2.2 eV can be realized for a semiconducting graphene nanoribbon. The instant multiple band gap devices typically comprise nanoribbons that have band gaps within this range.

Effect of nanoholes. Nanoholes play an important role in determining the electronic properties of nanohole superlattices. Band gaps of such superlattices depends on the structural features of the nanohole superlattice, including the nanohole size, nanohole shape, and nanohole density. Nanohole density is defined as the number of nanoholes patterned over a unit surface area of the layered crystalline material. Although not intending to be bound by any particular theory, a tight-binding model reveals that band gaps of graphene nanohole superlattices increase linearly with the product of nanohole size and density (See, Physical Review B 80, 233405 (2009)). It has been reported that a substantial band gap, about 0.435 eV, opens up at Fermi level. Information on nanohole superlattices can be also found in Nano Letters 10, 1125-1131 (2010) and Nano Research 1, 56-62 (2008).

As noted above, nanohole superlattices may be considered as a two-dimensional network of crossing nanoribbons. Thus in general, the band gaps of nanohole superlattices are expected to increase with the decreasing nanoribbon width due to stronger quantum-confinement. Within a nanohole superlattice, the characteristic nanoribbon width can be decreased by increasing the size of nanoholes or the number of nanoholes at a fixed size of superlattice. The characteristic nanoribbon width can also be decreased by decreasing the size of superlattice while retaining the size of nanoholes and the number of nanoholes. Again, not intending to be bound by any particular theory, a tight-binding model confirms that band gaps of graphene nanohole superlattices increase due to the finite-size effect of nanoribbon crossing network (See, Physical Review B 80, 233405 (2009)) and band gaps of graphene nanohole superlattices can span a wide range from 0 eV to about 2.5 eV (See, Nano Research 1, 56-62 (2008).

Similar to nanoribbons, the band gaps of nanohole superlattices can be further tuned by variations of its thickness, by doping or by modification of other parameters. Thus, incorporating nanohole superlattices with different size, shape, density, or with variation of other parameters make it possible to develop a device that can absorb or emit light efficiently across the desired wavelength spectrum.

Other factors. There are other ways to modify the band structure and change the band gap of graphene (See, Inscience Journal 1(2), 80-89 (2011)). These methods include using contacts between graphene and metals, applying strain to graphene and biasing bilayer graphene.

6.3.3. Vertically Stacked Architecture Using Semiconducting Nanoribbons

Now turning to FIGS. 3-7, an exemplary embodiment of a multiple band gap device 100 in accordance with the present disclosure using semiconducting nanoribbons is disclosed. Referring first to FIGS. 3 and 6, FIG. 3 depicts a top view of the exemplary embodiment and FIG. 6 illustrates a cross-section view of FIG. 3 taken about line 6-6' of FIG. 3. In the embodiment, the multiple band gap device comprises a plurality of stacks (104-1, 104-2, . . . 104-N) that are in electrical communication with a first lead 106 and a second lead 108.

The plurality of stacks is lengthwise arranged on a substrate 102, more specifically on a surface 114 of the substrate 102, with each stack in the plurality of stacks occupying a different portion of the substrate. The substrate serves as a support for the multiple band gap devices. It is typically planar and can be either rigid or flexible. In some embodiments, the substrate 102 is made of aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass. In some embodiments, the substrate 102 is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

Each stack in the plurality of stacks comprises a plurality of semiconducting nanoribbons and an optically transparent insulator in between two adjacent nanoribbon layers. In some embodiments, each stack in the plurality of stacks comprises two nanoribbons, whereas in other embodiments, each stack in the plurality of stacks comprises three nanoribbons. In yet other embodiments, each stack in the plurality of stacks comprises more than three nanoribbons. In still yet other embodiments, the number of nanoribbons comprised by some stacks in the plurality of stacks may be different from the number of nanoribbons comprised by other stacks in the plurality of stacks. For example, some stacks in the plurality of stacks may comprise two nanoribbons while other stacks in the plurality of stacks may comprise three or more nanoribbons.

By way of illustration, FIG. 6 depicts a stack with three nanoribbons including the first nanoribbon 110-1, the second nanoribbon 110-2, and the third nanoribbon 110-3. Each of these three nanoribbons is in intimate contact with the first lead 106 at one end as indicated by 116-1, 116-2, and 116-3 and in intimate contact with the second lead 108 as indicated by 118-1, 118-2, and 118-3. Collectively, elements 116-1, 116-2 and 116-3 define the first end of the stack while elements 118-1, 118-2 and 118-3 define the second end of the stack. The intimate contacts of the nanoribbons' ends with the leads are also depicted in FIG. 5, which shows a cross-sectional view of FIG. 3 taken about line 5-5'. The distance L between the first lead and the second lead, as shown in FIG. 6, defines the length of the stack.

The first lead 106 and the second lead 108 are made of electrically conducting materials, typically metals. Suitable materials for making the electrically conductive leads include titanium (Ti), niobium (Nb), zinc (Zn), chromium (Cr), silver (Ag), aluminum (Al), cobalt (Co), palladium (Pd), copper (Cu), platinum (Pt), and gold (Au). Ti and Pd are preferable for graphitic nanoribbons. In some embodiments, the first lead 106 is in intimate contact with the first end of each stack in the plurality of stacks, serving as one common lead. Likewise, the second lead is in intimate contact with the second end of each stack in the plurality of stacks, severing as another common lead.

For embodiments with each stack having two nanoribbons, the first nanoribbon 110-1 is overlaid on the substrate surface 114, then a first optically transparent insulator 112-1 overlaying the first nanoribbon, followed by the second nanoribbon 110-2 overlaying the first insulator 112-1. The first nanoribbon is characterized by a first band gap and the second nanoribbon is characterized by a second band gap, where the first band gap is smaller than the second band gap. The first band gap can be tuned to a desired value by varying the width, thickness or edge state of the first nanoribbon, by doping the first nanoribbon, or by modifying the combination of these parameters. Similarly, the second band gap can be tuned to another desired value.

For embodiments with each stack having three or more nanoribbons, similar structure can be employed by overlaying a layer of nanoribbon and a layer of optically transparent insulator alternatively on top of each other. For instance, to make a stack with three nanoribbons, a second optically transparent insulator 112-2 can be overlaid on the second nanoribbon 110-2, and a third nanoribbon 110-3 overlaid on the second insulator, as shown in FIG. 6. The third nanoribbon is characterized by a third band gap, which is larger than the second band gap of the second nanoribbon.

The optically transparent insulator (e.g. 112-1, 112-2) inbetween two adjacent nanoribbon layers electrically separates one nanoribbon layer from the other. The insulator is configured to have a band gap larger than the band gaps of the nanoribbons beneath it, so that the insulator is optically transparent to photons that can be absorbed or emitted by the nanoribbons below. In some embodiments, the optically transparent insulator is made of a glass, such as aluminosilicate glass, borosilicate glass, dichroic glass, germanium/semiconductor glass, glass ceramic, silicate/fused silica glass, soda lime glass, quartz glass, chalcogenide/sulphide glass, fluoride glass, flint glass, or cereated glass. In some embodiments, the optically transparent insulator is made of a urethane polymer, an acrylic polymer, a fluoropolymer, a silicone, a silicone gel, an epoxy, a polyamide, or a polyolefin.

When exposed to light, the plurality of nanoribbons (e.g. 110-1, 110-2, 110-3) absorb photons and produces a current, a voltage or both, depending on the nature of the electrodes that flank the plurality of nanoribbons. The process is as follows. Photons with energy above the third band gap are absorbed by the third nanoribbon 110-3 whereas photons with energy below the third band gap of the third nanoribbon transmit to the second nanoribbon 110-2. Once in the second nanoribbon, photons with energy above the second band gap are absorbed by the second nanoribbon and photons with energy below the second band gap transmit to the first nanoribbon 110-1. The absorption and transmission process continues until photons with energy below the first band gap transmit to the substrate 102. Such configuration achieves a multiple band gap photovoltaic device or a multiple band gap photodetector.

When a multiple band gap device in accordance to the present disclosure is connected to an external current, a reverse process takes place. Electrons in the plurality of nanoribbons recombine with holes, emitting a light. The first nanoribbon 110-1 emits a light that has a lower energy than the second band gap. As a result, the second nanoribbon -2 appears to be optically transparent to the light emitted by the first nanoribbon. Since the third band gap is larger than the second band gap, the third nanoribbon 110-3 appears to be optically transparent to the light emitted by the first nanoribbon as well. Consequently, the light emitted by the first nanoribbon transmit all the way to the surface of the multiple band gap device. Likewise, the lights emitted by the second and third nanoribbons transmit to the outside. The lights emitted by the plurality of nanoribbons then interfere with each other and produce a hybrid light. Such a configuration produces a multiple band gap LED.

As mentioned in previous sections, band gaps of semiconducting nanoribbons can be tuned or controlled by varying their width, thickness, edge state, doping or combination of these and other factors. By way of illustration, FIG. 4 depicts a multiple band gap device in which each stack has three nanoribbons and desired band gap for each nanoribbon is achieved by the control of nanoribbon width W and/or thickness D. In this configuration, the first nanoribbon 110-1 is disposed at the bottom and characterized by a width larger than the widths of the second nanoribbon 110-2 and the third nanoribbon 110-3. The second nanoribbon is characterized by a width larger than the width of the third nanoribbon. As a result, the third nanoribbon on the top has the largest band gap among the three nanoribbons.

However, the third nanoribbon 110-3 on the top does not necessarily need to be the smallest. For example, in some embodiments, the third nanoribbon may be doped with B- N-, Bi- or F-atoms or molecules so that the third nanoribbon has a larger band gap than the second nanoribbon but have the same width as of the second nanoribbon or the same width as of the first nanoribbon. In other embodiments, the second nanoribbon may be doped as well, with different dopants or with the same dopants but at different concentration, so that all three nanoribbons have the same width.

Generally, the band gaps of the plurality of nanoribbons are tuned in between 0.1 eV to 2.2 eV. In some embodiments where each stack in the plurality of stacks comprises two nanoribbons, the first band gap is tuned and controlled in between 0.1 eV to 1.2 eV, in between 0.5 eV and 1.5 eV, or in between 0.8 eV and 1.8 eV; the second band gap in between 0.8 eV and 1.9 eV, or in between 1.2 eV and 2.2 eV, or in between 1.5 eV and 2.2 eV. In some embodiments where each stack in the plurality of stacks comprises three nanoribbons, the respective first band gaps are tuned and controlled in between 0.1 eV and 1.1 eV, in between 0.4 eV and 1.3 eV, or in between 0.6 eV and 1.5 eV; the second band gap in between 0.7 eV and 1.5 eV, between 1 eV and 1.7 eV, and in between 1.2 and 2.1 eV; the third band gap in between 1.4 eV to 2 eV, in between 1.5 eV to 2.1 eV, or in between 1.6 eV to 2.2 eV.

Typical widths of the nanoribbons for a multiple band gap device in accordance with the present disclosure are between 1 nm and 60 nm. In some embodiments where each stack in the plurality of stacks comprises two nanoribbons, the first nanoribbon may have a width between 20 nm and 50 nm and the second nanoribbon may have a width between 1 nm and 30 nm. In other embodiments where each stack comprises two nanoribbons, the first nanoribbon has a width between 30 nm and 40 nm while the second nanoribbon has a width between 10 nm and 20 nm. In some embodiments where each stack in the plurality of stacks comprises three nanoribbons, the first nanoribbon has a width that is between 25 nm and 50 nm, the second nanoribbon has a width that is between 15 nm to 40 nm, and the third nanoribbon has a width that is between 1 nm to 20 nm. In some embodiments, the first nanoribbon has a width that is between 30 nm and 45 nm, the second nanoribbon has a width that is between 20 nm to 30 nm, and the third nanoribbon has a width that is between 5 nm to 15 nm. In still some embodiments, the first and second nanoribbons, and/or the third nanoribbon, have the same width, for instance, 30 nm or 50 nm, but with different edge states or doped with different dopants or doped with the same dopant but at different concentration.

In some embodiments, a first nanoribbon has a band gap of between 0.1 eV and 1.0 eV, between 0.4 eV and 1.4 eV, between 0.6 eV and 1.8 eV, or between 0.8 eV and 2.2 eV. In some embodiments a first nanoribbon has a band gap between 0.1 eV and 0.4 eV, between 0.4 eV and 0.8 eV, between 0.8 eV and 1.2 eV, between 1.2 eV and 1.6 eV, between 1.6 eV and 2.0 eV or between 2.0 eV and 2.2 eV.

In some embodiments, a first nanoribbon has a width between 1 nm and 10 nm, between 10 nm and 20 nm, between 20 nm and 30 nm, between 30 nm and 40 nm, or between 40 nm and 50 nm.

In some embodiments, a first nanoribbon has a band gap of between 0.1 eV and 1.0 eV, between 0.4 eV and 1.4 eV, between 0.6 eV and 1.8 eV, or between 0.8 eV and 2.2 eV and a second nanoribbon has a band gap, different than the band gap of the first nanoribbon, in the range of between 0.1 eV and 1.0 eV, between 0.4 eV and 1.4 eV, between 0.6 eV and 1.8 eV, or between 0.8 eV and 2.2 eV. In some embodiments a first nanoribbon has a band gap between 0.1 eV and 0.4 eV, between 0.4 eV and 0.8 eV, between 0.8 eV and 1.2 eV, between 1.2 eV and 1.6 eV, between 1.6 eV and 2.0 eV or between 2.0 eV and 2.2 eV and a second nanoribbon has a band gap, different than the band gap of the first nanoribbon, in the range of between 1 nm and 10 nm, between 10 nm and 20 nm, between 20 nm and 30 nm, between 30 nm and 40 nm, or between 40 nm and 50 nm.

Band gaps for a multiple band gap photodetector in accordance with the present disclosure depend on the spectrum of the incident light that needs to be measured. If the spectrum of the incident light is within the infrared range, the band gaps of nanoribbons can be set at lower values, for instance, below 1.0 eV. Accordingly, in some embodiments nanoribbons have a width larger than 30 nm. On the other hand, nanoribbons must have larger band gaps, for instance, above 1.5 eV, if the spectrum of the incident light is within the ultraviolet range. Accordingly, in some embodiments nanoribbons have a width less than 20 nm. For measuring a spectral range within the visible light, in some embodiments, band gaps have the same values as a multiple band gap photovoltaic device. In applications where the spectrum of the incident light spans a broader range, for instance, from infrared to ultraviolet where a wavelength ranges inbetween 10 nm to 100 μm, each stack in the plurality of stacks may comprise more than three layers of nanoribbons, with each nanoribbon tuned to selectively absorb photons in a specifically targeted spectral range.

Similarly, for a multiple band gap LED in accordance with the present disclosure, the number of nanoribbons in a stack and the band gap for each nanoribbon depend on the application. For instance, if a white light is desired, in some embodiments the multiple band gap LED comprises a plurality of stacks, with each stack having three nanoribbons. The band gap of each nanoribbon is tuned and controlled so that the first nanoribbon at the bottom has the smallest band gap, the third nanoribbon on the top has the largest band gap, and the second nanoribbon in the middle has a band gap between the largest and smallest band gaps. Upon application of an electric source, the first, second, and third nanoribbons emit a red light, a green light, and a blue light, respectively. If in the right proportion, the red, green and blue lights collectively emit a white light thus creating a white light LED.

Although the plurality of stacks 104-1, 104-2, . . . 104-N illustrated in FIG. 4 and FIG. 5 seems to be identical, it is unnecessary. In some embodiments, each stack in the plurality of stacks is identical. In other embodiments, one stack in the plurality of stacks is different from another stack in the plurality of stacks. For instance, the first band gap of the first nanoribbon 110-1 of stack 104-1 in the plurality of stacks has a different band gap than the first band gap of the first nanoribbon 110-1 of stack 104-3. The second band gap of the second nanoribbon 110-2 of stack 104-1 in the plurality of stacks has a different band gap than the second band gap of the second nanoribbon 110-2 of stack 104-3. In other embodiments, the difference among the plurality of stacks take place in terms of other characteristics, such as nanoribbon width, thickness, edge state, dopants, doping concentration, or doping gradient. In yet other embodiments, the difference among the plurality of stacks arises in terms of the length or the number of nanoribbons that each stack may have. In still yet other embodiments, the difference among the plurality of stacks occurs because the semiconducting material used for one stack is different from the semiconducting material used for another stack. In some embodiments, a stack, for instance the stack 104-1, is different from stack 104-2, which in turn is different from 104-3. In other embodiments, some stacks have optimal band gaps different from other stacks, targeting different spectral ranges. In such configurations, care is taken so that nanoribbons within each stack are stacked in order based on the band gaps, with the top nanoribbon having the largest band gap and the bottom nanoribbon having the smallest band gap.

The thickness D of a nanoribbon, as indicated in FIGS. 4 and 5, can have a wide range spanning from nanometers to micrometers, corresponding to a nanoribbon that contains a monolayer nanopatterned graphene sheet to several hundreds of graphene sheets. In some embodiments, a nanoribbon comprises between 1 and 300 graphene nanoribbon sheets. In some embodiments, a nanoribbon comprises between 100 and 300 graphene nanoribbon sheets.

As indicated by L in FIG. 6, the length of the nanoribbons is defined by the distance between the first lead and the second lead. Taking advantage of large mean free path of the nanoribbon, the length of the nanoribbons in the plurality of stacks in accordance with the present disclosure is typically in the range of a few micrometers to several hundreds of micrometers. In some embodiments, length L is inbetween 1 μm and 100 μm.

A typical multiple band gap device in accordance with the present disclosure includes billions (or even trillions) of nanoribbons, depending on the density and dimensions of the plurality of stacks. It is possible to design a multiple band gap device having a stack density between $10^6$ to $10^{12}$ stacks/cm², with each stack can have two or more nanoribbons.

Optionally, the top nanoribbon or a portion of the top nanoribbon in each stack or in some stacks is coated with an antireflection layer 120, as shown in FIG. 7. The anti-reflection layer is typically made of dielectric materials, such as $SiO_2$ and $TiO_2$. In other embodiments it is made of semiconducting materials, such as InGaAs. The semiconducting material used for the coating, however, should have a band gap larger than the band gap of the top nanoribbon so that it is optically transparent to photons within the targeted wavelength range. Alternatively, doping is utilized to open up the band gap of a semiconducting material for use as the antireflection coating.

Typically, the antireflection layer has a thickness in the range of tens to thousands of nanometers. For a photovoltaic device or a photodetector in accordance to the present disclosure, the thickness of the anti-reflection layer may be selected and controlled to be one quarter of the wavelength of the incoming wave. As such, the wave reflected from the top surface of the anti-reflection layer destructively interferes with the wave reflected from the nanoribbon surfaces, resulting in zero net reflected energy and hence all light transmitted into the nanoribbons. Similarly, the thickness of the antireflection layer for a light emitting device in accordance to the present disclosure may be selected and controlled so that all light emitted from the nanoribbons are transmitted out of the nanoribbons and the anti-reflection layer. To take the advantage of wave destructive and constructive interferences, more than one layer of antireflection coating may be employed to further increase the efficiency of the devices.

6.3.4. Laterally Spaced Architecture Using Semiconducting Nanoribbons

Now turning to FIGS. 8-11, FIGS. 8-11 depict an exemplary embodiment 300, in lateral architecture, of a multiple band gap device in accordance with the present disclosure using semiconducting nanoribbons. FIG. 8 illustrates a top view of the exemplary embodiment while FIGS. 6, 7 and 8 provide cross-sectional views of FIG. 8 taken about line 6-6', 7-7' and 8-8', respectively. In some embodiments, the multiple band gap device 300 comprises a plurality of semiconducting nanoribbons (304-1, 304-2, ... 304-N), with each nanoribbon in electrical communication with a first lead 106 and a second lead 108. The multiple band gap device further comprises an optical splitter 310 that is in optical communication with the plurality of nanoribbons, if the multiple band gap device is a photovoltaic device or a photodetector. A multiple band gap LED in accordance with the present disclosure, however, does not need an optical splitter.

The plurality of semiconducting nanoribbons (304-1, 304-2, ... 304-N) is lengthwise arranged on a substrate 102, more specifically on the surface 114 of the substrate 102, with each nanoribbon in the plurality of nanoribbons spatially separated from each other. As in the vertically stacked architecture, the substrate is typically planar, either rigid or flexible, and can be made of the same materials as described in the previous section.

To make a multiple band gap device, some nanoribbons in the plurality of semiconducting nanoribbons have a different band gap than other nanoribbons in the plurality of semiconducting nanoribbons. Different band gaps can be achieved by using different materials or by tuning the nanoribbon width, thickness, edge state, doping or other factors. By way of illustration, FIGS. 8-11 depict an embodiment where the different bad gaps are achieved by varying the nanoribbon width, or by varying the nanoribbon width along with other factors. For instance, both width and thickness of nanoribbon 304-1 are different from those of nanoribbon 304-3. However, variation of width and/or thickness can be considered as a representative for turning the band gap. Other factors may be used to modify the band gap without changing the nanoribbon width and/or thickness.

As shown in FIGS. 8-10, nanoribbon 304-3 has a width that is wider than nanoribbon 304-2, which in turn has a width that is wider than nanoribbon 304-1. This represents embodiments where nanoribbon 304-3 has a band gap smaller than nanoribbon 304-2, and nanoribbon 304-2 has a band gap smaller than nanoribbon 304-1. Accordingly, nanoribbon 304-3 absorbs or emits photons that have longer wavelengths than nanoribbon 304-2, and nanoribbon 304-2 absorbs or emits photons that have longer wavelengths than nanoribbon 304-1.

Similar to the vertically stacked architecture described in the previous section, each nanoribbon in the plurality of nanoribbons is defined by a first end 316, a second 318 and a length L, as illustrated in FIG. 11. In some embodiments, the first end 316 of each nanoribbon in the plurality of nanoribbons is in intimate contact with the first lead 106, thus forming a common lead. The second end 318 of each nanoribbon in the plurality of nanoribbons is in intimate contact with the second lead 108, thus forming another common lead.

Referring to FIG. 9, a multiple band gap device 300 in accordance with the present disclosure further comprises an optical splitter 310, when used as a multiple band gap photovoltaic device or a multiple band gap photodetector. The optical splitter 310 splits an incident light into different wavelength bands and directs the different wavelength bands to corresponding nanoribbons. Based on the application, the optical splitter is a simple optic such as a prism or a spectrally selective system that splits an incident light into specifically targeted wavelength ranges. In some embodiments, the optical splitter is placed directly above the plurality of nanoribbons. In other embodiments, the optical splitter is disposed in a distance away from the plurality of nanoribbons. In yet other embodiments, the optical splitter is tilted and forms an angle with respect to the normal surface of the plurality of nanoribbons.

In some embodiments, where two wavelength ranges are targeted, the plurality of nanoribbons is divided into two groups. Each group includes at least one nanoribbon, and nanoribbons in one group having a different band gap from the other group. For instance, a first group has a band gap smaller than a second group. In such a configuration, the optical splitter 310 splits an incident light into two different wavelength bands, with the first wavelength band characterized by at least one wavelength that is greater than the wavelengths in the second wavelength band. The optical splitter then directs the first light wavelength band to the first group and the second wavelength band to the second group.

In some embodiments where three wavelength ranges are targeted, the plurality of nanoribbons is divided into three groups, with nanoribbons in each group having a different band gap from the other two groups. For example, a first group has a band gap smaller than a second group, which in turn has a band gap smaller than a third group. Accordingly, the optical splitter splits an incident light into three wavelength bands. A first wavelength band in the three wavelength bands is characterized by at least one wavelength that is greater than the wavelengths in a second wavelength band in the three wavelength bands; and the second wavelength band is characterized by at least one wavelength that is greater than the wavelengths in a third wavelength band in the three wavelength bands. In such embodiments, the optical splitter directs the three wavelength bands to corresponding nanoribbon groups.

In some embodiments, a multiple band gap light emitting diode in accordance with the present disclosure is configured so that no optical splitter is needed for combining a light from different wavelength bands emitted from the plurality of nanoribbons. In such a configuration, nanoribbons having different band gaps are placed near to each other. Since the dimension of nanoribbons or a group of nanoribbons is in the micrometer range, emission from these nanoribbons is indistinguishable by human eyes. Collectively, a multiple band gap LED in accordance with the present disclosure emits a light comprising multiple wavelength bands. For instance, in some embodiments, some nanoribbons emit a red light, some emit a green light, and others emit a blue light. In combination, the multiple band gap LED appears to emit a white light to human eyes. In other embodiments, a multiple band gap LED in accordance with the present disclosure may comprise an optical splitter 310 to combine the lights from different wavelength bands for desired applications.

Except for the fact that they are laid out side by side next to each other, laterally spaced nanoribbons are substantially the same as those of vertically stacked nanoribbons described in the previous sections. For instance, nanoribbons can be made of the same materials using the same nanopatterning processes, and have substantially the same dimensions including width, length, and thickness. That is, laterally spaced nanoribbons in general have a width in between 1 nm and 60 nm, and a multiple band gap device that comprises a plurality of laterally spaced nanoribbons typically has a nanoribbon density between $10^6$ to $10^{12}$ nanoribbons/cm². In addition, parameters described in the previous sections, including ranges of the band gap, are applicable for laterally spaced nanoribbons and for a multiple band gap device that comprises a plurality of laterally spaced nanoribbons.

Similar to the vertically stacked architecture, a laterally spaced multiple band gap device may optionally include an antireflection layer 320 as shown in FIG. 11. Antireflection layer 320 overlays all or a portion of each nanoribbon in the plurality of nanoribbons, and has essentially the same dimensions as of antireflection layer 120 described in previous sections. In addition, antireflection layer 320 can be made of the same materials as of antireflection layer 120.

6.3.5. Architecture Using Semiconducting Nanohole Superlattices

Similar to nanoribbons, the one or more nanohole superlattices may be arranged vertically by stacking one on top of another or arranged laterally by placing one next to another side by side. In some embodiments, the architecture of devices having semiconducting nanohole superlattices is essentially the same as those described above when using nanoribbons, whether it is vertically stacked or lateral spaced. In fact, all the structures, parameters, figures, materials, etc. described above for nanoribbons can be easily modified to describe the architectures, parameters, figures, materials, etc for nanohole superlattices by simply replacing nanoribbons with nanohole superlattices. Other optional features, such as antireflection layer and optical splitter, can be incorporated in essentially the same way into the architectures using semiconducting nanohole superlattices.

As an example to illustrate the similarity, a vertically stacked structure using semiconducting nanohole superlattices includes a substrate and a nanohole superlattice stack defined by a first edge and a second edge. The nanohole superlattice stack comprises a plurality of nanohole superlattices, including (1) a first nanohole superlattice in the plurality of nanohole superlattices characterized by a first band gap range and patterned with a first array of nanoholes, and the first nanohole superlattice overlaying the substrate, (2) a first optically transparent insulator overlaying the first nanohole superlattice, and (3) a second nanohole superlattice in the plurality of nanohole superlattices characterized by a second band gap range and patterned with a second array of nanoholes, and the second nanohole superlattice overlaying the first insulator. The first band gap range is characterized by at least one band gap within the first band gap range that is smaller than band gaps within the second band gap range. In addition, the vertically stacked structure using semiconducting nanohole superlattices includes a first lead electrically contacting the first edge of the nanohole superlattice stack, and a second lead electrically contacting the second edge of the nanohole superlattice stack.

In some embodiments, a nanohole superlattice in the plurality of nanohole superlattices has a characteristic dimension that is in between 1 µm and 10 mm. In some embodiments, the characteristic dimension of a nanohole superlattice is between 50 µm and 500 µm, or between 100 µm and 300 µm. In some embodiments, a nanohole in the array of nanoholes patterned in a nanohole superlattice in the plurality of nanohole superlattices has a characteristic dimension that is less than 5000 nm. In some embodiments, a nanohole in the array of nanoholes has a characteristic dimension that is less than 1000 nm, less than 500 nm, less than 100 nm, or less than 50 nm. In some embodiments, a nanohole superlattice in the plurality of nanohole superlattices has a nanohole density that is in between 1 nanohole/µm² and 106 nanoholes/µm², while in other embodiments, a nanohole superlattice in the plurality of nanohole superlattices has a nanohole density that is in between 10 nanoholes/µm² and $10^5$ nanoholes/µm², or between 100 nanoholes/µm² and $10^4$ nanoholes/µm².

In some embodiments, a first junction between the first lead and the first edge of the nanohole superlattice stack may form a Schottky barrier with respect to a carrier while the second junction between the second lead and the second edge of the nanohole superlattice stack either forms no Schottky barrier at all with respect to the carrier or forms a smaller Schottky barrier for the carrier, where the carrier is either electrons or wholes. Electrically connecting the first lead and the second lead to a selective circuit produces a multiple band gap photovoltaic device, a multiple band gap photodetector, or a multiple band gap light emitting diode.

Some devices in accordance with the present disclosure comprise a nanohole superlattice device having a plurality of nanohole superlattices stacked on top of each other, the device having a first edge and a second edge. The first edge is in electrical communication with a first lead and the second edge is in electrical communication with a second lead. The device is arranged on a substrate, more specifically on a surface of the substrate. The substrate serves as a support for the device. The substrate is typically planar and can be either rigid or flexible. In some embodiments, the substrate is made of aluminosilicate glass, borosilicate glass, dichroic glass, germanium/semiconductor glass, glass ceramic, silicate/ fused silica glass, soda lime glass, quartz glass, chalcogenide/ sulphide glass, fluoride glass, a glass-based phenolic, flint glass, or cereated glass. In some embodiments, the substrate is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrilebutadiene-styrene, polytetrafluoro-ethylene, polymethacrylate, nylon 6,6, cellulose acetate butyrate, cellulose acetate, rigid vinyl, plasticized vinyl, or polypropylene.

The device comprises a plurality of nanohole superlattices and an optically transparent insulator in between adjacent nanohole superlattices. In some embodiments, the nanohole superlattice device comprises two nanohole superlattices, whereas in other embodiments, the nanohole superlattice device comprises three nanohole superlattices. In yet other embodiments, the nanohole superlattice device comprises more than three nanohole superlattices.

By way of illustration, FIG. 20 depicts a nanohole superlattice device with three nanohole superlattices including the first nanohole superlattice 110-1, the second nanohole superlattice 110-2, and the third nanohole superlattice 110-3. Each of these three nanohole superlattices is in electrical contact with the first lead 106 at one end as indicated by elements 116-1, 116-2, 116-3 and in electrical contact with the second lead 108 as indicated by elements 118-1, 118-2, 118-3 in FIG. 20. Collectively, elements 116-1, 116-2 and 116-3 define the first end of the nanohole superlattice stack while elements 118-1, 118-2 and 118-3 define the second end of the nanohole superlattice stack.

The first lead 106 and the second lead 108 are made of electrically conducting materials, typically metals. Suitable materials for making the electrically conductive leads include titanium (Ti), niobium (Nb), zinc (Zn), chromium (Cr), silver (Ag), aluminum (Al), cobalt (Co), palladium (Pd), copper (Cu), platinum (Pt), and gold (Au). Ti and Pd are preferable for graphitic nanohole superlattices. In some embodiments, the first lead 106 is in intimate contact with the first end of the device, serving as one common lead. Likewise, the second lead is in intimate contact with the second end of the device, severing as another common lead.

For embodiments in which the stack has two nanohole superlattices, the first nanohole superlattice 110-1 is overlaid on the substrate 102 surface, then a first optically transparent insulator 2012-1 overlays the first nanohole superlattice 110-1, followed by the second nanohole superlattice 110-2 overlaying the first insulator 2012-1. The first nanohole superlattice 110-1 is characterized by a first band gap and the second nanohole superlattice 110-2 is characterized by a second band gap, where the first band gap is smaller than the second band gap. The first band gap can be tuned to a desired value. Similarly, the second band gap can be tuned to another desired value.

For embodiments in which the stack has three or more nanohole superlattices, similar structure can be employed by overlaying a nanohole superlattice and a layer of optically transparent insulator alternatively on top of each other. For instance, to make a stack with three nanohole superlattice, a second optically transparent insulator 2012-2 can be overlaid on the second nanohole superlattice 110-2, and a third nanohole superlattice 110-3 overlaid on the second insulator 2012-2, as shown in FIG. 20. The third nanohole superlattice 110-3 is characterized by a third band gap, which is larger than the second band gap of the second nanohole superlattice 110-2.

Optically transparent insulator (e.g. 2012-1, 2012-2) in between two adjacent nanohole superlattice electrically separates one nanohole superlattice from the other. The insulator is configured to have a band gap larger than the band gaps of the nanohole superlattice beneath it, so that the insulator is optically transparent to photons that can be absorbed or emitted by the nanohole superlattice below. In some embodiments, optically transparent insulator is made of a glass, such as aluminosilicate glass, borosilicate glass, dichroic glass, germanium/semiconductor glass, glass ceramic, silicate/fused silica glass, soda lime glass, quartz glass, chalcogenide/sulphide glass, fluoride glass, flint glass, or cereated glass. In some embodiments, optically transparent insulator is made of a urethane polymer, an acrylic polymer, a fluoropolymer, a silicone, a silicone gel, an epoxy, a polyamide, or a polyolefin.

When exposed to light, the plurality of nanohole superlattices (e.g. 110-1, 110-2, 110-3) absorb photons and produce a current, a voltage or both, depending on the nature of the electrodes that flank the plurality of nanohole superlattices. The process is as follows. Photons with energy above the third band gap are absorbed by the third nanohole superlattice 110-3 whereas photons with energy below the third band gap of the third nanohole superlattice transmit to the second nanohole superlattice 110-2. Once in the second nanohole superlattice, photons with energy above the second band gap are absorbed by the second nanohole superlattice and photons with energy below the second band gap transmit to the first nanohole superlattice 110-1. The absorption and transmission process continues until photons with energy below the first band gap transmit to the substrate 102. Such configuration achieves a multiple band gap photovoltaic device or a multiple band gap photodetector.

When a multiple band gap device in accordance to the present disclosure is connected to an external current, a reverse process takes place. Electrons in the plurality of nanohole superlattice recombine with holes, emitting a light. The first nanohole superlattice 110-1 emits a light that has a lower energy than the second band gap. As a result, the second nanohole superlattice 110-2 appears to be optically transparent to the light emitted by the first nanohole superlattice. Since the third band gap is larger than the second band gap, the third nanohole superlattice 110-3 appears to be optically transparent to the light emitted by the first nanohole superlattice as well. Consequently, the light emitted by the first nanohole superlattice transmits all the way to the surface of the multiple band gap device. Likewise, the lights emitted by the second and third nanohole superlattice transmit to the outside. The lights emitted by the plurality of nanohole superlattice then interfere with each other and produce a hybrid light. Such a configuration produces a multiple band gap LED.

Generally, the band gaps of the nanohole superlattices are tuned in between 0.1 eV to 2.2 eV. In some embodiments where a nanohole superlattice stack comprises two nanohole superlattice, the first band gap is tuned and controlled to be between 0.1 eV to 1.2 eV, between 0.5 eV and 1.5 eV, or between 0.8 eV and 1.8 eV; the second band gap is configured to be between 0.8 eV and 1.9 eV, or between 1.2 eV and 2.2 eV, or between 1.5 eV and 2.2 eV. In some embodiments where a nanohole superlattice stack comprises three nanohole superlattices, the first band gap is tuned and controlled to be between 0.1 eV and 1.1 eV, between 0.4 eV and 1.3 eV, or between 0.6 eV and 1.5 eV; the second band gap is configured to be between 0.7 eV and 1.5 eV, between 1 eV and 1.7 eV, or between 1.2 and 2.1 eV; and the third band gap is configured to be between 1.4 eV to 2 eV, between 1.5 eV to 2.1 eV, or between 1.6 eV to 2.2 eV.

In some embodiments, a first nanohole superlattice has a band gap of between 0.1 eV and 1.0 eV, between 0.4 eV and 1.4 eV, between 0.6 eV and 1.8 eV, or between 0.8 eV and 2.2 eV. In some embodiments a first nanohole superlattice has a band gap between 0.1 eV and 0.4 eV, between 0.4 eV and 0.8 eV, between 0.8 eV and 1.2 eV, between 1.2 eV and 1.6 eV, between 1.6 eV and 2.0 eV or between 2.0 eV and 2.2 eV.

In some embodiments, a first nanohole superlattice has a band gap of between 0.1 eV and 1.0 eV, between 0.4 eV and 1.4 eV, between 0.6 eV and 1.8 eV, or between 0.8 eV and 2.2 eV and a second nanohole superlattice has a band gap, different than the band gap of the first nanohole superlattice, in the range of between 0.1 eV and 1.0 eV, between 0.4 eV and 1.4 eV, between 0.6 eV and 1.8 eV, or between 0.8 eV and 2.2 eV. In some embodiments a first nanohole superlattice has a band gap between 0.1 eV and 0.4 eV, between 0.4 eV and 0.8 eV, between 0.8 eV and 1.2 eV, between 1.2 eV and 1.6 eV, between 1.6 eV and 2.0 eV or between 2.0 eV and 2.2 eV and a second nanohole superlattice has a band gap, different than the band gap of the first nanohole superlattice, in the range of between 1 nm and 10 nm, between 10 nm and 20 nm, between 20 nm and 30 nm, between 30 nm and 40 nm, or between 40 nm and 50 nm.

Band gaps for a multiple band gap photodetector in accordance with the present disclosure depend on the spectrum of the incident light that needs to be measured. If the spectrum of the incident light is within the infrared range, the band gaps of the nanohole superlattice stack can be set at lower values, for instance, below 1.0 eV. On the other hand, nanohole superlattices must have larger band gaps, for instance, above 1.5 eV, if the spectrum of the incident light is within the ultraviolet range. For measuring a spectral range within the visible light, band gaps may have the same values as a multiple band gap photovoltaic device. In applications where the spectrum of the incident light spans a broader range, for instance, from infrared to ultraviolet where a wavelength ranges in between 10 nm to 100 μm, a nanohole superlattice stack may comprise more than three layers of nanohole superlattices, with each nanohole superlattice tuned to selectively absorb photons in a specifically targeted spectral range.

Similarly, for a multiple band gap LED in accordance with the present disclosure, the number of nanohole superlattices in a stack and the band gap for each nanohole superlattice is application dependent. For instance, if a white light is desired, the multiple band gap LED may comprise a plurality of nanohole superlattice stacks, with each nanohole superlattice stack having three nanohole superlattices. The band gaps of each nanohole superlattice is tuned and controlled so that the first nanohole superlattice at the bottom has the smallest band gap, the third nanohole superlattice on the top has the largest band gap, and the second nanohole superlattice in the middle has a band gap between the largest and smallest band gaps. Upon application of an electric source, the first, second, and third nanohole superlattice emit a red light, a green light, and a blue light, respectively. If in the right proportion, the red, green and blue lights collectively emit a white light thus creating a white light LED.

A plurality of nanohole superlattice stacks may be arranged on a substrate. In some embodiments, each nanohole superlattice stack in the plurality of nanohole superlattice stacks is identical. In other embodiments, a first stack in the plurality of nanohole superlattice stacks is different from a second nanohole superlattice stack in the plurality of nanohole superlattice stacks. For instance, the first band gap of the first nanohole superlattice 110-1 of the first nanohole superlattice stack may have a different band gap than the first band gap of the first nanohole superlattice 110-1 of the second nanohole superlattice stack. The second band gap of the second nanohole superlattice 110-2 of the first nanohole superlattice stack may have a different band gap than the second band gap of the second nanohole superlattice 110-2 of the second nanohole superlattice stack. In other embodiments, the difference among the plurality of stacks may take place in terms of other characteristics, such as nanohole superlattice thickness, edge state, dopants, doping concentration, or doping gradient. In still yet other embodiments, the difference among the plurality of nanohole superlattice stacks may occur because the semiconducting material used for one nanohole superlattice stack is different from the semiconducting material used for another nanohole superlattice stack. In some embodiments, some nanohole superlattice stacks may have optimal band gaps different from other stacks, targeting different spectral ranges. In such configurations, care is taken so that nanohole superlattices within each stack are stacked in order based on the band gaps, with the top nanohole superlattice having the largest band gap and the bottom nanohole superlattice having the smallest band gap.

The thickness of a nanohole superlattice can have a wide range spanning from nanometers to micrometers, corresponding to a nanohole superlattice that contains a monolayer graphene nanohole superlattice sheet to several hundred graphene nanohole superlattice sheets. In some embodiments, a nanohole superlattice comprises between 1 and 300 graphene nanohole superlattice sheets. In some embodiments, a nanohole superlattice comprises between 100 and 300 graphene nanohole superlattice sheets.

Optionally, the top nanohole superlattice or a portion of the top nanohole superlattice in each stack or in some stacks can be coated with an antireflection layer. The anti-reflection layer is typically made of dielectric materials, such as $SiO_2$ and $TiO_2$, but it can also be made of semiconducting materials, such as InGaAs. The semiconducting material used for the coating, however, should have a band gap larger than the band gap of the top nanohole superlattice so that it is optically transparent to photons within the targeted wavelength range. Alternatively, doping may be utilized to open up the band gap of a semiconducting material for use as the antireflection coating.

Typically, the antireflection layer has a thickness in the range of tens to thousands of nanometers. For a photovoltaic device or a photodetector in accordance to the present disclosure, the thickness of the anti-reflection layer may be selected and controlled to be one quarter of the wavelength of the incoming wave. As such, the wave reflected from the top surface of the anti-reflection layer destructively interferes with the wave reflected from the nanohole superlattice surfaces, resulting in zero net reflected energy and hence all light transmitted into the nanohole superlattice. Similarly, the thickness of the anti-reflection layer for a light emitting device in accordance to the present disclosure may be selected and controlled so that all light emitted from the nanohole superlattice are transmitted out of the nanohole superlattice and the anti-reflection layer. To take the advantage of wave destructive and constructive interferences, more than one layer of antireflection coating may be employed to further increase the efficiency of the devices.

In some embodiments, however, the architecture using semiconducting nanohole superlattices may comprise only one single nanohole superlattice. This is different from the architectures using nanoribbons, which require a plurality of nanoribbons to provide multiple band gaps. Unlike an individual nanohole superlattice with a restricted band gap at or near a band gap value, a single nanohole superlattice can have multiple band gaps or a band gap range because it is equivalent to a crossing network of a plurality of nanoribbons. By control of nanohole size, shape, density, and/or other parameters, one single nanohole superlattice can have multiple band gaps spanning a broad range, for example, from 0.1 eV to 2.2 eV. Likewise, by control of nanohole size, shape, and/or density, a nanohole superlattice can be tuned to a specific band gap value. To control the band gaps, a single nanohole superlattice can be selectively patterned with triangles, rectangles, hexagons, rhombuses, etc., or any combination thereof. The band gaps of the nanohole superlattice can be further tuned by variations of its thickness or doping.

As an example, FIG. 19 depicts a schematic top view of a multiple band gap device comprising a nanohole superlattice 130 in accordance with an aspect of the present disclosure. The same as embodiments comprising nanoribbons, the nanohole superlattice is disposed on a substrate 102. There are also two leads, the first lead 106 and the second lead 108, electrically contacting two opposite edges of the nanohole superlattice. Patterned within the nanohole superlattice is an array of rectangular nanoholes 134. By way of illustration, rectangular nanoholes 134 depicted in FIG. 19 have different sizes and spacing, rendering the analogous nanoribbons within the nanohole superlattice 130 having different widths. Thus the nanohole superlattice 130 is expected to have multiple band gaps.

Depending on the application and the desired band gap range, an array of nanoholes having different shapes, sizes, densities, or any combination thereof may be used, or may be distributed differently within the nanohole superlattice. In addition, the nanohole superlattice may be doped, in bulk or on edges, with different dopants or concentrations, to further tune the band gap range. Other parameters, such as the thickness of the nanohole superlattice, may be varied as well to modify the band gap.

As was the case with the disclosed nanoribbon based embodiments presented above, the first lead or the second lead may form a Schottky barrier or ohmic contact at the interface between the lead and the edge of the nanohole superlattice, depending on the application. Also, as was the case with the disclosed nanoribbon based embodiments presented above, embodiments using nanohole superlattices may or may not comprise an optical splitter depending on the application. For applications in which incident light is converted into electricity or detectable signals, a multiple band gap device in accordance with the present disclosure further comprises an optical splitter in optical communication with the nanohole superlattice. For light emission applications, however, a multiple band gap device in accordance with the present disclosure does not need an optical splitter.

6.4. Exemplary Embodiments

In addition to the basic structures, a multiple band gap device in accordance with the present disclosure can have various configurations, for instance, a hybrid configuration comprising bother vertical and lateral architectures, or a hybrid comprising both nanoribbons and nanohole superlattices.

In describing the basic structures, the plurality of stacks 104 in the vertical architecture and the plurality of nanoribbons 304 in the lateral architecture are depicted to be lengthwise disposed on the surface 114 of the substrate 102. Lengthwise arrangement in the present disclosure means that the plurality of stacks 104 or the plurality of nanoribbons 304 is arranged longitudinally with respect to each other along the direction of the nanoribbons' length. However, lengthwise arrangement does not necessarily require that the plurality of stacks 104 or the plurality of nanoribbons 304 be parallel. In some embodiments, the plurality of stacks 104 or the plurality of nanoribbons 304 may be parallel as depicted in FIG. 3 and FIG. 8. In other embodiments, however, some stacks in the plurality of stacks 104 or some nanoribbons in the plurality of nanoribbons 304 may be tilted, as illustrated in FIG. 12, where 404-1, 404-2, . . . , 404-N each represents either a nanoribbon or a stack. In such configuration, care is taken so that no overlapping exists among the stacks or the nanoribbons. As shown in FIG. 12, 404-3 has a width larger than the others, representing an embodiment that has multiple band gaps. In some embodiments, 404-1, 404-2, . . . , 404-N may have the same width, but different band gaps due to doping or variation of other parameters.

FIG. 13 illustrates another exemplary embodiment 500 of a multiple band gap device in accordance with the present disclosure. Instead of arranging nanoribbons or stacks in one row, exemplary embodiment 500 comprises a plurality of rows, with each row having a first common lead 106 and a second common lead 108. Similar to exemplary embodiment 400 in FIG. 12, 404-$i$ and 404-$j$ represent either a nanoribbon 304 or a stack 104. 404-$i$ and 404-$j$ may be identical or may have different characteristics. Each row can be electrically connected in series or parallel for a desired output.

Depicted in FIG. 14 is another exemplary embodiment 600 of a multiple band gap device in accordance with the present disclosure, where 404 represents either a nanoribbon 304 or a stack 104, and 130 represents a nanohole superlattice or a vertical stack of multiple nanohole superlattices. Nanoribbons, nanohole superlattices or stacks (formed with either nanoribbons or nanohole superlattices) in exemplary embodiment 600 are nanopatterned and arranged into a plurality of clusters (000-1, 000-2, . . . , 000-N) on substrate 102. Each cluster is spatially separated from each other, and has its own first lead 106 and second lead 108. With respect to structure and function, 000-1, 000-2, . . . , 000-N can represent any of the embodiments 100, 160, 300, 400 and 500 depicted in FIGS. 3, 8, 12, 13 and 19 for either nanoribbons or nanoholes superlattices. Exemplary embodiment 600 is a conglomerate that comprises a plurality of multiple band gap devices. Each device in the plurality of multiple band gap devices is a device as described in exemplary embodiments 100, 160, 300, 400, 500, or equivalents within the scope of the present disclosure.

In some embodiments, cluster 000-$i$ may have the same structure as cluster 000-$j$, for instance, both clusters resembling the vertically stacked architecture 100 or resembling the laterally spaced architecture 300. In other embodiments, cluster 000-$i$ may have the same structure as cluster 000-$j$, but both of them are different from cluster 000-$k$. In yet other embodiments, cluster 000-$i$ may have the same structure as cluster 000-$j$, but nanoribbons or stacks of cluster 000-$i$ may have different characteristics than nanoribbons or stacks of cluster 000-$j$. In some embodiments, cluster 000-$i$ may be a device comprising a plurality of lateral spaced nanoribbons, whereas in other embodiments, cluster 000-$i$ may be a device comprising a plurality of vertically stacked nanoribbons. In some embodiments, cluster 000-$i$ may be a device comprising a plurality of lateral spaced nanohole superlattices, whereas in other embodiments, cluster 000-$i$ may be a device comprising a plurality of vertically stacked nanohole superlattices. In some embodiments, cluster 000-$i$ may be a device comprising one single nanohole superlattice, whereas in other embodiments, cluster 000-$i$ may be a device comprising one single stack formed by a plurality of vertically stacked nanohole superlattices.

The plurality of multiple band gap devices, or clusters 000-1, 000-2, . . . , 000-N, may be geometrically arranged in a planar array, preferably with each cluster parallel or near parallel to adjacent clusters. In some embodiments, however, some clusters may be displaced or tilted as shown in FIG. 14. In other embodiments, one cluster may be placed on top of another cluster in the plurality of clusters. Depending on the desired application, the plurality of multiple band gap devices, or clusters 000-1, 000-2, . . . , 000-N, can be electrically connected in parallel, in series, or in combination of parallel and series.

In general, each device in plurality of multiple band gap devices or each cluster in the plurality of clusters has a width that is between 1 μm to 10 mm and a length that is between 1 μm to 10 mm. In some embodiments, each cluster in the plurality of clusters has a width that is between 10 μm to 1 mm and a length that is between 10 μm to 1 mm. In some embodiments, each cluster in the plurality of clusters has a width that is between 50 μm to 500 μm and a length that is between 50 μm to 500 μm.

Exemplary embodiments 400, 500, and 600 depicted in FIGS. 12-14 may comprise an optical splitter 310, if these embodiments, or a portion of these embodiments, resemble the laterally spaced architecture 300 or nanohole superlattice architecture 160, and if they are for use as a photovoltaic device or a photodetector.

Turning now to FIG. 21, a protection layer coated on the first lead 106 or the second lead 108 is depicted. As shown in FIG. 21, in some embodiments, a coating 2102 may be applied on the first lead 106 to protect the first lead, for example to prevent the first lead from oxidation, corrosion, or to reduce other undesirable effects. The coating comprises an electrically conductive material, for example gold or other suitable material. When a protection layer is applied, at least a portion of the first lead is covered with the protection layer. Referring to FIG. 22, in addition to a coating 2102 on the first lead 106, in some embodiments, a coating 2204 may be applied on the second 108, as depicted in FIG. 22. Similar to the coating 2102, the coating 2204 comprises an electrically conductive material. The coatings 2102 and 2204 can be made of the same material or different materials, and can be applied at the same thickness or at different thicknesses.

Referring to FIG. 21, in some embodiments the first electrode 106 is made out of titanium, the protection layer 2102 is made out of gold. Referring to FIG. 21, in some embodiments the first electrode 106 is made out of titanium, the protection layer 2102 is made out of gold, and the second electrode is made out of palladium.

Structures shown in FIGS. 21 and 22 are exemplary. Element 2100-i in FIG. 21, where i denotes 1, ..., n, and 2200 in FIG. 22 represent either nanoribbons or nanohole superlattices. That is, whether the device in accordance with the present application comprises nanoribbons or nanohole superlattices, the first lead 106 and/or the second lead 108 can have a coating. Furthermore, regardless of whether the device in accordance with the present application has a vertically stacked architecture as depicted in FIG. 21 or laterally spaced architecture as depicted in FIG. 22, the first lead 106 and/or the second lead 108 can have a coating. However, in some embodiments, a coating is not required. In some embodiments, neither the first lead 106 nor the second lead 108 has a coating.

6.5. Exemplary Electrical Diagram

FIGS. 15-17 provide exemplary schematic electric diagrams for a multiple band gap device in accordance with the present disclosure. In FIGS. 15-17, element 702 represents all the embodiments previously described, such as embodiments 100, 160, 300, 400, 500, and 600, and equivalents within the scope of the present disclosure. Through the first lead 106 and the second lead 108, embodiment 702 can be electrically connected to a selective external circuit, creating a multiple band gap photovoltaic device 700, a multiple band gap photodetector 800, or a multiple band gap LED 900.

A multiple band gap photovoltaic device 700 is created by connecting embodiment 702 to an external load, as depicted in FIG. 15. Represented by the resistor, the load is an electrical generator, a water heater, a battery, or other appliance. The load may be also an electrical grid if embodiment 702 is connected to a main electrical grid. In some embodiments, upon exposure to sunlight, the multiple band gap photovoltaic device 700 produces power at 50 W/m$^2$ or higher without a solar concentrator. With a solar concentrator, the power output can be higher. For example, using a 100× solar concentrator, a power of 5000 W/m$^2$ may be achieved.

Connecting embodiment 702 to an electrometer produces a multiple band gap photodetector 800, a schematic electrical diagram of which is illustrated in FIG. 16. The electrometer is any type of electrometer, including vibrating reed electrometers, valve electrometers, and solid-state electrometers, and can measure either electric charge or electrical potential difference. By tuning and controlling the band gaps, the present multiple band gap photodetector is designed to measure infrared radiation, visible light, and ultraviolet radiation, where the wavelength ranges from 10 nm to 100 μm.

When embodiment 702 is connected to an external current, such as a battery, a multiple band gap LED 900 is generated. FIG. 17 provides a schematic electrical diagram of a multiple band LED 900 in accordance with the present disclosure. By tuning and controlling the band gaps, the present multiple band gap LED can emit light in a wide spectrum in between 10 nm to 100 μm. It can emit a hybrid light, such as a white light.

In some embodiments, the present photovoltaic device, photodetector, and/or LED is integrated for a desired application. For instance, in some embodiments the photovoltaic device is combined with the =LED for a variety of self-sustained solar lighting applications. Examples include outdoor lighting at night. During the daytime, the photovoltaic device absorbs solar energy, converts solar energy into electricity and stores electricity, for example, in a battery. At night, stored electricity powers the present LED that emits light.

7. Exemplary Embodiments

One aspect of the present disclosure provides a multiple band gap device comprising a plurality of stacks lengthwise arranged on a substrate, with each stack in the plurality of stacks occupying a different portion of the substrate. Each stack in the plurality of stacks is defined by a first end, a second end, and a length, and comprises (i) a plurality of semiconducting nanoribbons with one nanoribbon on top of another nanoribbon in the plurality of semiconducting nanoribbons and (ii) an optically transparent insulator disposed in between two adjacent nanoribbons. Each nanoribbon in the plurality of nanoribbons is characterized by a band gap. Within each stack, the band gap of a nanoribbon in the plurality of nanoribbons is larger than the band gaps of nanoribbons beneath it but is smaller than the band gaps of nanoribbons above it. The first end of each stack in the plurality of stacks electrically contacts a first lead while the second end of each stack in the plurality of stacks electrically contacts a second lead.

The present multiple band gap device is operable by electrical control of the first lead and the second lead. Electrically connecting the first lead and the second lead to an external load, an external electrometer, or an external current creates a multiple band gap photovoltaic device, a multiple band gap photodetector, or a multiple band gap light emitting diode (LED), respectively.

In some embodiments, each stack in the plurality of stacks comprises two nanoribbons and an optically transparent insulator in between. The first nanoribbon, characterized by a first band gap, overlays on the substrate and is overlaid by the optically transparent insulator. Then the second nanoribbon with a second band gap overlays on the insulator. In accordance with the present disclosure, the second band gap is larger than the first band gap. In some embodiments, each stack in the plurality of stacks comprises three nanoribbons and two optically transparent insulators with one insulator separating two adjacent nanoribbons. In such a configuration, the second insulator overlays onto the second nanoribbon and the third nanoribbon overlays onto the second insulator. The third nanoribbon is characterized by a third band gap larger than the second band gap, which is in turn larger than the first band gap. In some embodiments, each stack in the plurality of stacks comprises more than three nanoribbons.

In some embodiments, each stack in the plurality of stacks is identical, whereas in other embodiments, one stack in the plurality of stacks is different from another stack in the plurality of stacks. The difference among the plurality of stacks may be in terms of the number of nanoribbons each stack has, the materials used for making the nanoribbons in each stack, the dimension of the nanoribbons, the edge state of the nanoribbons, doping applied in the nanoribbons, nanoholes patterned within the nanoribbons, or other factors. The difference may also occur when some stacks in the plurality of stacks have optimal band gaps different from other stacks, targeting different spectral ranges. For instance, the first nanoribbon of one stack in the plurality of stacks may have a different band gap than the first nanoribbon of another stack in the plurality of stacks; the second nanoribbon of one stack in the plurality of stacks may have a different band gap than the second nanoribbon of another stack in the plurality of stacks. In such a configuration, care is taken so that nanoribbons are arranged in descending order based on the band gaps, with the top nanoribbon having the largest band gap and the bottom nanoribbon having the smallest band gap within each stack.

In some embodiments, the plurality of nanoribbons in the plurality of stacks is made of highly ordered pyrolytic graphite (HOPG), or lower grade graphite film, or other layered materials including boron nitride (BN), molybdenum disulfide ($MoS_2$), tungsten disulfide ($WS_2$), zinc oxide (ZnO), and titanium dioxide ($TiO_2$). In some embodiments, the plurality of nanoribbons in the plurality of stacks is made by photolithographic pattering or by E-beam and/or interference lithography nanopatterning. In some embodiments, the band gaps of the plurality of nanoribbons is tuned or controlled by varying the widths, the thickness, or the edge states of the nanoribbons. In addition, tuning the band gaps can be accomplished by doping the nanoribbons with different dopants, at different concentration, or having different gradients. Suitable dopants include atoms or molecules of nitrogen, fluorine, phosphorus, or bismuth. In some embodiments, nanoribbon width, thickness, edge state, doping and/or other parameters is optimized concurrently to achieve a desired band gap. Furthermore, tuning the band gaps can also be achieved by patterning suitable nanoholes within the nanoribbons.

In some embodiments, the instant multiple band gap devices may further comprise an antireflection layer overlaying all or a portion of each stack in the plurality of stacks. The anti-reflection layer may be made of dielectric materials, such as $SiO_2$ and $TiO_2$, or semiconducting materials, such as InGaAs. If a semiconducting material is used for the coating, doping may be utilized to open up the band gap of the semiconducting material so that it is optically transparent to photons within the targeted wavelength range.

In some embodiments, the first and second leads are made of electrically conductive materials, such as titanium, niobium, zinc, chromium, silver, aluminum, cobalt, palladium, copper, platinum, gold, or an alloy thereof. In some embodiments, materials may be selected so that the first lead has a different work function than the nanoribbons and forms a Schottky barrier for a carrier at the interface between the lead and the nanoribbon while the second lead does not form a Schottky barrier at all or forms a smaller Schottky barrier for the carrier.

Another aspect of the present disclosure provides a multiple band gap device comprising a plurality of clusters arranged on a substrate, with each cluster in the plurality of clusters occupying a different portion of the substrate. Each cluster in the plurality of clusters comprises a plurality of stacks, with each respective stack in the plurality of stacks defined by a first end, a second end, and a length. Each respective stack in the plurality of stacks comprises (i) a plurality of semiconducting nanoribbons with one nanoribbon on top of another nanoribbon in the plurality of semiconducting nanoribbons and (ii) an optically transparent insulator in between two adjacent nanoribbons. Each nanoribbon in the plurality of nanoribbons is characterized by a band gap. The band gap of a nanoribbon in the plurality of nanoribbons is larger than the band gaps of nanoribbons beneath it but is smaller than the band gaps of nanoribbons above it. Within each cluster, the first end of each stack in the plurality of stacks electrically contacts a first lead while the second end of each stack in the plurality of stacks electrically contacts a second lead. Thus, each cluster has its own first lead and second lead. In some embodiments, through the first lead and the second lead of each cluster, the plurality of clusters may be electrically connected in series, parallel, or some combination of series and parallel in order to create a multiple band gap photovoltaic device, a multiple band gap photodetector, or a multiple band gap LED.

In some embodiments, a first cluster in the plurality of clusters comprises a first plurality of stacks and a second cluster in the plurality of clusters comprises a second plurality of stacks, the number of the first plurality of stacks being the same as the number of the second plurality of stacks. In some embodiments, a first cluster in the plurality of clusters comprises different number of stacks than a second cluster in the plurality of clusters. In some embodiments, a first cluster in the plurality of clusters comprises a first plurality of stacks with each stack having a first plurality of nanoribbons, and a second cluster in the plurality of clusters comprises a second plurality of stacks with each stack having a second plurality of nanoribbons. In some embodiments, the first plurality of nanoribbons is the same as the second plurality of nanoribbons. In some embodiments, the first plurality of nanoribbons in the first cluster is different from the second plurality of nanoribbons in the second cluster. The difference can take place in terms of band gaps, width, thickness, number of nanoribbons in a stack, material used, doping, nanohole patterning, or combination thereof. In some embodiments, a first cluster in the plurality of clusters may or may not have the same dimension as a second cluster in the plurality of clusters.

Yet another aspect of the present disclosure provides a multiple band gap device comprising a plurality of nanoribbons lengthwise arranged on a substrate, with each nanoribbon in the plurality of nanoribbons occupying a different portion of the substrate. Each nanoribbon in the plurality of nanoribbons is defined by a first end, a second end, and a length, and characterized by a band gap. In some embodiments, a nanoribbon in the plurality of nanoribbons has a different band gap than other nanoribbons in the plurality of nanoribbons. In some embodiments, each nanoribbon in the plurality of nanoribbons has a different band gap than other nanoribbons in the plurality of nanoribbons. The first end of each nanoribbon in the plurality of nanoribbons electrically contacts a first lead while the second end of each nanoribbon in the plurality of nanoribbons electrically contacts a second lead. For applications in which incident light is converted into electricity or electrical signals, a multiple band gap device in accordance with the present disclosure further comprises an optical splitter in optical communication with the plurality of nanoribbons. For light emission applications, however, a multiple band gap device in accordance with the present disclosure does not need an optical splitter.

The optical splitter splits an incident light into different wavelength bands and directs the different wavelength bands to corresponding nanoribbons. Depending on the application, the optical splitter may be a simple prism or a multi-lens or multi-component optical system. In some embodiments, the optical splitter is placed directly above the plurality of nanoribbons. In other embodiments, the optical splitter is disposed some distance away from the plurality of nanoribbons. In yet other embodiments, the optical splitter is tilted and forms an angle with respect to the normal surface of the plurality of nanoribbons.

In some embodiments, the plurality of nanoribbons comprises a first nanoribbon having a first band gap and a second nanoribbon having a second band gap. In such embodiments, the second band gap is larger than the second band gap. The optical splitter splits an incident light into a first and second wavelength band, with the first wavelength band having at least one wavelength that is greater than the wavelengths in the second wavelength band. Accordingly, the optical splitter directs the first wavelength band to the first nanoribbon in the plurality of nanoribbons and the second wavelength band to the second nanoribbon in the plurality of nanoribbons. In some embodiments, the plurality of nanoribbons comprises a third nanoribbon characterized by a third band gap, which is larger than the second band gap. In such configuration, the optical splitter splits the incident light into three wavelength bands, with the second wavelength band having at least one wavelength that is greater than the wavelengths in the third wavelength band. The optical splitter then directs the third wavelength band to the third nanoribbon.

In some embodiments, the present multiple band gap devices further comprise an antireflection layer overlaying all or portion of each nanoribbon in the plurality of nanoribbons. In some embodiments, the present multiple band gap devices may further comprise a concentrator that converges incident light and directs the converged light to the optical splitter.

Still another aspect of the present disclosure provides a multiple band gap device comprising a plurality of clusters arranged on a substrate, with each cluster in the plurality of clusters occupying a different portion of the substrate. Each cluster in the plurality of clusters comprises a plurality of nanoribbons. Each nanoribbon in the plurality of nanoribbons is defined by a first end, a second end, and a length, and is characterized by a band gap. Within each cluster, the first end of each nanoribbon in the plurality of nanoribbons electrically contacts a first lead while the second end of each nanoribbon in the plurality of nanoribbons electrically contacts a second lead. Thus, each cluster in the plurality of clusters has its own first lead and second lead. Through the first lead and the second lead of each cluster, the plurality of clusters may be electrically connected in series, in parallel, or in combination of series and parallel to create a multiple band gap photovoltaic device, a multiple band gap photodetector, or a multiple band gap LED.

For applications in which incident light is converted into electricity or electrical signals, a multiple band gap device in accordance with the present disclosure further comprises an optical splitter in optical communication with the plurality of clusters. For light emission applications, however, there is typically no requirement for an optical splitter in the disclosed multiple band gap devices.

In some embodiments, each nanoribbon in the plurality of nanoribbons of a first cluster has a first band gap value, and each nanoribbon in the plurality of nanoribbons of a second cluster in the plurality of clusters has a second band gap value. In such embodiments, the first band gap value is smaller than the second band gap value. In some embodiments, the band gap of each nanoribbon in the plurality of nanoribbons of a first cluster is within a first band gap range and the band gap of each nanoribbon in the plurality of nanoribbons of a second cluster is within a second band gap range. The first band gap range is characterized by at least one band gap that is smaller than the band gaps in the second band gap range. For applications in which incident light is converted into electricity or electric signals, the optical splitter splits an incident light into first and second wavelength bands. The first wavelength band is characterized by at least one wavelength that is greater than the wavelengths in the second wavelength band. The optical splitter then directs the first light wavelength band to the first cluster in the plurality of clusters and the second wavelength band to the second cluster in the plurality of clusters.

Still another aspect of the present disclosure provides a multiple band gap device comprising one or more nanohole superlattices one or more nanohole superlattice clusters arranged on a substrate, with each nanohole superlattice cluster occupying a different portion of the substrate. Each nanohole superlattice cluster comprises: (i) a nanohole superlattice characterized by a band gap range, the nanohole superlattice patterned with an array of nanoholes and defined by a first edge and a second edge, (ii) a first lead electrically contacting the first edge of the nanohole superlattice, and (iii) a second lead electrically contacting the second edge of the nanohole superlattice.

In some embodiments, there is one nanohole superlattice cluster, whereas in other embodiments, there are multiple nanohole superlattice clusters. In some embodiments, there are more than 10 nanohole superlattice clusters, whereas in other embodiments, there are more 100 nanohole superlattice clusters. In some embodiments, there are more than $10^3$, $10^4$, or $10^5$ nanohole superlattice clusters. In some embodiments, a nanohole superlattice in the one or more nanohole superlattice has a different nanohole pattern, including nanohole size, shape, and/or density, than another nanohole superlattice in the one or more nanohole superlattice. In some embodiments, a nanohole superlattice in the one or more nanohole superlattice has the same nanohole pattern, including nanohole size, shape, and/or density, as another nanohole superlattice in the one or more nanohole superlattice.

In some embodiments, a nanohole superlattice in the one or more nanohole superlattice has a different band gap range than another nanohole superlattice in the one or more nanohole superlattice. In some embodiments, a nanohole superlattice in the one or more nanohole superlattice has the same band gap range as another nanohole superlattice in the one or more nanohole superlattice, wherein the band gap range includes at least two discreet band gaps. In some embodiments, a nanohole superlattice in the one or more nanohole superlattice has a different doping, including dopant, concentration, and/or gradient, than another nanohole superlattice in the one or more nanohole superlattice. In some embodiments, a nanohole superlattice in the one or more nanohole superlattice has the same doping, including dopant, concentration, and/or gradient, as another nanohole superlattice in the one or more nanohole superlattice.

In some embodiments, a nanohole superlattice or a portion of a nanohole superlattice in the one or more nanohole superlattice is overlaid by an antireflection layer. In some embodiments, an optical splitter is incorporated to split the incident light into multiple lights with different wavelength ranges and direct the multiple lights to different nanohole superlattices or different potion of one nanohole superlattice.

In some embodiments, the first lead and the first edge of the nanohole superlattice stack forms a Schottky barrier, and the second lead and the second edge of the nanohole superlattice stack does not form a Schottky barrier at all. In some embodiments, the first lead and the first edge of the nanohole superlattice stack forms a Schottky barrier, and the second lead and the second edge of the nanohole superlattice stack forms a smaller Schottky barrier for the same charge carriers.

In some embodiments, the one or more nanohole superlattice clusters are electrically connected to each other in series, while in other embodiments, the one or more nanohole superlattice clusters are electrically connected to each other in parallel. In some embodiments, the one or more nanohole superlattice clusters are electrically connected to each other in a combination of series or parallel connections. By connecting to a selective external circuit, the one or more nanohole superlattice clusters produce a multiple band gap photovoltaic device, a multiple band gap photodetector, or a multiple band gap light emitting diode.

Yet another aspect of the present disclosure provides a multiple band gap device comprising one or more nanohole superlattice clusters arranged on the substrate, with each nanohole superlattice cluster occupying a different portion of the substrate. Each nanohole superlattice cluster in the one or more nanohole superlattice clusters comprise (i) a nanohole superlattice stack defined by a first edge and a second edge, (ii) a first lead, and (iii) a second lead. The nanohole superlattice stack comprises a plurality of nanohole superlattices and optically transparent insulators, wherein (1) first nanohole superlattice in the plurality of nanohole superlattices is characterized by a first band gap range and patterned with by a first array of nanoholes, and the first nanohole superlattice overlays the substrate, (2) a first optically transparent insulator overlays the first nanohole superlattice, and (3) a second nanohole superlattice in the plurality of nanohole superlattices is characterized by a second band gap range and patterned with a second array of nanoholes, and the second nanohole superlattice overlays the first insulator. Within the nanohole superlattice stack, the first band gap range is characterized by at least one band gap within the first band gap range that is smaller than band gaps within the second band gap range. The first lead electrically contacting the first edge of the nanohole superlattice stack, and the second lead electrically contacting the second edge of the nanohole superlattice stack. Either the first lead or the second lead forms a Schottky barrier at the contact with the nanohole superlattice stack. Electrically connecting the first lead and the second lead to a selective external circuit produces a multiple band gap photovoltaic device, a multiple band gap photodetector, or a multiple band gap light emitting diode.

In some embodiments, the first nanohole superlattice of a nanohole superlattice stack in a nanohole superlattice cluster has a nanohole pattern, including nanohole size, shape, and/or density, different than the second nanohole superlattice of the nanohole superlattice stack in the nanohole superlattice cluster. In some embodiments, the first nanohole superlattice of a nanohole superlattice stack in a nanohole superlattice cluster has a nanohole pattern, including nanohole size, shape, and/or density, the same as the second nanohole superlattice of the nanohole superlattice stack in the nanohole superlattice cluster. In some embodiments, the first nanohole superlattice of a nanohole superlattice stack in a nanohole superlattice cluster has a first doping that is different than a second doping in the second nanohole superlattice of the nanohole superlattice stack in the nanohole superlattice cluster. In some embodiments, the first nanohole superlattice of a nanohole superlattice stack in a nanohole superlattice cluster has a first doping that is the same a second doping in the second nanohole superlattice of the nanohole superlattice stack in the nanohole superlattice cluster.

In some embodiments, a first nanohole superlattice of a first nanohole superlattice cluster in the one or more nanohole superlattice clusters has a band gap range that is different than a first nanohole superlattice of a second nanohole superlattice cluster in the one or more nanohole superlattice clusters. In some embodiments, a first nanohole superlattice of a first nanohole superlattice cluster in the one or more nanohole superlattice clusters has a band gap range that is the same as a first nanohole superlattice of a second nanohole superlattice cluster in the one or more nanohole superlattice clusters. In some embodiments, a second nanohole superlattice of a first nanohole superlattice cluster in the one or more nanohole superlattice clusters has a band gap range that is different than a second nanohole superlattice of a second nanohole superlattice cluster in the one or more nanohole superlattice clusters. In some embodiments, a second nanohole superlattice of a first nanohole superlattice cluster in the one or more nanohole superlattice clusters has a band gap range that is the same as a second nanohole superlattice of a second nanohole superlattice cluster in the one or more nanohole superlattice clusters.

In some embodiments, a nanohole superlattice stack of a nanohole superlattice cluster in the one or more nanohole superlattice clusters further comprises (4) a second optically transparent insulator overlaying the second nanohole superlattice, and (5) a third nanohole superlattice in the plurality of nanohole superlattices characterized by a third band gap range and patterned with a third array of nanoholes, the third nanohole superlattice overlaying the second insulator. The third band gap range is characterized by at least one band gap within the third band gap range that is greater than band gaps within the second band gap range.

Still yet another aspect of the present disclosure provides a plurality of multiple band gap devices electrically connected to each other in series, in parallel, or in some combination of series and parallel in order to generate a desired output. In some embodiments, devices in the plurality of multiple band gap devices are geometrically arranged in a planar array, with each device parallel or near parallel to adjacent devices. In some embodiments, some devices are displaced or tilted. In other embodiments, one device is placed on top of another device.

In some embodiments, a first multiple band gap device in the plurality of multiple band gap devices is the same as a second multiple band gap device. In some embodiments, a first multiple band gap device in the plurality of multiple band gap devices is different from a second multiple band gap device. In some embodiments, the first and second multiple band gap devices are different in types, functions, or structures. In one example, the first multiple band gap device is a photovoltaic device and the second multiple band gap device is an LED. In some embodiments, there is no optical splitter, whereas in other embodiments, there are one or more optical splitters.

In some embodiments, a multiple band gap device in the plurality of multiple band gap devices is a device comprising a plurality of lateral spaced nanoribbons, whereas in other embodiments, a multiple band gap device in the plurality of multiple band gap devices is a device comprising a plurality of vertically stacked nanoribbons. In some embodiments, a multiple band gap device in the plurality of multiple band gap devices is a device comprising a plurality of lateral spaced nanohole superlattices, whereas in other embodiments, a multiple band gap device in the plurality of multiple band gap devices is a device comprising a plurality of vertically stacked nanohole superlattices. In some embodiments, a multiple band gap device in the plurality of multiple band gap devices is a device comprising one single nanohole superlattice, whereas in other embodiments, a multiple band gap device in the plurality of multiple band gap devices is a device comprising one single stack formed by a plurality of vertically stacked nanohole superlattices.

8. References Cited

All references cited herein are incorporated herein by reference in their entirety and for all purposes to the same extent as if each individual publication or patent or patent application was specifically and individually indicated to be incorporated by reference in its entirety for all purposes.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

What is claimed is:

1. An electrical device comprising:
   (A) a substrate having a surface;
   (B) a first semiconductor nanohole superlattice superimposed on a first portion of the surface, the first semiconductor nanohole superlattice comprising a first plurality of sheets having a first array of structural nanoholes defined therein, wherein the first array of structural nanoholes in the first plurality of sheets is characterized by a first band gap or a first band gap range and wherein the first plurality of sheets forms a first edge and a second edge;
   (C) a first lead comprising a first electrically conductive material, the first lead forming a first junction with the first edge, wherein the first junction is a first Schottky barrier with respect to a carrier;
   (D) a second lead comprising a second electrically conductive material, the second lead forming a second junction with the second edge;
   (F) a first optically transparent insulator overlaying the first semiconductor nanohole superlattice; and
   (G) a second semiconductor nanohole superlattice superimposed on the first optically transparent insulator, the second semiconductor nanohole superlattice comprising a second plurality of sheets having a second array of structural nanoholes defined therein, wherein the second array of structural nanoholes in the second plurality of sheets is characterized by a second band gap or a second band gap range and wherein the second plurality of sheets forms a third edge and a fourth edge; wherein
   the first lead forms a third junction with the third edge,
   the second lead forms a fourth junction with the fourth edge,
   the third junction is a second Schottky barrier with respect to the carrier,
   the second junction is a third Schottky barrier with respect to the carrier, and
   the third Schottky barrier is less than the first Schottky barrier.

2. The electrical device of claim 1, further comprising:
   (H) a second optically transparent insulator overlaying the second nanohole superlattice; and
   (I) a third semiconductor nanohole superlattice superimposed on the second optically transparent insulator, the third semiconductor nanohole superlattice comprising a third plurality of sheets having a third array of structural nanoholes defined therein, wherein the third array of structural nanoholes in the third plurality of sheets is characterized by a third band gap or a third band gap range and wherein the third plurality of sheets forms a fifth edge and a sixth edge; wherein
   the first lead forms a fifth junction with the third edge,
   the second lead forms a sixth junction with the fourth edge, and
   the third junction is a third Schottky barrier with respect to the carrier.

3. The electrical device of claim 1, wherein an average width of the structural nanoholes in the first array of structural nanoholes is different than an average width of the structural nanoholes in the second array of structural nanoholes.

4. The electrical device of claim 1, wherein an average width of the structural nanoholes in the first array of structural nanoholes is the same as the average with of the structural nanoholes in the second array of structural nanoholes.

5. The electrical device of claim 1, wherein
   the first array of structural nanoholes in the first plurality of sheets is characterized by a first band gap range,
   the second array of structural nanoholes in the second plurality of sheets is characterized by a second band gap range, and
   the first band gap range is the same as the second band gap range.

6. The electrical device of claim 1, wherein,
   a first sheet in the first plurality of sheets is characterized by a first dopant, and
   a second sheet in the second plurality of sheets is characterized by a second dopant, wherein the second dopant is different than the first dopant.

7. The electrical device of claim 1, wherein each sheet in the first plurality of sheets and each sheet in the second plurality of sheets is characterized by a first dopant.

8. The electrical device of claim 1, wherein the first array of structural nanoholes in the first plurality of sheets is characterized by the first band gap range and wherein the first band gap range is between 0.1 eV and 2.2 eV.

9. The electrical device of claim 1, wherein an average width, radius or diameter of the structural nanoholes in the first array of structural nanoholes is less than 5000 nm.

10. The electrical device of claim 1, wherein the structural nanoholes in the first array are characterized by a cross-section that includes any combination of linear portions, arcuate portions, or curved portions.

11. The electrical device of claim 1, wherein the first plurality of sheets consists of between 1 and 300 graphene nanohole superlattice sheets.

12. The electrical device of claim 1, wherein
    the first lead comprises titanium, niobium, zinc, chromium, silver or aluminum, and
    the second lead comprises gold, cobalt, palladium, copper or platinum.

13. The electrical device of claim 1, wherein
    the first lead and the second lead are in electrical communication with an external circuit, and
    the electrical device is a photodetector that generates a current or a voltage in response to an incident light.

14. The electrical device of claim 1, wherein
    the first lead and the second lead are in electrical communication with an external current, and
    the electrical device is a light emitting diode that emits a light in response to the external current.

15. An electrical device comprising:
    (A) a substrate having a surface;
    (B) a first semiconductor nanohole superlattice superimposed on a first portion of the surface, the first semiconductor nanohole superlattice comprising a first plurality of sheets having a first array of structural nanoholes defined therein, wherein the first array of structural nanoholes in the first plurality of sheets is characterized by a first band gap or a first band gap range and wherein the first plurality of sheets forms a first edge and a second edge;
    (C) a first lead comprising a first electrically conductive material, the first lead forming a first junction with the first edge, wherein the first junction is a first Schottky barrier with respect to a carrier;
    (D) a second lead comprising a second electrically conductive material, the second lead forming a second junction with the second edge; and
    (E) a first metal protective coating covering all or a portion of a surface of the first lead, wherein
    the first lead comprises titanium,
    the second lead comprises palladium, and
    the first metal protective coating comprises gold.

16. The electrical device of claim 1 further comprising a first metal protective coating covering at least a portion of a surface of the first lead.

17. The electrical device of claim 1, wherein the first lead comprises titanium and the second lead comprises palladium.

18. An electrical device comprising:
(A) a substrate having a surface;
(B) a first semiconductor nanohole superlattice superimposed on a first portion of the surface, the first semiconductor nanohole superlattice comprising a first plurality of sheets having a first array of structural nanoholes defined therein, wherein the first array of structural nanoholes in the first plurality of sheets is characterized by a first band gap or a first band gap range and wherein the first plurality of sheets forms a first edge and a second edge;
(C) a first lead comprising a first electrically conductive material, the first lead forming a first junction with the first edge, wherein the first junction is a first Schottky barrier with respect to a carrier;
(D) a second lead comprising a second electrically conductive material, the second lead forming a second junction with the second edge;
(F) a second semiconductor nanohole superlattice superimposed on a second portion of the surface, the second semiconductor nanohole superlattice comprising a second plurality of sheets having a second array of structural nanoholes defined therein, wherein the second array of structural nanoholes is characterized by a second band gap or a second band gap range in the second plurality of sheets and wherein the second plurality of sheets forms a third edge and a fourth edge;
(G) a third lead comprising a third electrically conductive material, the third lead forming a third junction with the third edge, and
(H) a fourth lead comprising a fourth electrically conductive material, the fourth lead forming a fourth junction with the fourth edge;
wherein
the third junction is a second Schottky barrier with respect to the carrier,
the second junction is a third Schottky barrier with respect to the carrier, and wherein the third Schottky barrier is less than the first Schottky barrier.

19. The electrical device of claim 18, further comprising:
(I) a third semiconductor nanohole superlattice superimposed on a third portion of the surface, the third semiconductor nanohole superlattice comprising a third plurality of sheets having a third array of structural nanoholes defined therein, wherein the third array of structural nanoholes produce a third band gap or a third band gap range in the third plurality of sheets and wherein the third plurality of sheets forms a fifth edge and a sixth edge;
(J) a fifth lead comprising a fifth electrically conductive material, the fifth lead forming a fifth junction with the third edge, and
(K) a sixth lead comprising a sixth electrically conductive material, the sixth lead forming a sixth junction with the sixth edge;
wherein the fifth junction is a third Schottky barrier with respect to the carrier.

20. The electrical device of claim 18, wherein
the first array of structural nanoholes in the first plurality of sheets is characterized by a first band gap range,
the second array of structural nanoholes in the second plurality of sheets is characterized by a second band gap range, and
the first band gap range is characterized by at least one band gap sub-range that is within the first band gap range but not the second band gap range.

21. The electrical device of claim 18, further comprising:
an optical splitter in optical communication with the first semiconductor nanohole superlattice and the second semiconductor nanohole superlattice, wherein
(i) the optical splitter splits an incident light into a first wavelength band and a second wavelength band,
(ii) the first wavelength band is characterized by at least one wavelength that is in the first wavelength band but not in the second wavelength band, and
(iii) the optical splitter directs the first light wavelength band to the first semiconductor nanohole superlattice and the second wavelength band to the second semiconductor nanohole superlattice.

22. The electrical device of claim 18, wherein an average width of the structural nanoholes in the first array of structural nanoholes is different than an average width of the structural nanoholes in the second array of structural nanoholes.

23. The electrical device of claim 18, wherein an average width of the structural nanoholes in the first array of structural nanoholes is the same as the average with of the structural nanoholes in the second array of structural nanoholes.

24. The electrical device of claim 18, wherein
the first array of structural nanoholes in the first plurality of sheets is characterized by a first band gap range,
the second array of structural nanoholes in the second plurality of sheets is characterized by a second band gap range, and
the first band gap range is the same as the second band gap range.

25. The electrical device of claim 18, wherein,
a first sheet in the first plurality of sheets is characterized by a first dopant, and
a second sheet in the second plurality of sheets is characterized by a second dopant, wherein the second dopant is different than the first dopant.

26. The electrical device of claim 18, wherein each sheet in the first plurality of sheets and each sheet in the second plurality of sheets is characterized by a first dopant.

27. The electrical device of claim 18, wherein the first array of structural nanoholes in the first plurality of sheets is characterized by the first band gap range and wherein the first band gap range is between 0.1 eV and 2.2 eV.

28. An electrical device comprising:
(A) a substrate having a surface;
(B) a first semiconductor nanohole superlattice superimposed on a first portion of the surface, the first semiconductor nanohole superlattice comprising a first plurality of sheets having a first array of structural nanoholes defined therein, wherein the first array of structural nanoholes in the first plurality of sheets is characterized by a first band gap or a first band gap range and wherein the first plurality of sheets forms a first edge and a second edge;
(C) a first lead comprising a first electrically conductive material, the first lead forming a first junction with the first edge, wherein the first junction is a first Schottky barrier with respect to a carrier; and
(D) a second lead comprising a second electrically conductive material, the second lead forming a second junction with the second edge; wherein an average width, radius or diameter of the structural nanoholes in the first array of structural nanoholes is inbetween 1 µm and 10 mm.

29. The electrical device of claim 28, further comprising:
(F) a second semiconductor nanohole superlattice superimposed on a second portion of the surface, the second semiconductor nanohole superlattice comprising a second plurality of sheets having a second array of structural nanoholes defined therein, wherein the second array of structural nanoholes is characterized by a second band gap or a second band gap range in the second plurality of sheets and wherein the second plurality of sheets forms a third edge and a fourth edge;
(G) a third lead comprising a third electrically conductive material, the third lead forming a third junction with the third edge, and
(H) a fourth lead comprising a fourth electrically conductive material, the fourth lead forming a fourth junction with the fourth edge;
wherein the third junction is a second Schottky barrier with respect to the carrier.

30. The electrical device of claim 29, further comprising:
(I) a third semiconductor nanohole superlattice superimposed on a third portion of the surface, the third semiconductor nanohole superlattice comprising a third plurality of sheets having a third array of structural nanoholes defined therein, wherein the third array of structural nanoholes produce a third band gap or a third band gap range in the third plurality of sheets and wherein the third plurality of sheets forms a fifth edge and a sixth edge;
(J) a fifth lead comprising a fifth electrically conductive material, the fifth lead forming a fifth junction with the third edge, and
(K) a sixth lead comprising a sixth electrically conductive material, the sixth lead forming a sixth junction with the sixth edge;
wherein the fifth junction is a third Schottky barrier with respect to the carrier.

31. The electrical device of claim 28, further comprising:
(F) a first optically transparent insulator overlaying the first semiconductor nanohole superlattice; and
(G) a second semiconductor nanohole superlattice superimposed on the first optically transparent insulator, the second semiconductor nanohole superlattice comprising a second plurality of sheets having a second array of structural nanoholes defined therein, wherein the second array of structural nanoholes in the second plurality of sheets is characterized by a second band gap or a second band gap range and wherein the second plurality of sheets forms a third edge and a fourth edge; wherein
the first lead forms a third junction with the third edge,
the second lead forms a fourth junction with the fourth edge, and
the third junction is a second Schottky barrier with respect to the carrier.

32. The electrical device of claim 31, further comprising:
(H) a second optically transparent insulator overlaying the second nanohole superlattice; and
(I) a third semiconductor nanohole superlattice superimposed on the second optically transparent insulator, the third semiconductor nanohole superlattice comprising a third plurality of sheets having a third array of structural nanoholes defined therein, wherein the third array of structural nanoholes in the third plurality of sheets is characterized by a third band gap or a third band gap range and wherein the third plurality of sheets forms a fifth edge and a sixth edge; wherein
the first lead forms a fifth junction with the third edge,
the second lead forms a sixth junction with the fourth edge, and
the third junction is a third Schottky barrier with respect to the carrier.

33. The electrical device of claim 29, wherein
the first array of structural nanoholes in the first plurality of sheets is characterized by a first band gap range,
the second array of structural nanoholes in the second plurality of sheets is characterized by a second band gap range, and
the first band gap range is characterized by at least one band gap sub-range that is within the first band gap range but not the second band gap range.

34. The electrical device of claim 29, further comprising:
an optical splitter in optical communication with the first semiconductor nanohole superlattice and the second semiconductor nanohole superlattice, wherein
(i) the optical splitter splits an incident light into a first wavelength band and a second wavelength band,
(ii) the first wavelength band is characterized by at least one wavelength that is in the first wavelength band but not in the second wavelength band, and
(iii) the optical splitter directs the first light wavelength band to the first semiconductor nanohole superlattice and the second wavelength band to the second semiconductor nanohole superlattice.

35. The electrical device of claim 29, wherein an average width of the structural nanoholes in the first array of structural nanoholes is different than an average width of the structural nanoholes in the second array of structural nanoholes.

36. The electrical device of claim 31, wherein an average width of the structural nanoholes in the first array of structural nanoholes is different than an average width of the structural nanoholes in the second array of structural nanoholes.

37. The electrical device of claim 29, wherein an average width of the structural nanoholes in the first array of structural nanoholes is the same as the average with of the structural nanoholes in the second array of structural nanoholes.

38. The electrical device of claim 31, wherein an average width of the structural nanoholes in the first array of structural nanoholes is the same as the average with of the structural nanoholes in the second array of structural nanoholes.

39. The electrical device of claim 29, wherein
the first array of structural nanoholes in the first plurality of sheets is characterized by a first band gap range,
the second array of structural nanoholes in the second plurality of sheets is characterized by a second band gap range, and
the first band gap range is the same as the second band gap range.

40. The electrical device of claim 31, wherein
the first array of structural nanoholes in the first plurality of sheets is characterized by a first band gap range,
the second array of structural nanoholes in the second plurality of sheets is characterized by a second band gap range, and
the first band gap range is the same as the second band gap range.

41. The electrical device of claim 29, wherein,
a first sheet in the first plurality of sheets is characterized by a first dopant, and
a second sheet in the second plurality of sheets is characterized by a second dopant, wherein the second dopant is different than the first dopant.

42. The electrical device of claim 31, wherein,
a first sheet in the first plurality of sheets is characterized by a first dopant, and
a second sheet in the second plurality of sheets is characterized by a second dopant, wherein the second dopant is different than the first dopant.

43. The electrical device of claim 29, wherein each sheet in the first plurality of sheets and each sheet in the second plurality of sheets is characterized by a first dopant.

44. The electrical device of claim 31, wherein each sheet in the first plurality of sheets and each sheet in the second plurality of sheets is characterized by a first dopant.

45. The electrical device of claim 29, wherein the second junction is a third Schottky barrier with respect to the carrier, and wherein the third Schottky barrier is less than the first Schottky barrier.

46. The electrical device of claim 31, wherein the second junction is a third Schottky barrier with respect to the carrier, and wherein the third Schottky barrier is less than the first Schottky barrier.

47. The electrical device of claim 29, wherein the first array of structural nanoholes in the first plurality of sheets is characterized by the first band gap range and wherein the first band gap range is between 0.1 eV and 2.2 eV.

48. The electrical device of claim 31, wherein the first array of structural nanoholes in the first plurality of sheets is characterized by the first band gap range and wherein the first band gap range is between 0.1 eV and 2.2 eV.

49. The electrical device of claim 28, wherein the structural nanoholes in the first array are characterized by a cross-section that includes any combination of linear portions, arcuate portions, or curved portions.

50. The electrical device of claim 28, wherein
the first lead comprises titanium, niobium, zinc, chromium, silver or aluminum, and
the second lead comprises gold, cobalt, palladium, copper or platinum.

51. The electrical device of claim 28, wherein
the first lead and the second lead are in electrical communication with an external circuit, and
the electrical device is a photodetector that generates a current or a voltage in response to an incident light.

52. The electrical device of claim 28, wherein
the first lead and the second lead are in electrical communication with an external current, and
the electrical device is a light emitting diode that emits a light in response to the external current.

* * * * *